United States Patent
Ozawa et al.

(10) Patent No.: US 7,652,333 B2
(45) Date of Patent: Jan. 26, 2010

(54) SEMICONDUCTOR INTEGRATED CIRCUIT

(75) Inventors: Osamu Ozawa, Tokyo (JP); Toshio Sasaki, Tokyo (JP); Ryo Mori, Tokyo (JP); Takashi Kuraishi, Tokyo (JP); Yoshihiko Yasu, Tokyo (JP); Koichiro Ishibashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 434 days.

(21) Appl. No.: 11/614,619

(22) Filed: Dec. 21, 2006

(65) Prior Publication Data
US 2007/0215952 A1 Sep. 20, 2007

(30) Foreign Application Priority Data
Dec. 27, 2005 (JP) ............... 2005-375013
Dec. 28, 2005 (JP) ............... 2005-378611
Sep. 14, 2006 (JP) ............... 2006-249369

(51) Int. Cl.
*H01L 27/01* (2006.01)
(52) U.S. Cl. ............... 257/368; 257/369; 257/393; 257/E27.001
(58) Field of Classification Search ........... 257/368, 257/369, 393, E27.001
See application file for complete search history.

(56) References Cited

U.S. PATENT DOCUMENTS 5,821,769 A   10/1998   Douseki
5,844,263 A   12/1998   Asai et al.
6,639,454 B2  10/2003   Hoshi et al.
2003/0052371 A1*  3/2003   Matsuzaki et al. .......... 257/371
2004/0016977 A1*  1/2004   Miyazaki et al. ............ 257/393

FOREIGN PATENT DOCUMENTS

| JP | 8-288145 A    | 11/1996 |
| JP | 9-121152 A    | 5/1997  |
| JP | 10-200050 A   | 7/1998  |
| JP | 2003-92359 A  | 3/2003  |
| JP | 2003-215214 A | 7/2003  |

* cited by examiner

*Primary Examiner*—Wai-Sing Louie
*Assistant Examiner*—Tifney L Skyles
(74) *Attorney, Agent, or Firm*—Miles & Stockbridge P.C.

(57) ABSTRACT

The semiconductor integrated circuit has so-called SOI type first MOS transistors (MNtk, MPtk) and second MOS transistors (MNtn, MPtn). The first MOS transistors have a gate isolation film thicker than that the second MOS transistors have. The first and second MOS transistors constitute a power-supply-interruptible circuit (6) and a power-supply-uninterrupted circuit (7). The power-supply-interruptible circuit has the first MOS transistors each constituting a power switch (10) between a source line (VDD) and a ground line (VSS), and the second MOS transistors connected in series with the power switch. A gate control signal for the first MOS transistors each constituting a power switch is made larger in amplitude than that for the second MOS transistors. This enables power-source cutoff control with a high degree of flexibility commensurate with the device isolation structure, which an SOI type semiconductor integrated circuit has originally.

20 Claims, 37 Drawing Sheets

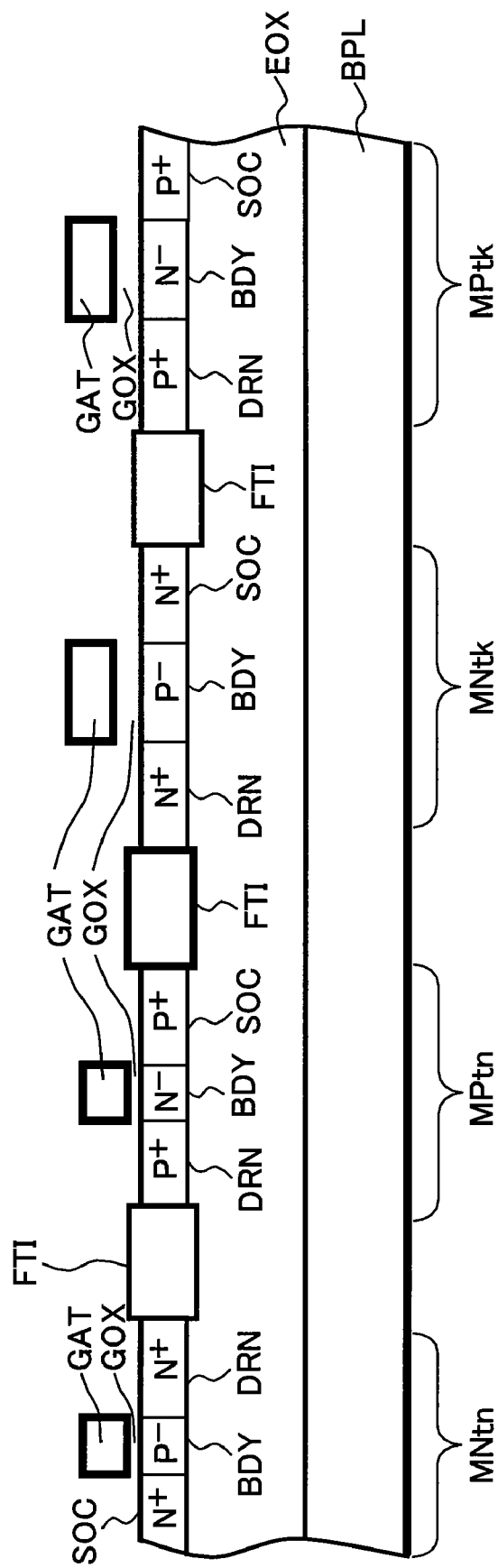

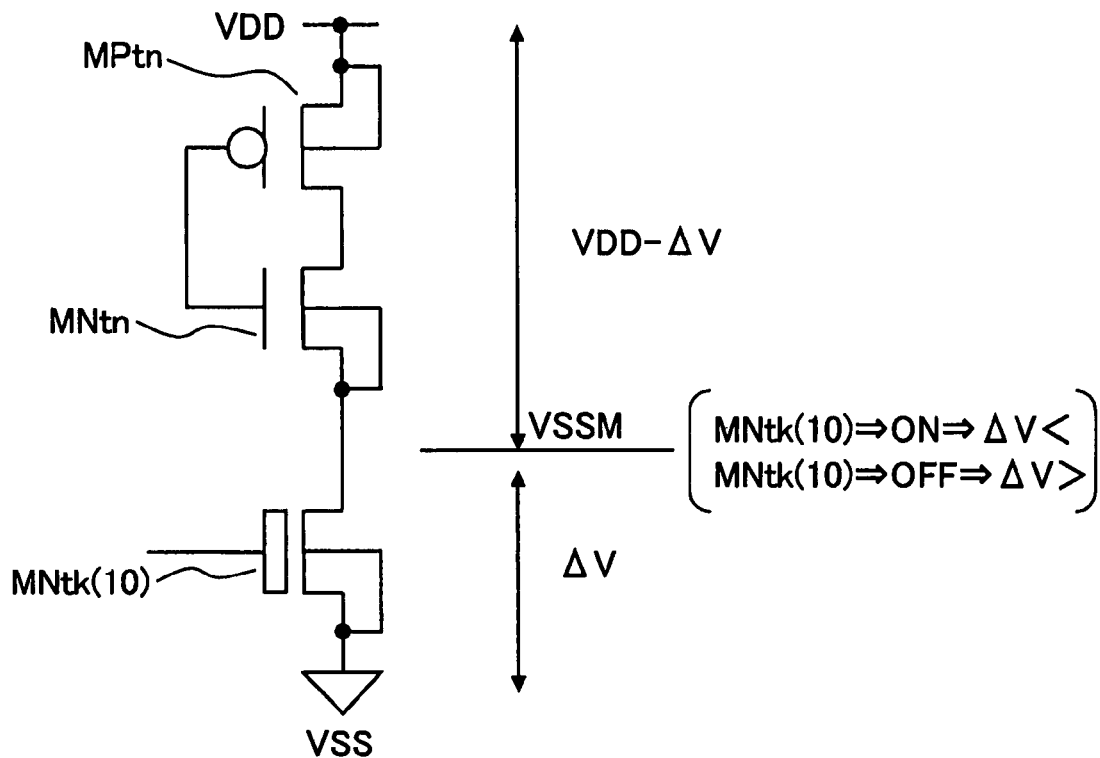
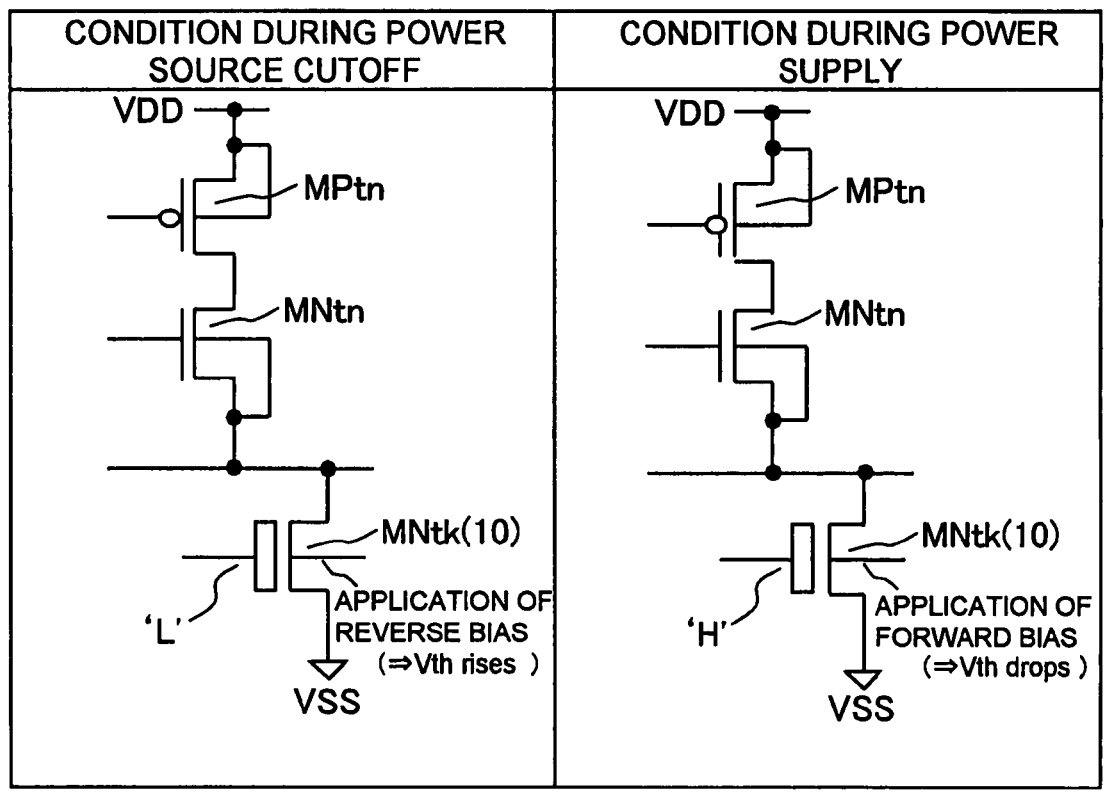

SEMICONDUCTOR INTEGRATED CIRCUIT

CLAIM OF PRIORITY

The Present application claims priority from Japanese application JP 2006-249369 filed on Sep. 14, 2006, JP 2005-378611 filed on Dec. 28, 2005, JP 2005-375013 filed on Dec. 27, 2005, the content of which is hereby incorporated by reference into this application.

FIELD OF THE INVENTION

The present invention relates to a semiconductor integrated circuit with an SOI (Silicon On Insulator) type field effect transistor, hereinafter referred to as MOS transistor, and particularly to its power supply cutoff technique.

BACKGROUND OF THE INVENTION

In JP-A-2003-92359, there is described a technique including: providing a power switch for each of circuit modules that a semiconductor integrated circuit includes; and making possible to selectively cut off the power source for operating a circuit module, which does not have to be made to operate, according to an operation mode. JP-A-8-228145 shows an example of an SOI type logic circuit, which is arranged so that the body of a MOS transistor that the logic circuit includes is made to float, thereby to lower the threshold voltage thereof, and the body of a power switch supplying the MOS transistor that the logic circuit includes with a source voltage and a ground potential is biased thereby to raise the threshold voltage thereof. This document says that the MOS transistor with its threshold voltage thus lowered enables a high-speed operation of the logic circuit, and the power switch with its threshold voltage thus raised can lower the power consumption in a standby state. According to JP-A-9-121152, an adjustable threshold voltage is achieved for a power switch by biasing the body of the switch with its own gate potential, and thus a large current supply capability can be attained by a lowered threshold voltage during ON state of the power switch, whereas a sub-threshold leak current can be reduced by a raised threshold voltage during OFF state of the switch.

In addition, JP-A-10-200050 discloses a semiconductor integrated circuit, in which a leak current flowing through a circuit block out of use is cut off thereby to reduce its power consumption. Further, in JP-A-2003-215214, it is stated that a voltage-fixing circuit provided between an output terminal of a functional module which serves to cut off power source and an input terminal of a functional module which does not cut off power source fixes a signal voltage to the functional module at Ground level at the time of cutoff of the power source, whereby unstable propagation to an input gate of the functional module which does not perform the cutoff of power source is prevented.

SUMMARY OF THE INVENTION

The inventor has examined cutoff of power source to a circuit block of an SOI type integrated circuit. In the case of a bulk type MOS integrated circuit, an active region is formed in a substrate or a well region to build a MOS transistor. However, in the case of an SOI type MOS integrated circuit, a number of active regions are formed on an insulating thin film of a substrate to build a MOS transistor in each active region without using a well region. Therefore, an SOI type MOS integrated circuit fundamentally differs from a bulk type MOS integrated circuit in device isolation, which has little junction capacitance and little junction leak between each device and its substrate. The inventor has further examined properties of power-source cutoff control for each circuit unit on an SOI type integrated circuit, which fundamentally differs from a bulk type integrated circuit in device isolation. For the purpose of suppressing sub-threshold leak current, it is desirable that the threshold voltage is higher, because of the nature of a power switch. Then, to raise the threshold voltage, an impurity node may be changed, or a substrate may be biased. Alternatively a gate isolation film of a power switch may be made thicker than that of a MOS transistor for a logic operation. As a power switch with a thicker gate isolation film needs to be reduced in its ON-state resistance, the gate voltage in ON state has to be made higher than that of a MOS transistor for a logic operation. On the other hand, a bulk type MOS integrated circuit requires well isolation between a power switch, which incorporates a thick film MOS transistor, and a thin-film MOS transistor for a logic operation. This is a measure to reduce a junction leak in a power-source cutoff state. Also, a bulk type MOS integrated circuit needs well isolation between a circuit having a power switch and a circuit with no power switch. This is because the circuits in operation have to be made different in well voltage when their substrate is biased. As described above, a bulk type MOS integrated circuit has many restrictions which must be taken into account in the case where a power switch serves to cut off a power source. In contrast, the inventor has clarified not only the fact an SOI type MOS integrated circuit is not subject to the same restrictions as those placed on a bulk type MOS integrated circuit because of characteristics of the device structure thereof, but also the fact an SOI type MOS integrated circuit is open to new ideas to enable e.g. full uses of low power consumption during the time of power-source cutoff and operation performance during the time of supply of electric power.

It is an object of the invention to enable power-source cutoff control with a high degree of flexibility commensurate with the device isolation structure, which an SOI type semiconductor integrated circuit has originally.

It is another object of the invention to enable power-source cutoff control which can contribute to the low power consumption during the time of power-source cutoff, and the improvement in the operation performance during the time of supplying electric power in an SOI type semiconductor integrated circuit.

Further, from another viewpoint, the inventor has been considering the cutoff of power source of a semiconductor integrated circuit. As a result, it has been found that in the art a certain degree of gate scale is brought together in one functional module and treated as a unit for cutoff of power source, and when the unit is used to set a power-supply-interruptible area, the division of the power-supply-interruptible area is ruled out after layout. More specifically, after the determination of a floor plan of a semiconductor chip, a functional module targeted for cutoff of power source is specified and a power-supply-interruptible area is set in advance and as such, the reset of a cutoff-targeted block after that, including the change in the size of a power-supply-interruptible area, and the change of a logical area targeted for cutoff of power source, is made impossible owing to the relation with a neighboring block. On this account, it has been difficult to set a power-supply-interruptible area appropriately, in regard to a semiconductor integrated circuit.

Still another object of the invention is to provide a technique to set a power-supply-interruptible area appropriately.

The objects and other objects of the invention and novel features thereof will be made clear from the description hereof and the accompanying drawings.

Of subject matters disclosed herein, the representative ones will be described below in brief outline.

[1] Mixture of MOS for Logic and Thick-Film Power Switch MOS

A semiconductor integrated circuit (1) in association with the invention includes: a substrate (BPL) with an insulating thin film (EOX) thereon; first MOS transistors (MPtk, MNtk) of so-called SOI type, each having a source (SOC), a drain (DRN), and a body (BDY) on the insulating thin film of the substrate, a gate isolation film (GOX) on the body, and a gate (GAT) on the gate isolation film; and second MOS transistors (MPtn, MNtn) of SOI type, each having a source (SOC), a drain (DRN), and a body (BDY) on the insulating thin film of the substrate, a gate isolation film (GOX) on the body, and a gate (GAT) on the gate isolation film. The first MOS transistors have gate isolation films thicker than those the second MOS transistors have. The semiconductor integrated circuit has a power-supply-interruptible circuit (6, 8) and a power-supply-uninterrupted circuit (7, 9), which are constituted by the first and second MOS transistors and mixed and laid out in a region for circuit formation of the integrated circuit. The power-supply-interruptible circuit has the first MOS transistors each constituting a power switch (10), and the second MOS transistors connected in series with the power switch between source and ground lines. The power-supply-uninterrupted circuit has a plurality of the second MOS transistors in series between the source and ground lines. A gate control signal for the first MOS transistors each constituting a power switch is made larger in amplitude than a gate control signal for the second MOS transistors.

Use of a thick-film MOS transistor for cutoff of power source enables reduction in sub-threshold current at the time of the cutoff. In addition, a large electric current feeding capability can be ensured because a voltage with a large amplitude is used for gate control. In this case, bodies of the first and second MOS transistors are separated from each other, and the first and second MOS transistors are permitted to laid out freely in a region for circuit formation without being subject to a restriction on their layout owing to well isolation unlike Bulk type MOS transistors. On this account, as an isolation region for well isolation is not required even when a functional unit for executing cutoff of power source is departmentalized. Therefore, the function of cutting off power source with a high flexibility can be achieved without any load owing to the increase in area.

In a specific form according to the invention, the semiconductor integrated circuit further includes a control circuit (13, 14, 13_1, 14_1, 30-33) composed of a power-supply-uninterrupted circuit in a circuit region of the integrated circuit. In addition, the control circuit controls a part or all of the first MOS transistors each constituting a power switch to OFF state in a predetermined low power consumption mode. Also, the control circuit controls the first MOS transistors each constituting a power switch, which has been turned off in the predetermined low power consumption mode, to ON state in response to cancel of the low power consumption mode.

Further, in a specific form according to the invention, the control circuit (30-33) controls a body of the first MOS transistor constituting a power switch turned off in the predetermined low power consumption mode to a first voltage that makes a threshold voltage of the power switch larger than a threshold voltage achieved when the body is equal in voltage to a source thereof. Thus, the invention can contribute to suppression of the sub-threshold leak at the time of cutoff of power source.

In a specific form according to the invention, the control circuit (30-33) controls the body of a part or all of the first MOS transistors each constituting a power switch to a second voltage that makes a threshold voltage of the power switch smaller than the threshold voltage achieved when the body is equal in voltage to a source thereof, or to a floating state under the condition where the predetermined low power consumption mode has been canceled. Thus, the invention can contribute to speeding up of the operation of the second transistors.

In a specific form according to the invention, when the predetermined low power consumption mode is canceled, the control circuit (30-33) controls the first MOS transistor constituting a relevant power switch to ON state while maintaining the body of a part or all of the first MOS transistors each constituting the power switch at the first voltage, and then controls the body of the first MOS transistor, which has been turned on, to the second voltage or floating state. Thus, an inrush current caused by a power switch at the time of starting supply of power source for an operation can be suppressed.

In another specific form according to the invention, the power-supply-interruptible circuit has: sequential circuits (FF1, FF2) each constituted by the second MOS transistors; combinational circuits (LOG1, LOG2) each constituted by the second MOS transistors; a lower hierarchical power switch (10_12) constituted by one of the first MOS transistor and the second MOS transistor and connected in series with the combinational circuits; and a higher hierarchical power switch (10_11) constituted by the first MOS transistor and connected in series with the MOS transistor constituting the lower hierarchical power switch and the sequential circuits. When a functional unit that serves to cut off power source is departmentalized, it is desirable from the viewpoint of holding of a memory node at the time of cutoff of power source to take a measure to prevent power source for a memory circuit such as a latch and a sequential circuit from being cut off. For example, such measure includes: to control the first MOS transistor constituting the higher hierarchical power switch to its OFF state in a first low power consumption mode; and to control the MOS transistor constituting the lower hierarchical power switch to its OFF state while maintaining the first MOS transistor constituting the higher hierarchical power switch in its ON state in a second low power consumption mode. In the second low power consumption mode, it becomes possible to leave the sequential circuits keeping the information stored therein.

[2] High Voltage Control of Thick-Film MOS Transistor

A semiconductor integrated circuit in association with the invention has: a substrate with an insulating thin film thereon; first MOS transistors each having a source, a drain, and a body on the insulating thin film of the substrate, a gate isolation film on the body, and a gate on the gate isolation film; and second MOS transistors each having a source, a drain, and a body on the insulating thin film of the substrate, a gate isolation film on the body, and a gate on the gate isolation film. The first MOS transistors have gate isolation films thicker than those of the second MOS transistors. The first and second MOS transistors constitute a plurality of circuits. As one of the plurality of circuits, the semiconductor integrated circuit has a first circuit (6) including the first MOS transistors each constituting a power switch and the second MOS transistors each connected in series with the first MOS transistor. As another one of the plurality of circuits, the semiconductor integrated circuit has a second circuit (13, 13_1, 31) that outputs a gate control signal for the first MOS transistors each constituting a power switch (10). The gate control signal for the first MOS transistors each constituting a power switch is made larger in amplitude than a gate control signal for the second MOS transistor.

Use of a thick-film MOS transistor for cutoff of power source enables reduction in sub-threshold current at the time of the cutoff. In addition, a large electric current feeding capability can be ensured because a voltage with a large amplitude is used for gate control. In this case, bodies of the first and second MOS transistors are separated from each other, and the first and second MOS transistors are permitted to laid out freely in a region for circuit formation without being subject to a restriction on their layout owing to well isolation unlike Bulk type MOS transistors. On this account, as an isolation region for well isolation is not required even when a functional unit for executing cutoff of power source is departmentalized. Therefore, the function of cutting off power source with a high flexibility can be achieved without any load owing to the increase in area.

In a specific form according to the invention, the second circuit controls a part or all of the first MOS transistors each constituting a power switch to OFF state in the low power consumption mode.

In another specific form according to the invention, the semiconductor integrated circuit has, as another one of the plurality of circuits, a third circuit (2) composed of a series circuit of the first MOS transistors and performing external input and output operations. The form makes it possible to suppress an increase in types of the thickness of the gate isolation film in a MOS transistor.

In another specific form according to the invention, the semiconductor integrated circuit has, as another one of the plurality of circuits, a fourth circuit as denoted by the numeral 6 in FIG. 26. The fourth circuit includes: sequential circuits (FF1, FF2) each constituted by the second MOS transistors; combinational circuits (LOG1, LOG2) each constituted by the second MOS transistors; a lower hierarchical power switch (10_12) constituted by one of the first and second MOS transistors, and connected in series with the combinational circuits; and a higher hierarchical power switch (10_11) constituted by the first MOS transistor and connected in series with the MOS transistor constituting the lower hierarchical power switch and the sequential circuits. When a functional unit that serves to cut off power source is departmentalized, it is desirable from the viewpoint of holding of a memory node at the time of cutoff of power source to take a measure to prevent power source for a memory circuit such as a latch and a sequential circuit from being cut off. For example, the second circuit controls the first MOS transistor constituting the higher hierarchical power switch to OFF state in a first low power consumption mode. Also, the second circuit controls the MOS transistor constituting the lower hierarchical power switch to OFF state while maintaining the first MOS transistor constituting the higher hierarchical power switch in ON state in a second low power consumption mode. In the second low power consumption mode, it becomes possible to leave the sequential circuits keeping the information stored therein.

In another specific form according to the invention, the first MOS transistor constituting a power switch (10) is one of a p-channel MOS transistor (MPtk) connected to the source line or an n-channel MOS transistors (MNtk) connected to the ground line. When the first MOS transistors each constituting a power switch (10_3, 10_4) are a p-channel MOS transistor connected to the source line and an n-channel MOS transistor connected to the ground line, the second circuit turns off one of the p-channel MOS transistor and n-channel MOS transistor, as the first MOS transistor constituting a power switch, in the low power consumption mode. Thus, it becomes possible to select a potential condition of an internal node that the first circuit takes on in the low power consumption mode.

In another specific form according to the invention, the first MOS transistors each constituting a power switch are a higher hierarchical p-channel MOS transistor (10_6) connected to the source line and a plurality of lower hierarchical p-channel MOS transistors (10_7) in parallel form individually connected in series with the higher hierarchical p-channel MOS transistor. In this case, the second circuit controls the higher hierarchical p-channel MOS transistor and the lower hierarchical p-channel MOS transistors separately. Hierarchical control of power switches allows power source cutoff of the first circuit to be executed hierarchically. Likewise, when the first MOS transistors each constituting a power switch are the higher hierarchical n-channel MOS transistor (10_3) connected to the ground line and a plurality of lower hierarchical n-channel MOS transistors (10_5) in parallel form individually connected in series with the higher hierarchical n-channel MOS transistor, the second circuit controls the higher hierarchical n-channel MOS transistor and the lower hierarchical n-channel MOS transistors separately.

In another specific form according to the invention, the first MOS transistors each constituting a power switch are a higher hierarchical p-channel MOS transistor (10_6) connected to the source line, a plurality of lower hierarchical p-channel MOS transistors (10_7) in parallel form individually connected in series with the higher hierarchical p-channel MOS transistor, a higher hierarchical n-channel MOS transistor (10_3) connected to the ground line, and a plurality of lower hierarchical n-channel MOS transistors (10_5) in parallel form individually connected in series with the higher hierarchical n-channel MOS transistor. In this case, the second circuit controls the higher hierarchical p-channel MOS transistor, the lower hierarchical p-channel MOS transistors, the higher hierarchical n-channel MOS transistor, and the lower hierarchical n-channel MOS transistors, separately. This enables selection of a potential condition of an internal node that the first circuit takes on, as well as hierarchical power-source cutoff control of the first circuit.

In another specific form according to the invention, the first MOS transistors each constituting a power switch are one of p-channel MOS transistors connected to a source line and n-channel MOS transistors connected to a ground line, which make higher hierarchical power switches (10_3, 10_6, 10_8, 10_9). Further, a part or all of circuits connected in series with one of the higher hierarchical power switches has lower hierarchical power switches (10_4, 10_5, 10_7, 10_10, 10_11, 10_12, 10_13, 10_14, 10_15, 10_16) constituted by one of the first and second MOS transistors. The second circuit controls the first MOS transistor constituting the higher hierarchical power switch to OFF state in a first low power consumption mode, and controls the MOS transistors constituting the lower hierarchical power switches to OFF state while maintaining the first MOS transistor constituting the higher hierarchical power switch in ON state in a second low power consumption mode, for example.

[3] Body Bias of Power Switch

A semiconductor integrated circuit in association with the invention has: a substrate with an insulating thin film thereon; first MOS transistors each having a source, a drain, and a body on the insulating thin film of the substrate, a gate isolation film on the body, and a gate on the gate isolation film; and second MOS transistors each having a source, a drain, and a body on the insulating thin film of the substrate, a gate isolation film on the body, and a gate on the gate isolation film. The first MOS transistors have gate isolation films thicker than those the second MOS transistors have. The first and second MOS transistors constitute a plurality of circuits. As one of the plurality of circuits, the semiconductor integrated circuit has a first circuit (6) including the first MOS transistors each constituting a power switch and second MOS transistors each connected in series with the power switch. The amplitude of a gate control signal for the first MOS transistors each constituting a power switch is made larger than that of a gate control signal for the second MOS transistors. In regard to the first circuit, the bodies of the second MOS transistors are made to float, and the bodies of the first MOS transistors each constituting a power switch are connected to their own sources. As the first MOS transistors are subjected to application of a gate voltage with a larger amplitude in comparison to the second MOS transistors and have a longer steady-state period of a switching condition, it is expected that the first MOS transistors are prone to be affected by voltage changes at their thresholds owing to the fluctuation in body potential. Therefore, the simplification of device configuration can be given priority by performing body biasing of only a barebones portion.

Another semiconductor integrated circuit in association with the invention has: a substrate with an insulating thin film thereon; first MOS transistors each having a source, a drain, and a body on the insulating thin film of the substrate, a gate isolation film on the body, and a gate on the gate isolation film; and second MOS transistors each having a source, a drain, and a body on the insulating thin film of the substrate, a gate isolation film on the body, and a gate on the gate isolation film. The first MOS transistors have gate isolation films thicker than those the second MOS transistors have. The first and second MOS transistors constitute a plurality of circuits. As one of the plurality of circuits, the semiconductor integrated circuit has a first circuit (6) including the first MOS transistors each constituting a power switch and the second MOS transistors each connected in series with the power switch. The amplitude of a gate control signal for the first MOS transistors each constituting a power switch is made larger than that of a gate control signal for the second MOS transistors. In the first circuit, bodies of the first MOS transistors each constituting a power switch and the second MOS transistors are connected to their own sources. Thus, the influence of fluctuation in body potential can be minimized even in the case where the first circuit is an analog circuit.

[4] Voltage-Adjustable Control of Power Switch Body

A semiconductor integrated circuit in association with the invention has: a substrate with an insulating thin film thereon; first MOS transistors each having a source, a drain, and a body on the insulating thin film of the substrate, a gate isolation film on the body, and a gate on the gate isolation film; and second MOS transistors each having a source, a drain, and a body on the insulating thin film of the substrate, a gate isolation film on the body, and a gate on the gate isolation film. The first MOS transistors have gate isolation films thicker than those of the second MOS transistors. The first and second MOS transistors constitute a plurality of circuits. As one of the plurality of circuits, the semiconductor integrated circuit has a first circuit (6) including the first MOS transistors each constituting a power switch and the second MOS transistors each connected in series with the power switch. The semiconductor integrated circuit has, as another one of the plurality of circuits, a control circuit (30-33) that controls a switch signal (VC) for the first MOS transistors each constituting a power switch and a body bias signal (VBN) depending on the operation mode. The switch signal is larger in amplitude than a gate control signal for the second MOS transistors. The body bias signal can be adjusted in voltage depending on the operation mode. Thus, it becomes possible to optimize the body bias depending on the modes of high-speed operation, low power consumption low leakage, etc.

In a specific form according to the invention, the control circuit responds to a direction to operate the first circuit at a high speed, and makes the body bias signal for the first MOS transistors a first voltage (Vbnf) of a direction such that the threshold voltage is made smaller than that achieved when the body and source coincide in voltage, or makes the body floating. Thus, it becomes possible to cope with an operation at a high speed. It is desirable that the first voltage fall within a range such that a p-n junction diode between the source and body of the first MOS transistor is not turned on.

In a specific form according to the invention, the control circuit responds to a direction to operate the first circuit with a low power consumption, and makes the body bias signal for the first MOS transistors a second voltage (−Vbnr) of a direction such that the threshold voltage is made larger than that achieved when the body and source coincide in voltage. Thus, it becomes possible to cope with an operation with a low power consumption.

In another specific form according to the invention, the control circuit responds to a first mode direction to operate the first circuit, and makes the body bias signal for the first MOS transistors a source voltage thereof. The control circuit responds to a second mode direction to operate the first circuit at a higher speed than a speed assumed in the first mode, and makes body bias signal for the first MOS transistors a first voltage of a direction such that the threshold voltage is made smaller than that achieved when the body and source coincide in voltage, or makes the body floating. The control circuit responds to a third mode direction to operate the first circuit with a lower power consumption in comparison to that achieved by the first mode, and makes the body bias signal for the first MOS transistors a second voltage of a direction such that the threshold voltage is made larger than that achieved when the body and source coincide in voltage. Thus, it becomes possible to change over between an operation at a high-speed and an operation with a low power consumption.

In another specific form according to the invention, the control circuit responds to a direction to stop an operation of the first circuit, and makes the body bias signal for the first MOS transistor constituting a power switch a second voltage of a direction such that the threshold voltage is made larger than that achieved when the body and source coincide in voltage. Thus, it becomes possible to reduce a sub-threshold leak current at the time of cutoff of power source.

In another specific form according to the invention, in the low power consumption mode, the control circuit turns off the first MOS transistors each constituting a power switch, which the first circuit has, and makes the body bias signal for the first MOS transistor constituting a power switch a voltage of a direction such that the threshold voltage is made larger than that achieved when the body and source coincide in voltage. When the low power consumption mode is canceled, the control circuit turns on the first MOS transistors each constituting a power switch while maintaining the body bias signal for the first MOS transistor constituting a power switch at the voltage in the low power consumption mode. In other words, in the low power consumption mode, the control circuit brings the first MOS transistors each constituting a power switch to OFF state, and turns on the first MOS transistors each constituting a power switch while maintaining the body bias signal for the first MOS transistor constituting a power switch at a voltage of a direction such that the threshold voltage is made larger than that achieved when the body and source coincide in voltage when the low power consumption mode is canceled. Thus, it becomes possible to suppress the occurrence of an inrush current in recovery from a standby state to an operable state.

It is appropriate that the control circuit make the body bias signal for the first MOS transistor constituting a power switch its own source voltage, a voltage of a direction such that the threshold voltage is made smaller than that achieved when the body and source coincide in voltage, or floating after turning on the first MOS transistors each constituting a power switch. Thus, it becomes possible to obtain an electric current feeding capability that necessary for the power switch.

[5] Rightsizing of Power-Supply-Interruptible Area

From the viewpoint of rightsizing of a power-supply-interruptible area, a semiconductor integrated circuit in association with the invention follows the arrangement stated below. When a semiconductor integrated circuit including: a cell region to lay out a plurality of core cells in; a power source isolation region to divide the cell region into a plurality of power-supply-interruptible areas; and a plurality of power switches that are laid out corresponding to the power-supply-interruptible areas and can cut off power source feeding to the corresponding power-supply-interruptible area is formed on a semiconductor substrate, the power-supply-interruptible areas and power switches are electrically insulated from the semiconductor substrate by an oxide layer.

According to the above-described measure, the power-supply-interruptible areas and power switches are electrically insulated from the semiconductor substrate by an oxide layer, and the flexibility of positions where the power source isolation regions and power switches are formed are enhanced. Therefore, it becomes possible to form the power source isolation regions and power switches in arbitrary positions. This facilitates the change in the size of each power-supply-interruptible area and the change in a logical area targeted for cutoff of power source.

In this case, the semiconductor substrate is a silicon substrate, and SOI structure is formed by the oxide layer.

To reduce leak current in the power switches, it is appropriate to use MOS transistors having a gate oxide layer thicker than that of a MOS transistor belonging to the power-supply-interruptible area, for the power switches. Thus, the threshold value of MOS transistors constituting the power switches is made higher than that of a MOS transistor belonging to the power-supply-interruptible area. In this case, for the purpose of reducing the influence on the operation margin of high-potential-side power source Vdd of the power switches, it is appropriate that High level supplied to gate electrodes of a MOS transistors constituting the power switches be set so as to be higher than High level supplied to a gate electrode of a MOS transistor belonging to the power-supply-interruptible area.

In addition, because of SOI structure, the through rate at a leading edge may be controlled by applying a bias to substrates of MOS transistors constituting the power switches thereby to raise or lower the threshold value Vth.

When a first low-potential-side power source line used as a ground line, and a second low-potential-side power source line coupled to the core cells are included, the power switches can be provided so that the switches cut and connect the first low-potential-side power source line and second low-potential-side power source line.

To relieve the concentration of electric current, it is appropriate that the conducting state of the power switches be activated and controlled by a signal that is changing at a low speed analogously. In this case, the analogously changing signal has a small driving power and is driven under the condition of a high resistance, and therefore such signal tends to be affected by noise easily. Therefore, it is appropriate to lay out the drive circuit near the power switches thereby to reduce the tendency of being affected by noise.

Also, a control logic to convert a digital signal for controlling the power switches in their operation into an analogously changing signal may be provided.

In this case, the control logic may be arranged so that it includes a plurality of MOS transistors differing in driving power from each other, and the different MOS transistors are selectively involved in activation of the power switches in driving those switches.

The power-supply-interruptible areas can be arranged so that they include an anti-unstable propagation circuit to eliminate unstable logic propagation from other power-supply-interruptible areas, and the operation control of the anti-unstable propagation circuit is performed interlocking with drive control of the power switches.

BRIEF DESCRIPTION OF THE DRAWINGS

FIG. 5 is a sectional view exemplifying a longitudinal sectional structure of an SOI type MOS transistor, which constitutes the semiconductor integrated circuit.

FIG. 28 is a circuit diagram of assistance in explaining the necessity of body bias control for controlling the body potential of a power switch.

FIG. 30 is a circuit diagram showing a basic form for body bias control of a power-supply-interruptible region.

FIG. 34 is a circuit diagram of assistance in explaining an inrush current caused by a power switch at power-on.

DETAILED DESCRIPTION OF THE PREFERRED EMBODIMENTS

1. First Embodiment

Power Switch with SOI Type Thick-Film MOS Transistor

Figure 2:
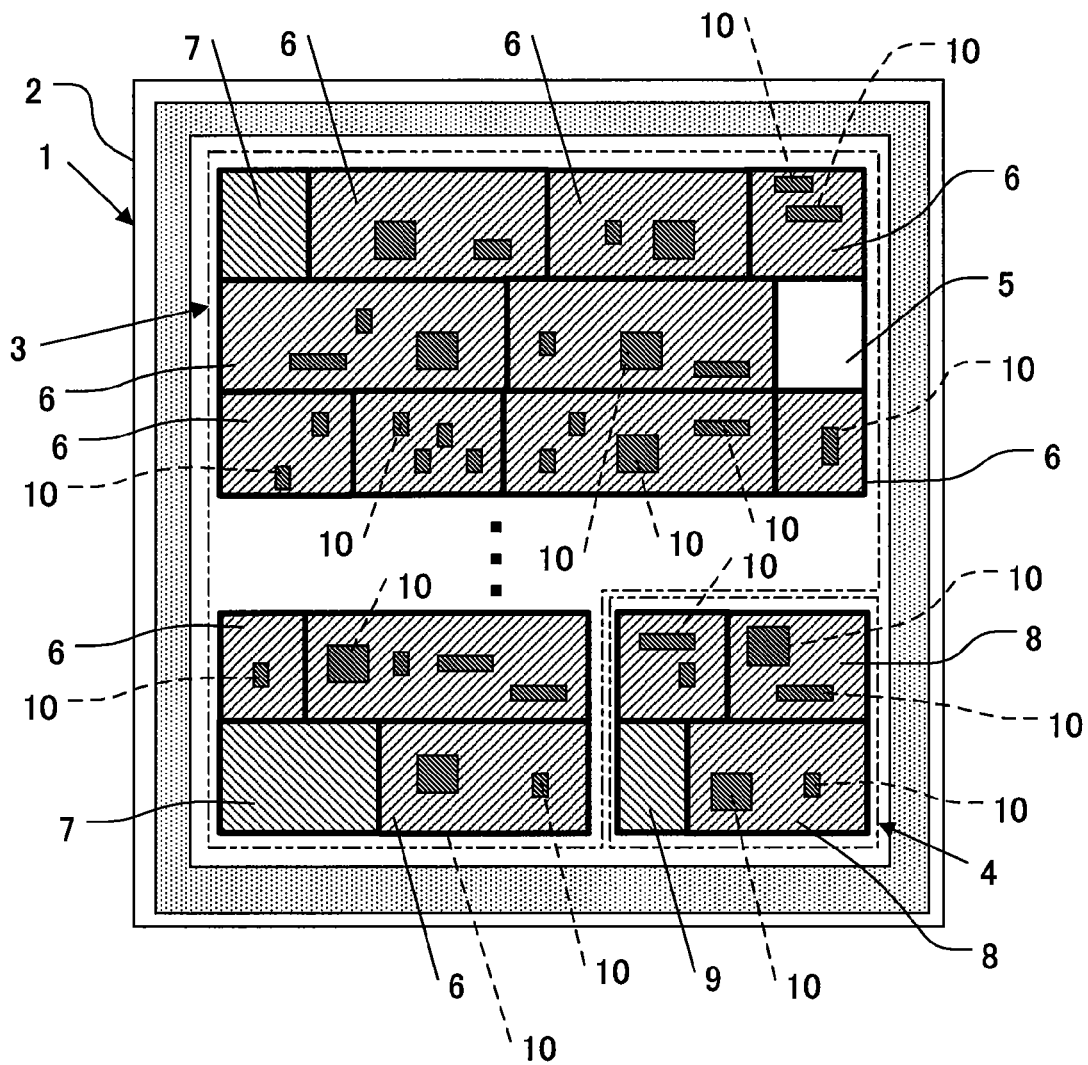
FIG. 2 is a plan view exemplifying a two-dimensional arrangement of a semiconductor integrated circuit in association with the invention.
Figure 3:
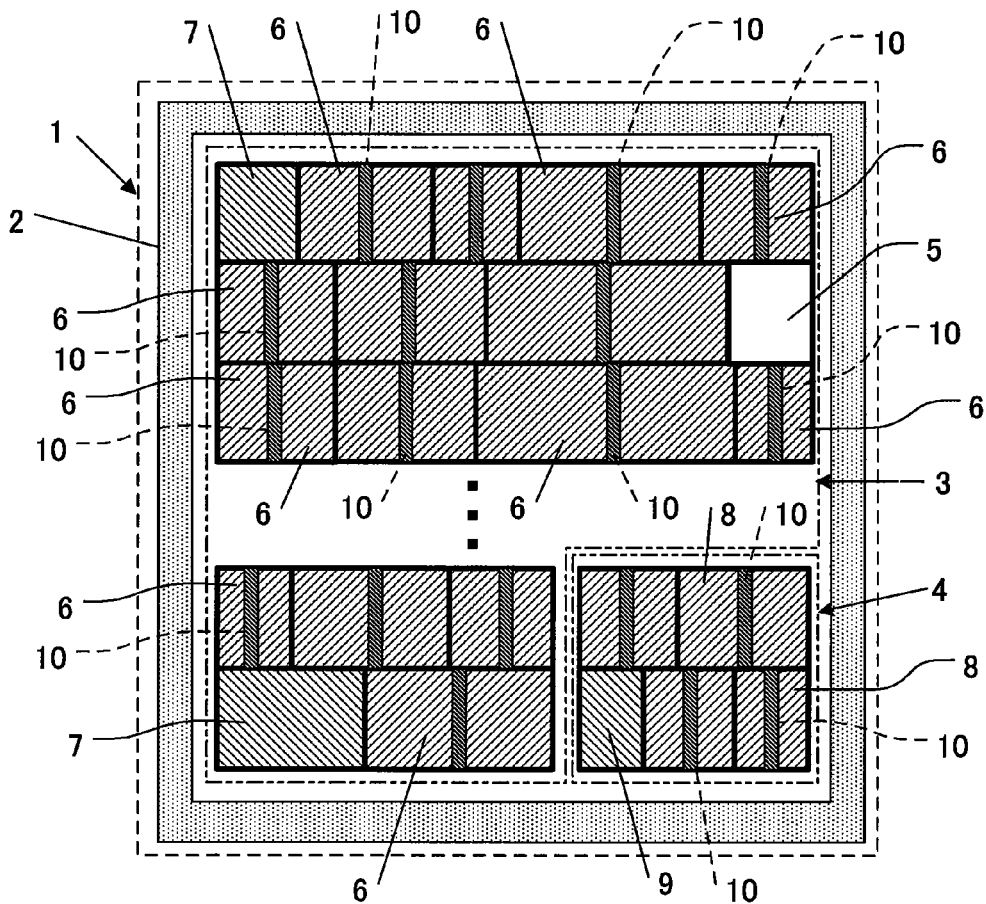
FIG. 3 is a plan view exemplifying a two-dimensional arrangement of the semiconductor integrated circuit, in which a power switch is disposed in a central portion of the power-supply-interruptible circuit.
Figure 4:
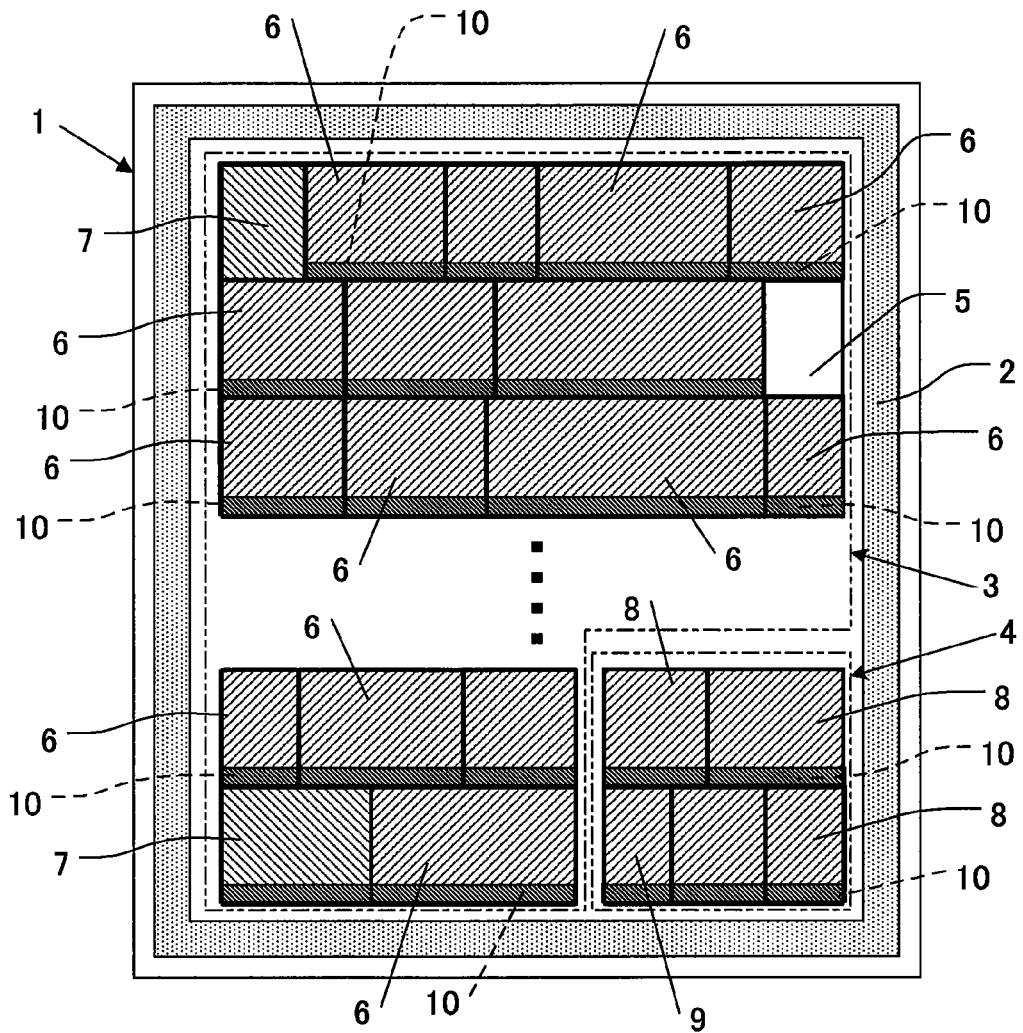
FIG. 4 is a plan view exemplifying a two-dimensional arrangement of the semiconductor integrated circuit, in which a power switch is disposed along the lower side of the power-supply-interruptible circuit.

Referring to FIG. 2, there is exemplified a two-dimensional arrangement of a semiconductor integrated circuit 1 in association with the invention. Here, a MOS integrated circuit having an analog-and-digital hybrid SOI structure is taken as an example thereof. The peripheral portion of the semiconductor integrated circuit 1 is used as an IO circuit region 2, inside which a digital circuit region 3 and an analog circuit region 4 are formed as core circuit regions. In the digital circuit region 3, the integrated circuit 1 has a power-source control circuit 5, a power-supply-interruptible circuit 6 arranged so that the power-source control circuit 5 can selectively cut off the supply of operating power source thereto, and a power-supply-uninterrupted circuit 7, which accepts the supply of operating power source fed into the circuit at all times. In the analog circuit region 4, the integrated circuit 1 has a power-supply-interruptible circuit 8 arranged so that the power-source control circuit 5 can selectively cut off the supply of operating power source thereto, and a power-supply-uninterrupted circuit 9, which accepts the supply of operating power source fed into the circuit at all times. To the power-supply-interruptible circuits 6 and 8, a power switch 10 is disposed. The place of the power switch in the power-supply-interruptible circuits 6 and 8 may be random. There is not regularity in the layout, but the power switch 10 may be disposed in a central portion of each power-supply-interruptible circuit 6, 8, as shown in FIG. 3, or may be disposed along the lower side of each power-supply-interruptible circuit 6, 8 as exemplified in FIG. 4. Basically, the layout of the power switch 10 is not limited by the device structure, the detail of which is to be described later.

Referring to FIG. 5, there are exemplified longitudinal sectional structures of SOI type MOS transistors that the semiconductor integrated circuit 1 includes. The MOS transistor is formed in an active region lying e.g. 20 to 200 nanometers above a silicon substrate BPL through an embedded oxide layer EOX, which is an insulating thin film. The active region makes a source SOC, a drain DRN and a body BDY. Further, the body BDY makes a channel region. Above the body BDY, a gate GAT is formed through a gate isolation film GOX. The source SOC, drain DRN and body BDY are electrically isolated from the surrounding by a full isolation region FTI (or partial isolation region PTI), which is produced by filling a trench formed by e.g. STI (Shallow Trench Isolation) with silicon oxide, and also electrically isolated from the silicon substrate by the embedded oxide layer EOX.

Here, the MOS transistors are classified into an n-channel MOS transistor MNtn and a p-channel first MOS transistor MPtn, which are first MOS transistors (thin-film MOS transistors) each having a relatively thinner gate oxide layer, and an n-channel MOS transistor MNtk and a p-channel first MOS transistor MPtk, which are second MOS transistors (thick-film MOS transistors) each having a relatively thicker gate oxide layer. As for the n-channel MOS transistor, the source SOC and drain DRN are each composed of an $N^+$ diffusion layer, and the body BDY is composed of a $P^-$ diffusion layer. In regard to the p-channel MOS transistor, the source SOC and drain DRN are each composed of a $P^+$ diffusion layer, and the body BDY is composed of an $N^-$ diffusion layer.

The thin-film MOS transistors MNtn and MPtn each have a channel length of 45 to 180 nanometers (nm), a gate oxide layer thickness of 1.5 to 3.9 nm, and a gate input voltage amplitude of 0.8 to 1.5 volts (V) depending on the gate oxide layer thickness, for example. The thick-film MOS transistors MNtk and MPtk each have a channel length of 300 to 1000 nm, a gate oxide layer thickness of 3.0 to 15.0 nm, and a gate input voltage amplitude of 1.2 to 5.0 V depending on the gate oxide layer thickness, for example. The thin-film MOS transistors MNtn and MPtn are primarily used to constitute a digital logic circuit and an analog circuit in a core logic region. The thick-film MOS transistors MNtk and MPtk are used to constitute an IO circuit and a part of the analog circuit because of their high withstand voltage, and also used to constitute the power-source cutoff switch 10 because of their high threshold voltage.

Figure 6:
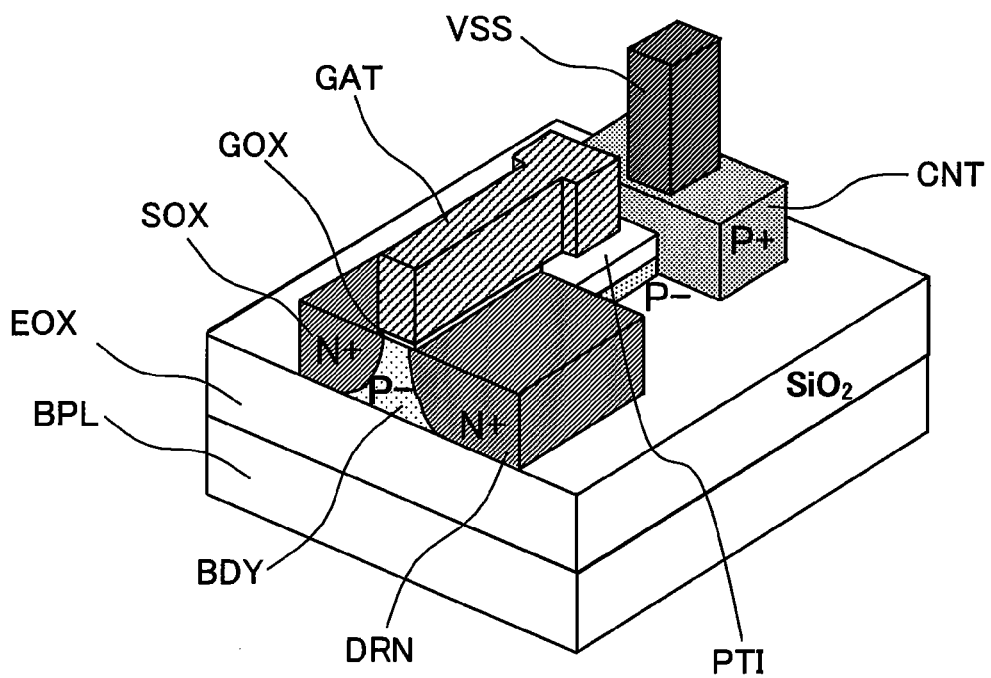
FIG. 6 is a bird's eye view of an n-channel MOS transistor having SOI structure.
Figure 7:
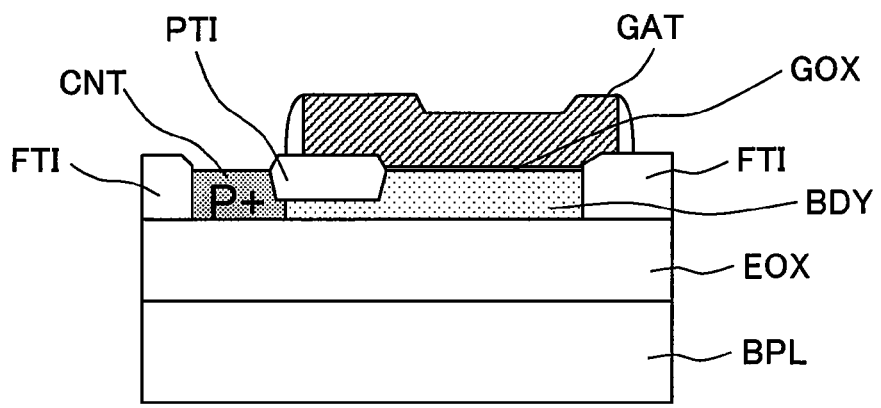
FIG. 7 is a longitudinal sectional view of the MOS transistor shown in FIG. 6.
Figure 8:
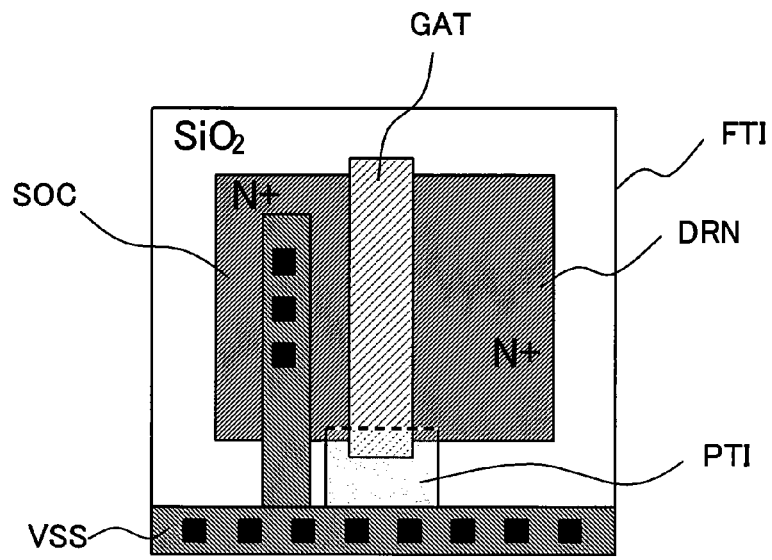
FIG. 8 is a plan view of the MOS transistor shown in FIG. 6.

Now, FIG. 6 is a bird's eye view of an n-channel MOS transistor having SOI structure. FIG. 7 is a longitudinal sectional view of the n-channel MOS transistor shown in FIG. 6, and FIG. 8 is a plan view of the n-channel MOS transistor shown in FIG. 6. It is clear from FIGS. 6-8 that in SOI structure, a source SOC, drain DRN and body BDY are electrically isolated from the surrounding by a fully-isolated region FTI or partial isolation region PTI, and electrically isolated from a silicon substrate by an embedded oxide layer EOX. Particularly, the body BDY may be made to float, however it is appropriate to bias the body in order to prevent fluctuation of the potential of the body or to control the threshold voltage. When the body is biased, the partial isolation region PTI is used to connect the body BDY to a contact region CNT composed of a p-type diffusion region ($P^+$), for example. Here is shown an example where the contact region CNT is connected to a ground line VSS made of a metal to which the source SOC is connected.

As individual MOS transistors are electrically isolated in SOI structure as described above, it is not required to execute isolation by a well region depending on e.g. the differences of the conductivity type or source voltage of the MOS transistors. Further, between the substrate and transistors, there are little junction capacitance and little current leakage, and therefore SOI structure is superior in low voltage and high-speed operations.

Figure 1:
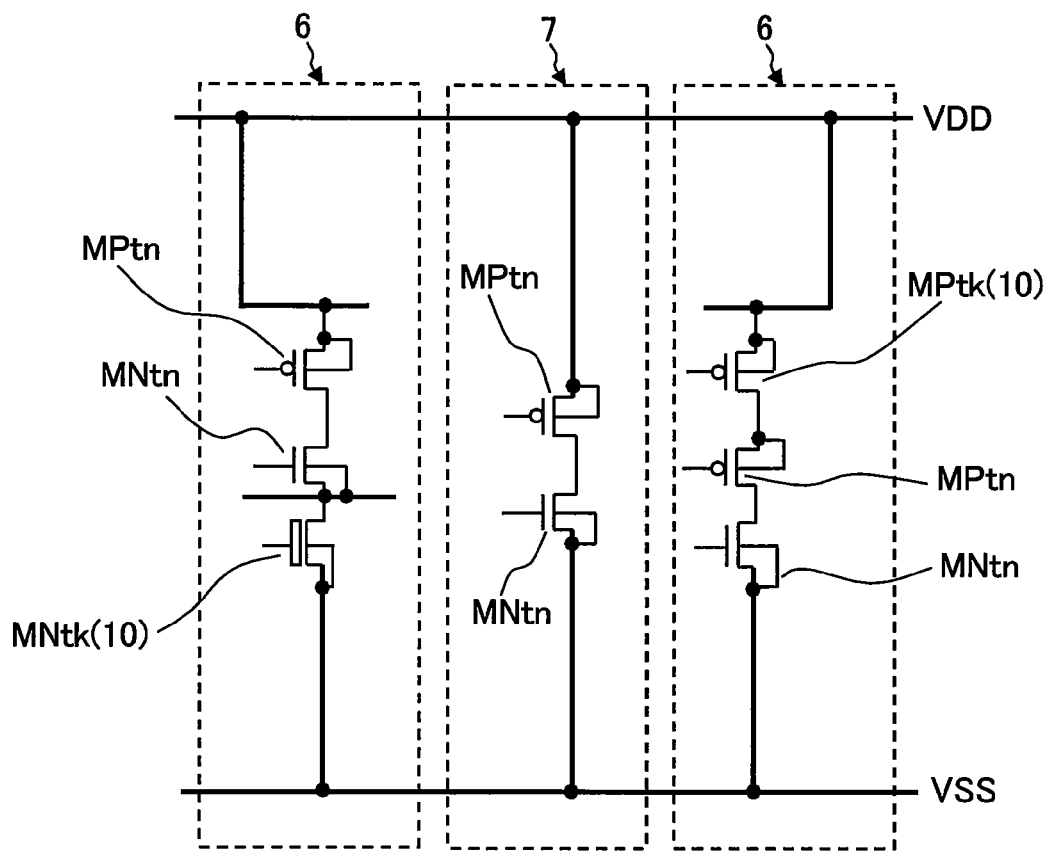
FIG. 1 is a circuit diagram exemplifying a basic circuit arrangement of a combination of power-supply-interruptible and power-supply-uninterrupted circuits, which was made in consideration of the feature of SOI structure.

An example of the basic circuit arrangement of a power-supply-interruptible circuit 6 and power-supply-uninterrupted circuit 7 is shown in FIG. 1, which was made in consideration of the feature of SOI structure. The power-supply-interruptible circuit 6 disposed between a source line VDD and a ground line VSS has thick-film MOS transistor MNtk, MPtk as a power switch 10. The power-supply-uninterrupted circuit 7 does not have a thick-film MOS transistor MNtk, MPtk as a power switch. As for the power-supply-interruptible circuit 6, the thick-film MOS transistor MNtk, MPtk used as a power switch 10 is connected in series with a circuit as typified by a CMOS inverter including a plurality of thin-film MOS transistors MNtn, MPtn. Also, the power-supply-uninterrupted circuit 7 has a circuit including a plurality of thin-film MOS transistors MNtn, MPtn connected in series as typified by a CMOS inverter. For example, when the ground voltage VSS is 0 V and the source voltage VDD is 1.5 V, the gate input voltage amplitude of the thin-film MOS transistors MNtn, MPtn is 1.5 V. At this time, the gate input voltage amplitude of the thick-film MOS transistor MNtk, MPtk constituting the power switch 10 is 3.3 V. In the power-supply-interruptible circuit 6, only one of the thick-film MOS transistors MNtk and MPtk may be used as the power switch 10. Alternatively, in one power-supply-interruptible circuit, both the thick-film MOS transistors MNtk and MPtk may be used. However, those are not particularly shown in the drawing. Now, in regard to the identification of MOS transistors by symbols in the drawings is made as follows. A p-channel MOS transistor is discriminated from an n-channel MOS transistor by making a gate thereof with a open circle, and a thick-film MOS transistor is discriminated from a thin-film MOS transistor by drawing a gate thereof with a relatively thicker line.

Figure 9:
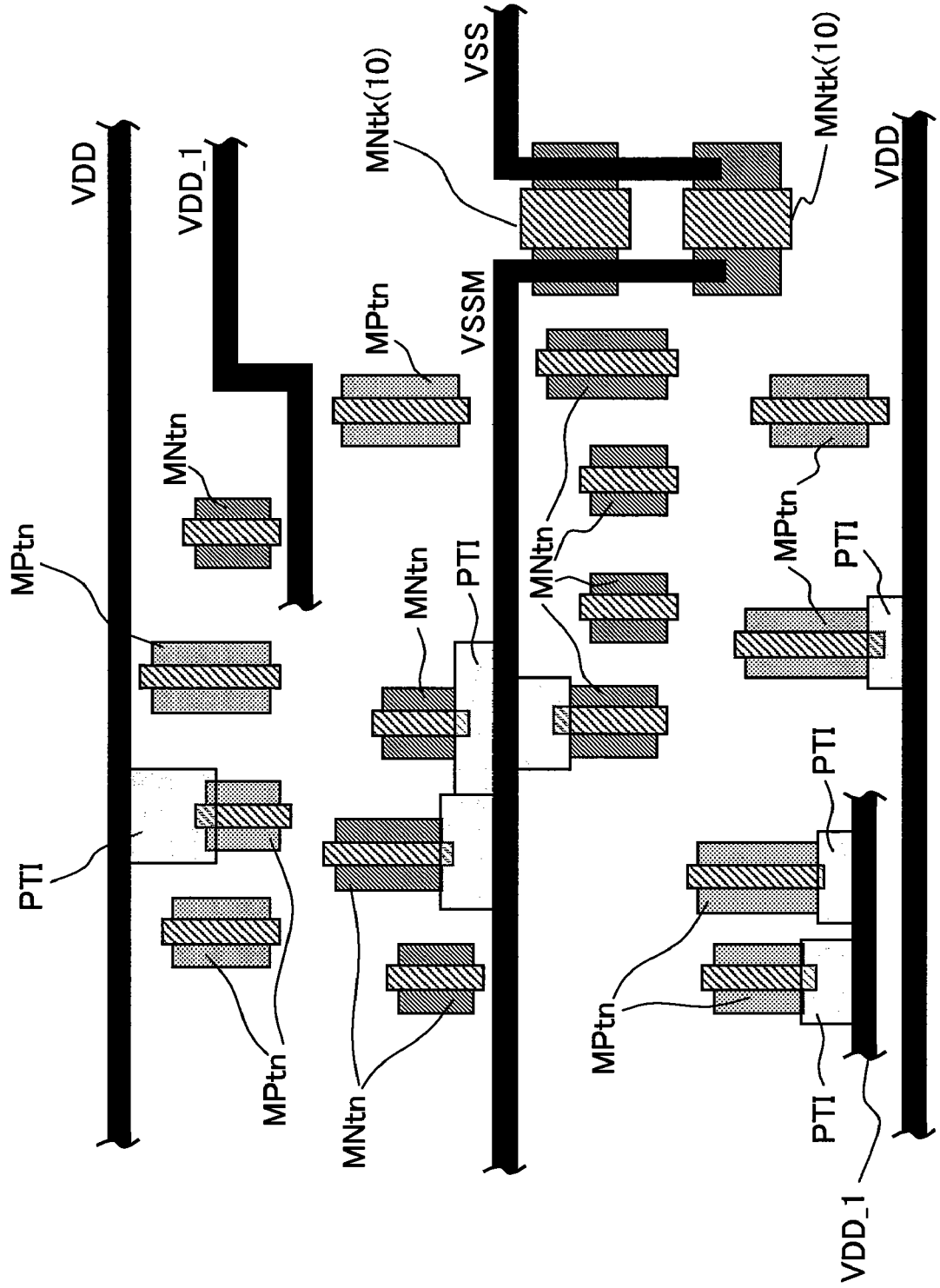
FIG. 9 is a layout illustration exemplifying a two-dimensional arrangement of the power-supply-interruptible circuit.

Referring now to FIG. 9, there is exemplified a two-dimensional arrangement of the power-supply-interruptible circuit 6. In the drawing, signal lines connected to a drain and source is omitted. As clear from the drawing, thick-film MOS transistors MNtk and MPtk, which the power switch 10 includes, can be laid out freely without doing field isolation such as well isolation with respect to the thin-film MOS transistors MNtn and MPtn for performing a logic operation and the like. Likewise, the n-channel thin-film MOS transistor MNtn and p-channel thin-film MOS transistor MPtn can be laid out freely without performing field isolation such as well isolation. As a result, a part of the source lines can be laid out freely as typified by VDD_1, and therefore a body potential can be shared readily by use of a partial isolation region PTI in arbitrary units.

Figure 11:
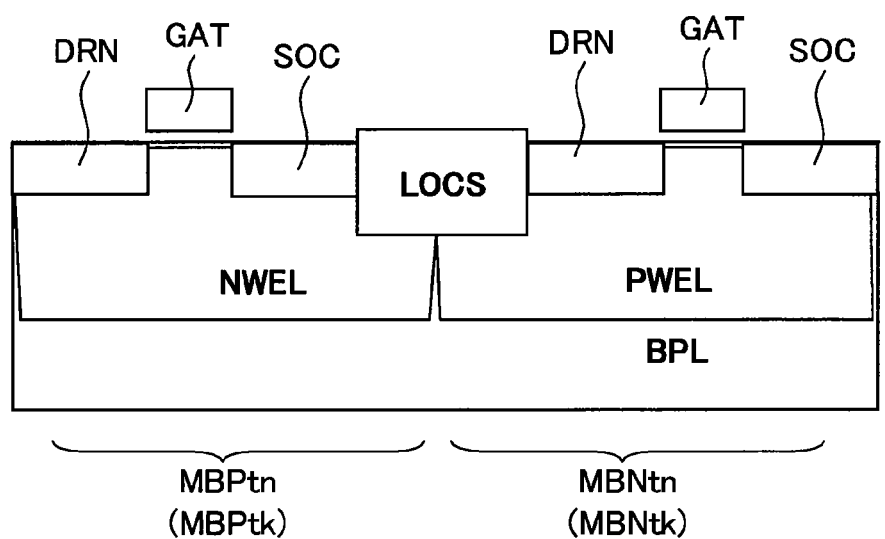
FIG. 11 is a longitudinal sectional view of a bulk-type CMOS circuit.
Figure 10:
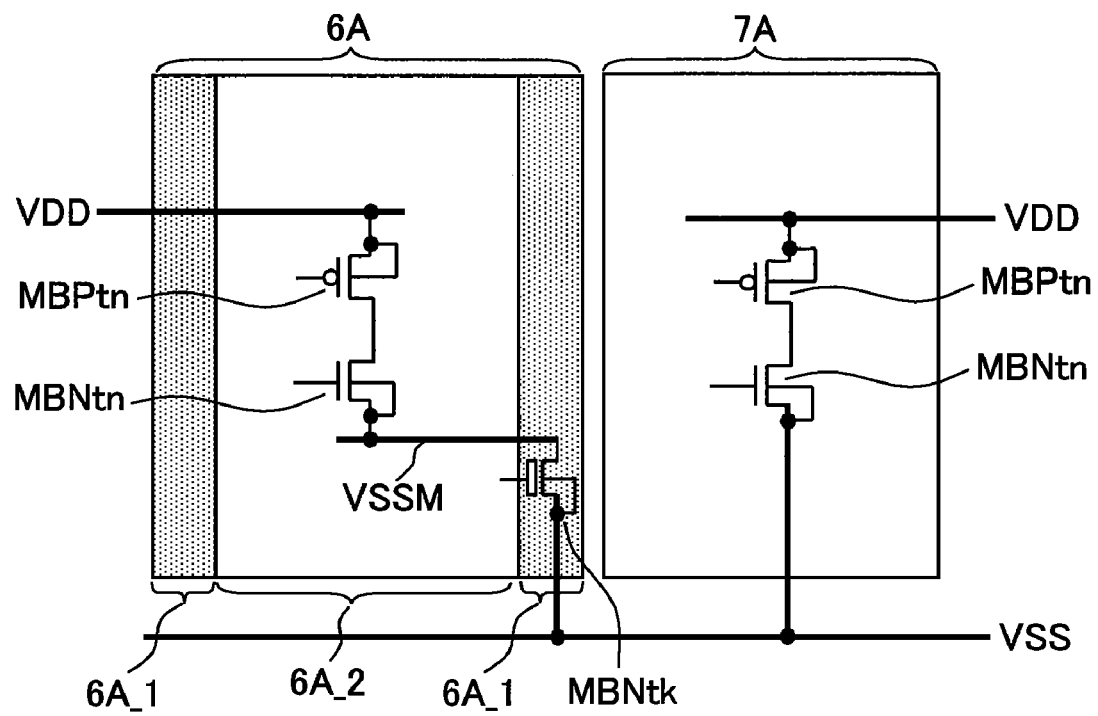
FIG. 10 is a circuit diagram showing a circuit arrangement of a combination of a power-supply-interruptible circuit and a power-supply-uninterrupted circuit, which include bulk-type MOS transistors, as a comparative example with respect to FIG. 1.

Referring to FIG. 10, a circuit arrangement by a combination of power-supply-interruptible and power-supply-uninterrupted regions, which include bulk-type MOS transistors, is shown as a comparative example with respect to FIG. 1. As for the bulk-type CMOS circuit, as exemplified in FIG. 11, a p-channel MOS transistor MBPtn is formed in an n-type well region NWEL; and an n-channel MOS transistor MBNtn is formed in a p-type well region PWEL. Further, isolation of well regions is performed; the substrate BPL and well regions PWEL and NWEL are biased reversely to each other. Likewise, opposite biases are applied between the well regions PWEL and NWEL, and a source SOC and drain DRN. Thus, electrical isolation is achieved. Now, LOCS is a portion produced by LOCOS, which is intended for lateral device isolation. Also, as for a thick-film n-channel MOS transistor MBNtk and a thick-film p-channel MOS transistor MBPtk, which are intended for an external IO circuit, isolation of well regions is performed in the same way, which is not particularly shown in the drawing.

The example shown in FIG. 10 does not show the way of isolation of well regions depending on the conductivity type of the MOS transistor specifically. However, the following are required. The fist is to isolate a power-supply-interruptible region 6A and a power-supply-uninterrupted circuit 7A from each other. The second is to isolate a region 6A_1 where a power switch is formed by a thick-film MOS transistor MBNtk and a region 6A_2 which is used to perform a logic operation, etc. from each other in the power-supply-interruptible region 6A. The reason why the region 6A_1 for formation of a power switch is isolated from the region 6A_2 for a logic operation, etc. in the power-supply-interruptible region 6A is to reduce junction leak between a well and a source and drain in the region 6A_2 for a logic operation, etc. in the condition of the power supply is cut off. Now, in the case of the arrangement shown in FIG. 1, each MOS transistor causes no leakage between the substrate and itself because of the presence of an embedded oxide layer EOX originally and as such, such consideration is not required essentially from the viewpoint of the device structure. In regard to the arrangement shown in FIG. 10, the reason for isolation between the power-supply-interruptible region 6A and the power-supply-uninterrupted circuit 7A is that there is a difference such that the well potential of the power-supply-uninterrupted circuit 7A is the ground potential VSS, whereas the well potential of the region 6A_2 for a logic operation, etc. in the power-supply-interruptible region 6A is a virtual ground VSSM, which is the drain voltage of the power switch MBNtk during the supply of operating power source. This can apply in the case where the power switch is a p-channel MOS transistor, and the case where the switch is constituted by a thin-film MOS transistor, which are not shown in the drawing particularly. As for the arrangement shown in FIG. 1, the body DBY of each MOS transistor can be isolated from the embedded oxide layer EOX by the isolation region FTI (or isolation region PTI), and therefore isolation of well regions as described above is essentially not necessary.

Figure 12:
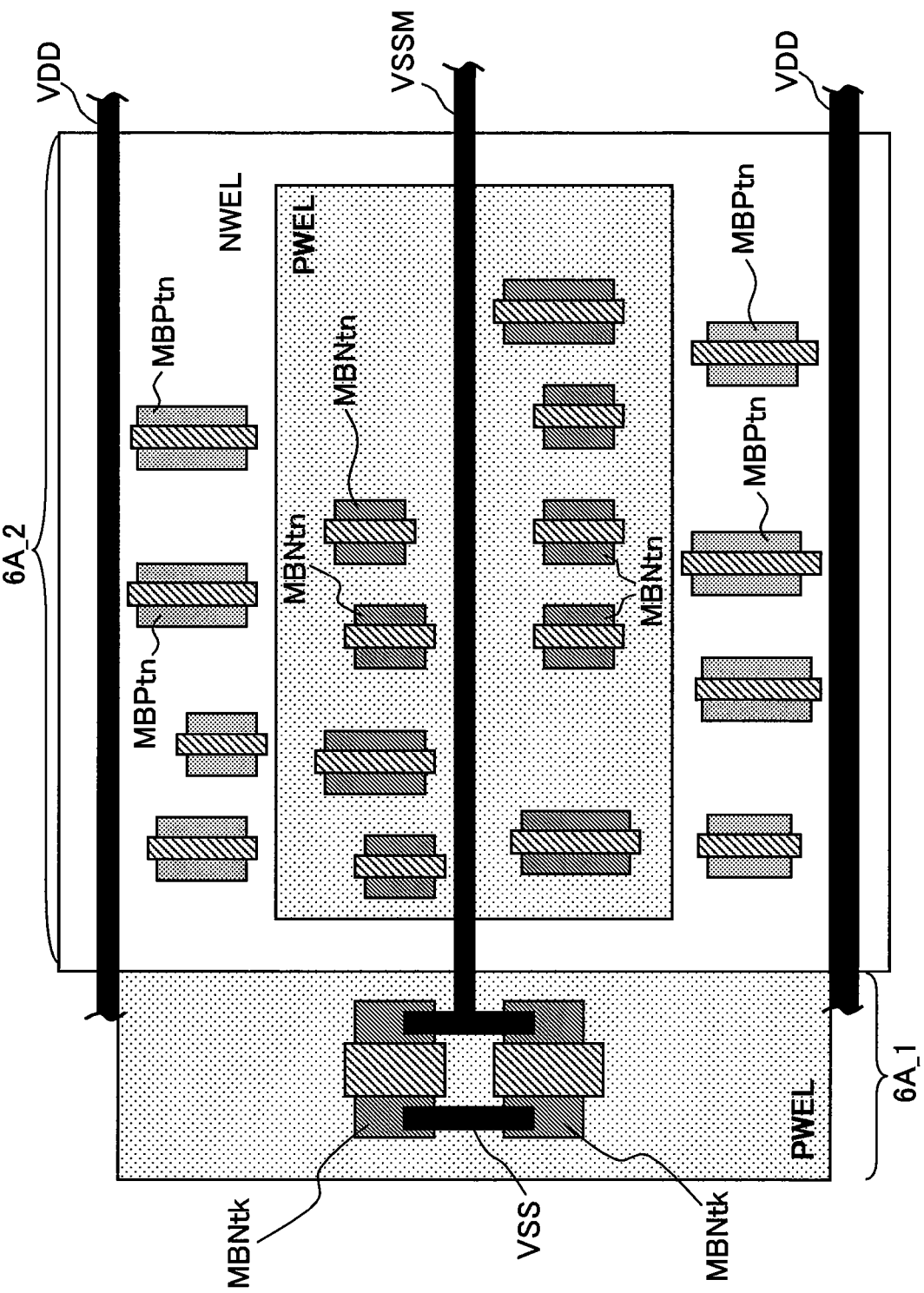
FIG. 12 is a layout illustration showing a two-dimensional arrangement of a power-supply-interruptible circuit corresponding to that in FIG. 10 as a comparative example.
Figure 13:
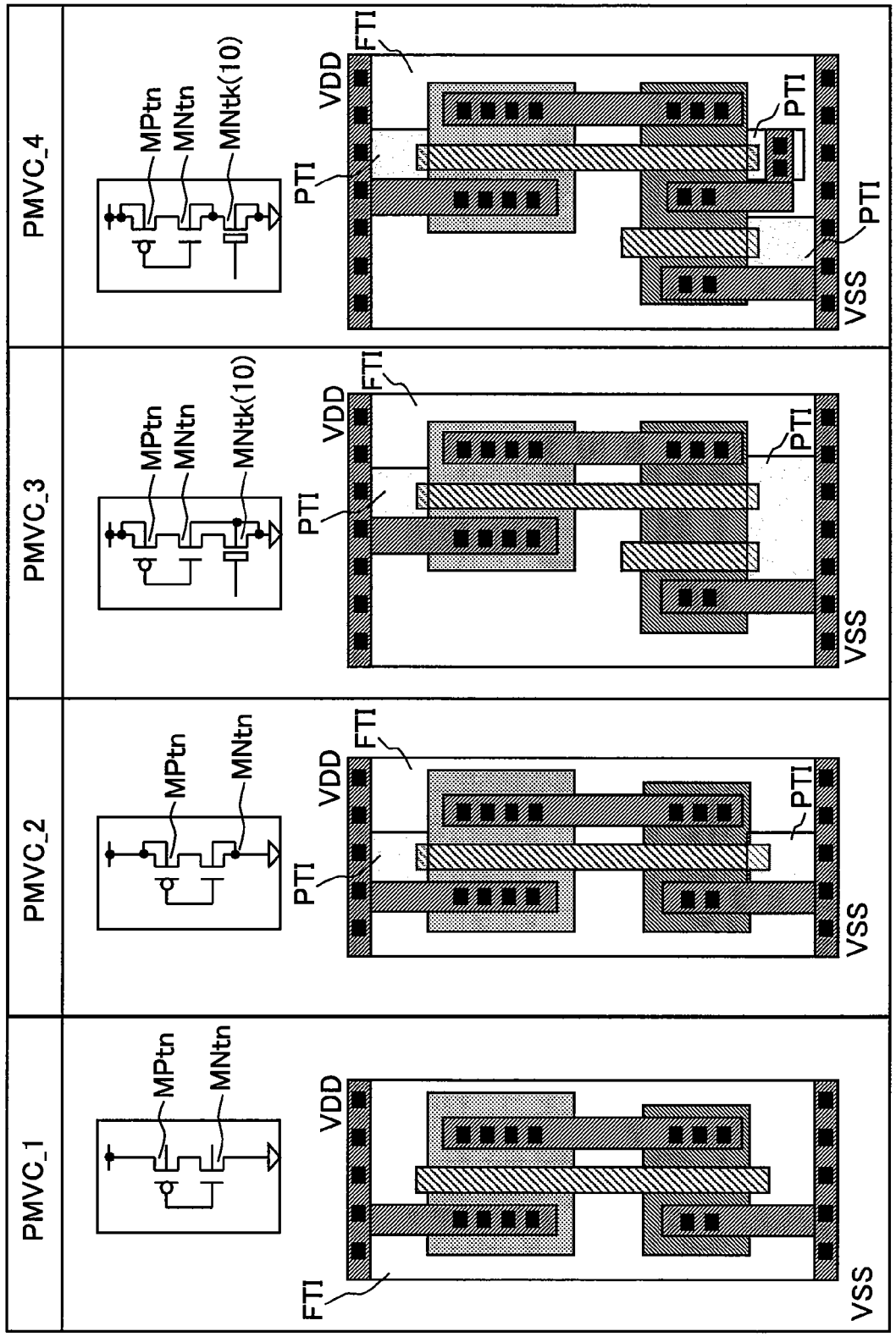
FIG. 13 is an explanatory view showing some primitive cells available for arrangement of the power-supply-interruptible circuit and power-supply-uninterrupted circuit.
Figure 14:
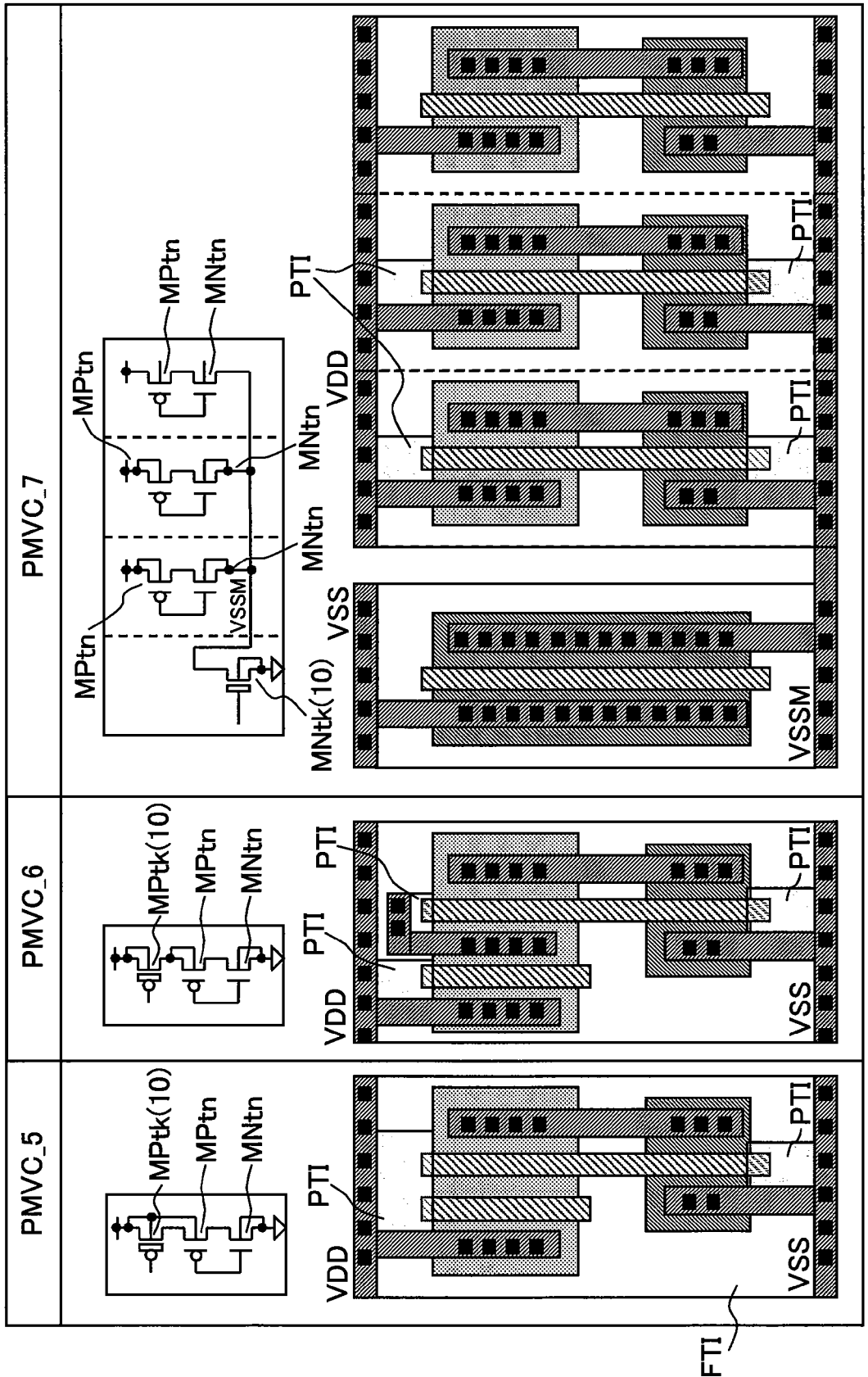
FIG. 14 is an explanatory view showing other primitive cells available for arrangement of the power-supply-interruptible circuit and power-supply-uninterrupted circuit.
Figure 15:
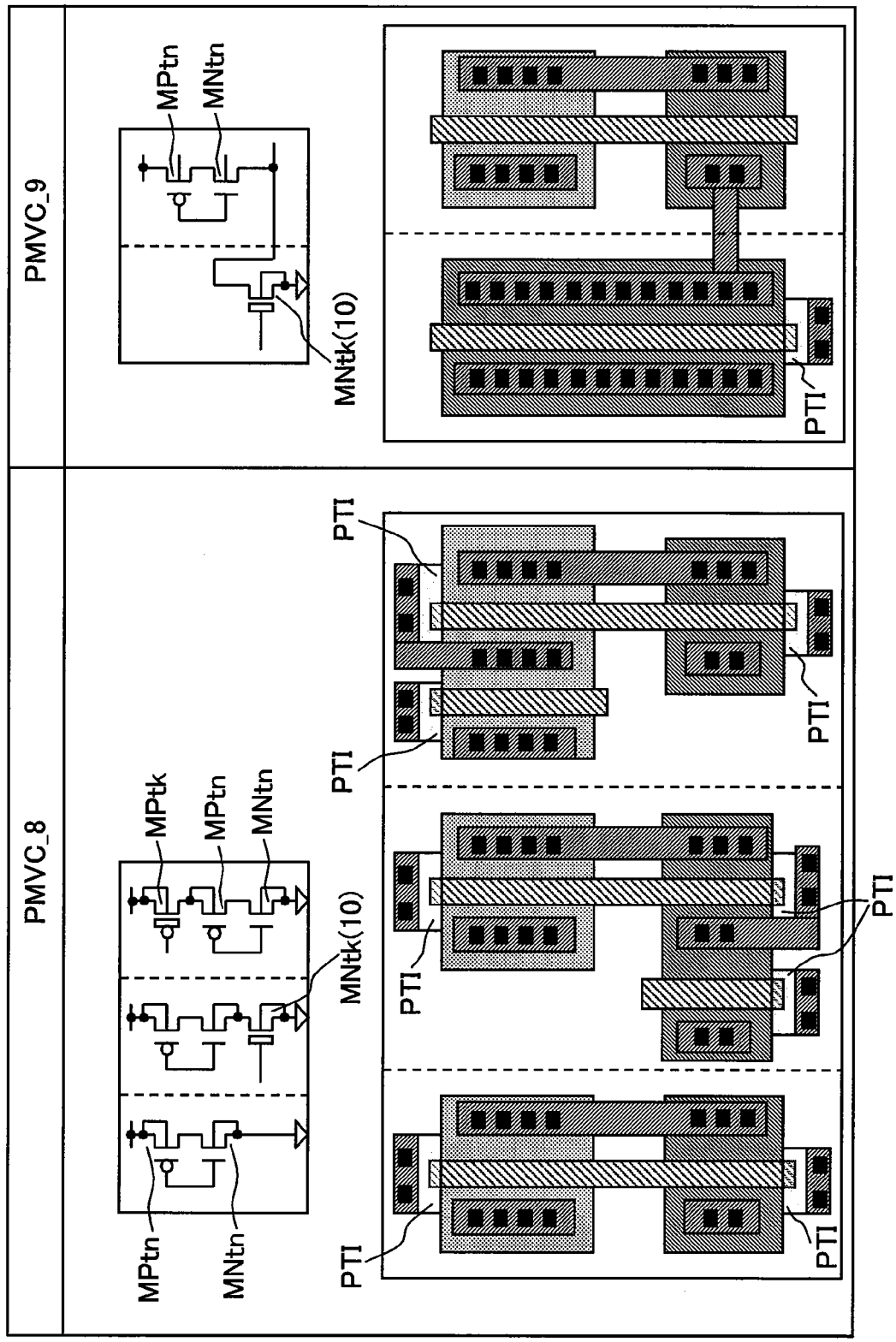
FIG. 15 is an explanatory view showing other primitive cells available for arrangement of the power-supply-interruptible circuit and power-supply-uninterrupted circuit.
Figure 16:
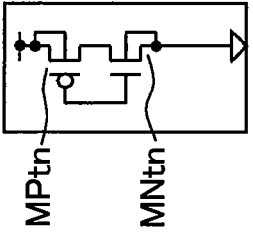
FIG. 16 is an explanatory view showing other primitive cells available for arrangement of the power-supply-interruptible circuit and power-supply-uninterrupted circuit.

Referring to FIG. 12, a two-dimensional layout arrangement of a power-supply-interruptible region corresponding to that in FIG. 10 is shown as a comparative example. As described with reference to FIG. 10, in parallel with the isolation of well regions depending on the conductivity type of each MOS transistor, isolation of well regions is performed between the region 6A_1 for formation of a power switch and the region 6A_2 used to perform a logic operation, etc.

Primitive Cell

The power-supply-interruptible circuit 6 and power-supply-uninterrupted circuit 7 can be formed by a full-custom design. However, it is considered to form these circuits by a standard cell method here. Some primitive cells are prepared in advance as design components and used for designing, whereby circuit designing and layout designing can be facilitated. Now, some primitive cells available for arrangement of the power-supply-interruptible circuit 6 and power-supply-uninterrupted circuit 7 will be described with reference to FIGS. 13-16. While the descriptions on logic functions of the primitive cells are presented taking a CMOS inverter as an example, it is needless to say that the logic functions can be changed appropriately.

The primitive cell PMVC_1 includes thin-film MOS transistors MPtn and MNtn, in which their bodies BDY are made to float. The primitive cell PMVC_2 includes thin-film MOS transistors MPtn and MNtn, in which their bodies BDY are coupled to the respective sources through partial isolation regions PTI. The primitive cell PMVC_3 includes a power switch 10 composed of a thick-film MOS transistor MNtk, and a combination of thin-film MOS transistors MPtn and MNtn connected in series with the power switch, in which the thin-film MOS transistor MPtn is coupled to a source line VDD through a partial isolation region PTI, and the thick-film MOS transistor MNtk constituting the power switch 10 and the thin-film MOS transistor MNtn are coupled to a ground line VSS through a partial isolation region PTI. The primitive cell PMVC_4 differs from the primitive cell PMVC_3 in that the thick-film MOS transistor MNtk constituting a power switch 10 and the thin-film MOS transistor MNtn have bodies coupled to their own sources through the respective partial isolation regions PTI.

The primitive cell PMVC_5 includes a power switch 10 composed of a p-channel thick-film MOS transistor MPtk, and a combination of thin-film MOS transistors MPtn and MNtn connected in series with the power switch, in which the thin-film MOS transistor MNtn is coupled to a ground line VSS through a partial isolation region PTI, and the thick-film MOS transistor MPtk constituting the power switch 10 and the thin-film MOS transistor MPtn is coupled to a source line VDD through a partial isolation region PTI. The primitive cell PMVC_6 differs from the primitive cell PMVC_5 in that the thick-film MOS transistor MPtk constituting a power switch 10 and the thin-film MOS transistor MPtn have bodies coupled to their own sources through the respective partial isolation regions PTI. The primitive cell PMVC_7 includes: an n-channel thick-film MOS transistor MNtk constituting a power switch 10; and a combination of a circuit identical with the primitive cell PMVC_1 and two circuits identical with the primitive cell PMVC_2, which are connected in parallel with one another. In the primitive cell PMVC_7, the n-channel thick-film MOS transistor MNtk is connected in series with the combination of the above-described circuits. The primitive cell PMVC_8 includes circuits, which are identical with the primitive cells PMVC_2, PMVC_3 and PMVC_6, respectively. The primitive cell PMVC_9 includes: an n-channel thick-film MOS transistor MNtk constituting a power switch 10; and a circuit identical with the primitive cell PMVC_1 connected in series with the MOS transistor MNtk. The primitive cells are not limited to the above-described kinds, and they may be changed appropriately.

As SOI structure does not require power supply to a well in Bulk structure, paths for power source and ground do not have to be disposed necessarily in an upside and a downside of each primitive cell. This is taken into account in the cases of the primitive cells PMVC_10 to PMVC_13 shown in FIG. 16. Further, the primitive cell PMVC_11 has thin-film MOS transistors MPtn and MNtn with floating bodies.

Layout Forms of Power Switch

Referring to FIGS. 17-23, there are exemplified transistor layout forms, which incorporate primitive cells, etc. in a power-supply-interruptible circuit 6 and power-supply-uninterrupted circuit 7. It is herein omitted to show a signal line for connection of MOS transistors MNtn and MPtn between primitive cells in the drawing.

Figure 17:
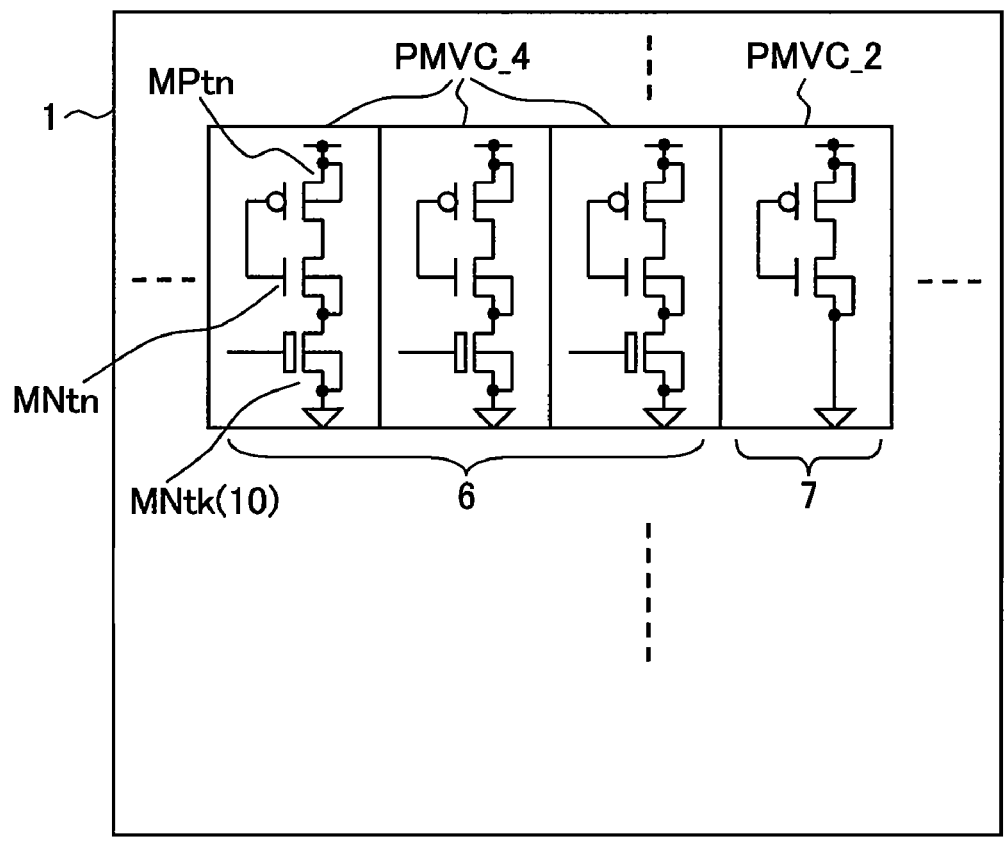
FIG. 17 is a circuit diagram exemplifying a transistor layout form, which incorporates primitive cells, etc. in a power-supply-interruptible circuit and a power-supply-uninterrupted circuit.

In the situation shown in FIG. 17, the primitive cell PMVC_4 is used in the power-supply-interruptible circuit 6, and the primitive cell PMVC_2 is used in the power-supply-uninterrupted circuit 7.

Figure 18:
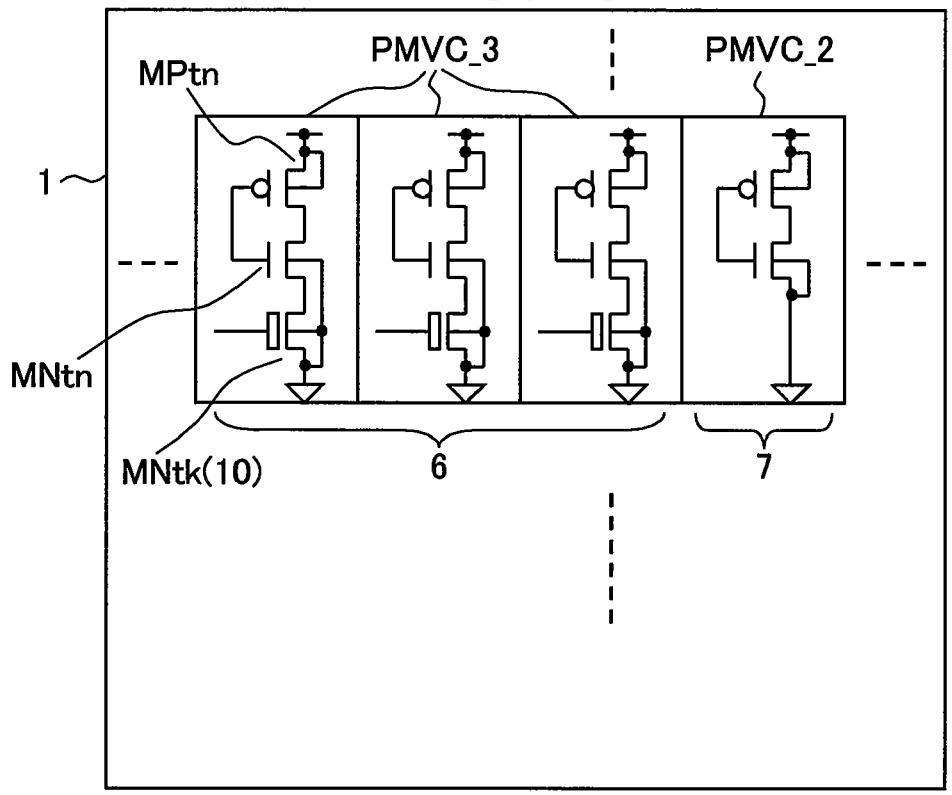
FIG. 18 is a circuit diagram exemplifying another transistor layout form, which incorporates primitive cells, etc. in a power-supply-interruptible circuit and a power-supply-uninterrupted circuit.

In the situation shown in FIG. 18, the primitive cell PMVC_3 is used in the power-supply-interruptible circuit 6, and the primitive cell PMVC_2 is used in the power-supply-uninterrupted circuit 7.

Figure 19:
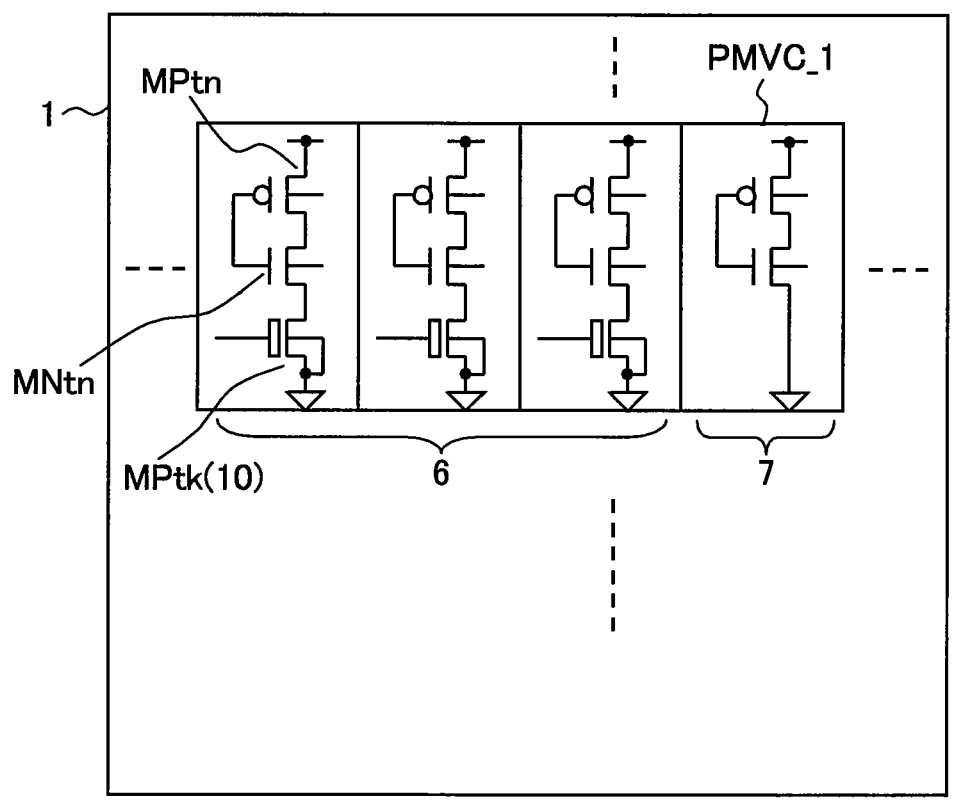
FIG. 19 is a circuit diagram exemplifying another transistor layout form, which incorporates primitive cells, etc. in a power-supply-interruptible circuit and a power-supply-uninterrupted circuit.

In the situation shown in FIG. 19, the primitive cell PMVC_11 is used in the power-supply-interruptible circuit 6, and the primitive cell PMVC_1 is used in the power-supply-uninterrupted circuit 7. In the cases shown in the drawings, bodies BDY of the MOS transistors other than the power switches 10 are made to float, and therefore lines for biasing the bodies or the like are not needed, which contributes to reduction in physical scale. In regard to a thick-film MOS transistor and a MOS transistor for analog use, it is often appropriate that the body of each transistor is not made to float when the following two facts are taken into account. The first is that the variation in voltage of the floating body is expected to affect the threshold voltage when a gate GAT, drain DRN and source SOC are at a high voltage. The second is that in the case of a MOS transistor for analog use, not for switching use, there is a high possibility that unwanted electric charge is left on the floating body.

Figure 20:
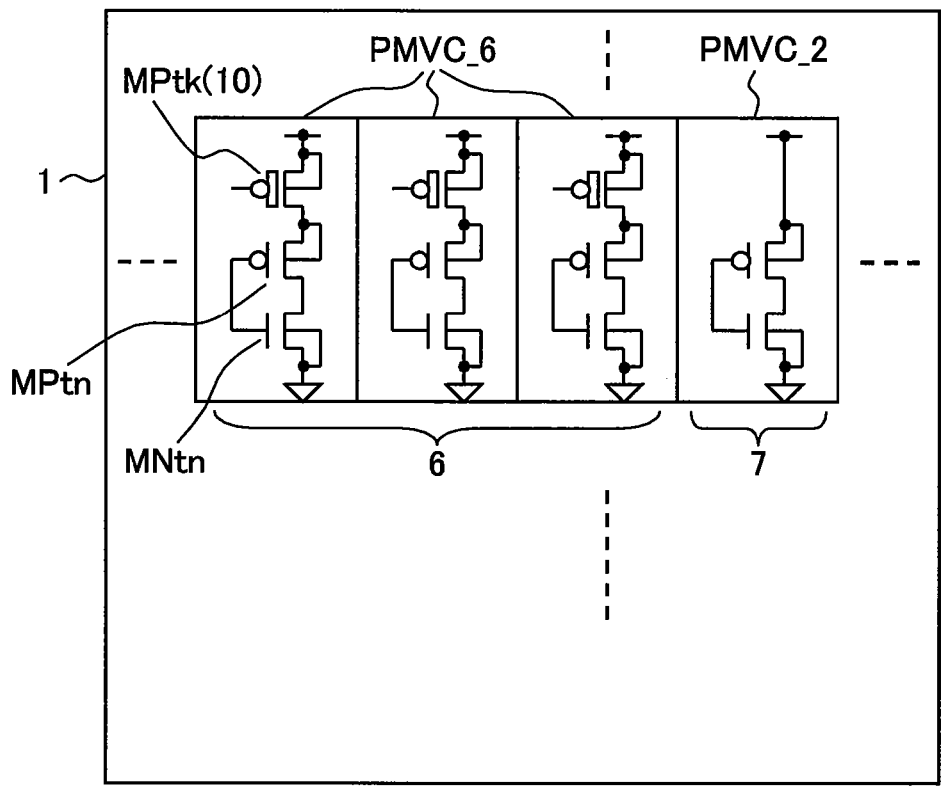
FIG. 20 is a circuit diagram exemplifying another transistor layout form, which incorporates primitive cells, etc. in a power-supply-interruptible circuit and a power-supply-uninterrupted circuit.

In the situation shown in FIG. 20, the primitive cell PMVC_6 is used in the power-supply-interruptible circuit 6, and the primitive cell PMVC_1 is used in the power-supply-uninterrupted circuit 7. The power switch 10 may be a p-channel MOS transistor MPtk.

Figure 21:
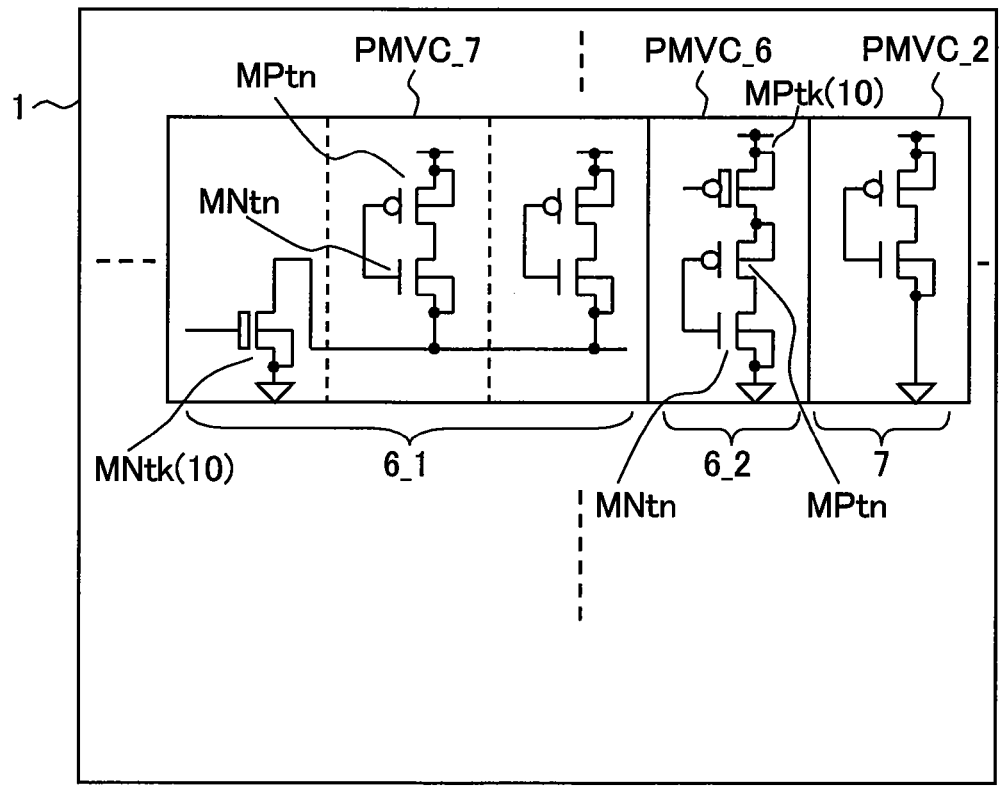
FIG. 21 is a circuit diagram exemplifying another transistor layout form, which incorporates primitive cells, etc. in a power-supply-interruptible circuit and a power-supply-uninterrupted circuit.

In the situation shown in FIG. 21, the primitive cell PMVC_7 is partially used in a power-supply-interruptible circuit 6_1, the primitive cell PMVC_6 is used in a power-supply-interruptible circuit 6_2, and the primitive cell PMVC_2 is used in a power-supply-uninterrupted circuit 7. Between the power-supply-interruptible regions 6_1 and 6_2, the power switches 10 are different in conductivity types and provided individually.

Figure 22:
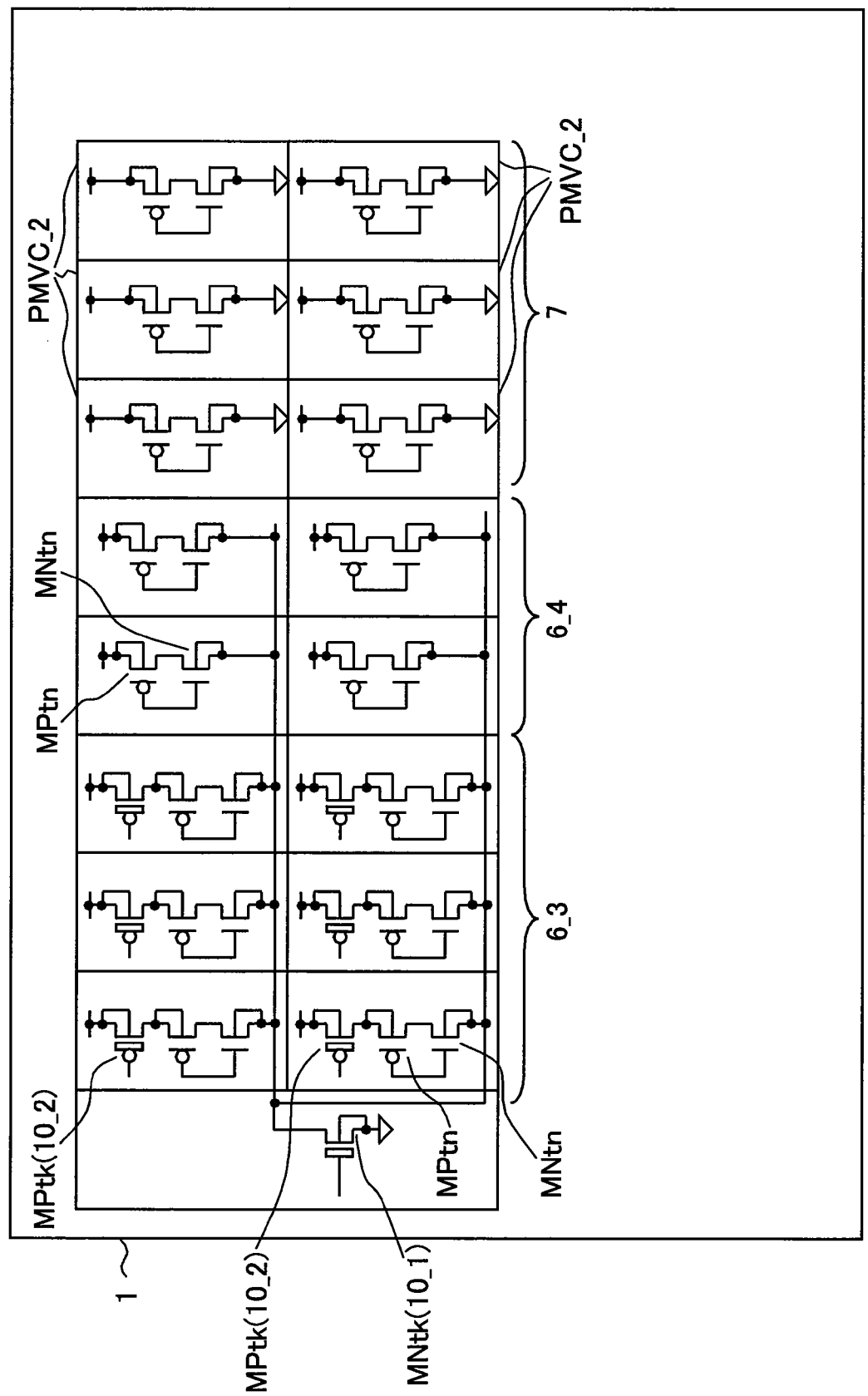
FIG. 22 is a circuit diagram exemplifying a hierarchical structure of power switches.

The power-supply-interruptible circuit 6_3 shown in FIG. 22 is activated when both the power switch 10_1 composed of an n-channel MOS transistor MNtk and the power switch 10_2 composed of a p-channel MOS transistor MPtk are turned on. Depending on the way to hold a logical value or voltage at a required circuit node at the time of power source cutoff, it becomes possible to select which power switch has to be turned off. Also, the following are made possible: to make the power switch 10_1 work as a higher hierarchical switch; and to make the power switch 10_2 work as a lower hierarchical switch. The power-supply-interruptible circuit 6_2 includes a power switch 10_1 composed of an n-channel MOS transistor MNtk, which undergoes switch control together with the power-supply-interruptible circuit 6_1 in a higher hierarchy.

Figure 23:
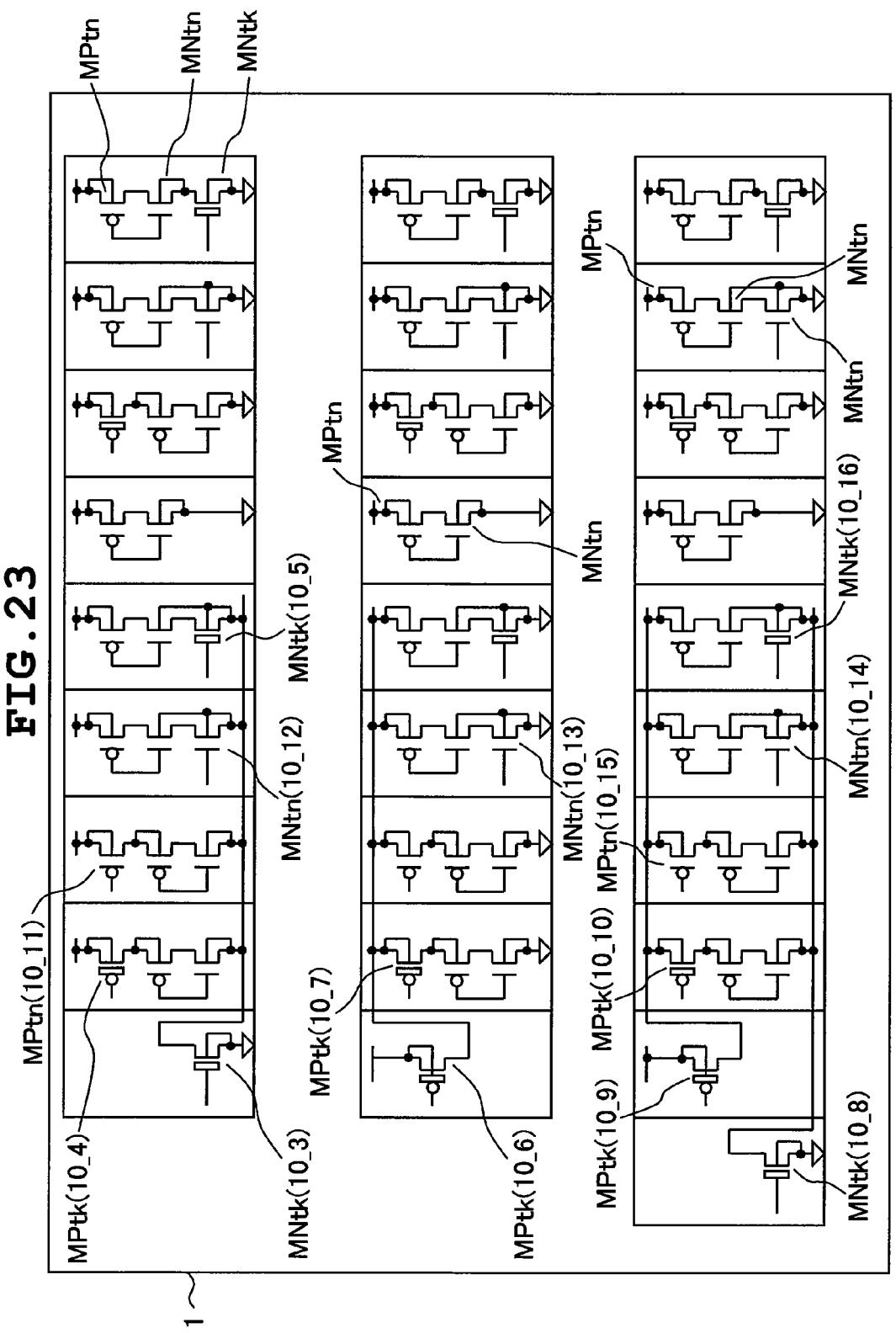
FIG. 23 is a circuit diagram exemplifying a hierarchical structure of power switches, and a situation where MOS transistors with various body potentials are disposed adjacently.

In the situation shown in FIG. 23, MOS transistors with various body potentials are disposed adjacently. When a bias is applied to the body potentials of the MOS transistors disposed in the power-supply-interruptible circuit 6 and power-supply-uninterrupted circuit 7 through the sources thereof, the resultant potentials vary depending on e.g. the number of stages of series connection of the MOS transistors. Even in the case of MOS transistors differing variously in body potential like this, the electrical isolation of the bodies BDY of the transistors is achieved by embedded oxide layers EOX and isolation regions FTI and PTI in the individual transistors themselves. Thus, as exemplified in FIG. 23, it becomes possible to adjacently dispose MOS transistors having various body potentials and various conductivity types. This can apply to the isolation between the thick-film MOS transistors MPtk and MNtk, and the thin-film MOS transistors MPtn and MNtn, which are different in gate voltage. Therefore, as exemplified in FIG. 23, the hierarchical structure for power switches can be adopted freely, too. For example, the following are possible: to adopt a circuit arrangement such that a higher hierarchical power switch 10_3 composed of an n-channel thick-film MOS transistor MNtk, and a lower hierarchical power switch 10_4 composed of a p-channel thick-film MOS transistor MPtk are interposed in a direct current path; to adopt a circuit arrangement such that a power switch 10_5 composed of an n-channel thick-film MOS transistor MNtk as a lower hierarchical power switch is interposed; and to adopt a power switch 10_11 composed of a p-channel thin-film MOS transistor MPtn or a power switch 10_12 composed of an n-channel thin-film MOS transistor MNtn as the lower hierarchical power switch. Also, it is possible to adopt a circuit arrangement such that a higher hierarchical power switch 10_6 and a lower hierarchical power switch 10_7, which are composed of p-channel thick-film MOS transistors MPtk, are interposed in a direct current path. Further, a power switch 10_13 composed of an n-channel thin-film MOS transistor MNtn can be adopted as the lower hierarchical power switch. Also, both a power switch 10_8 composed of an n-channel thick-film MOS transistor MNtk, and a power switch 10_9 composed of a p-channel thick-film MOS transistor MPtk can be mixed as higher hierarchical power switches in an electric current path. Further, in this case, it is also possible to adopt a lower hierarchical power switch 10_15 composed of a p-channel thin-film MOS transistor MPtn, a lower hierarchical power switch 10_14 composed of an n-channel thin-film MOS transistor MNtn, or a lower hierarchical power switch 10_16 composed of an n-channel thick-film MOS transistor MNtk, appropriately. Thus, careful and meticulous power switch control can be performed depending on the circuit arrangement or circuit function readily.

Figure 24:
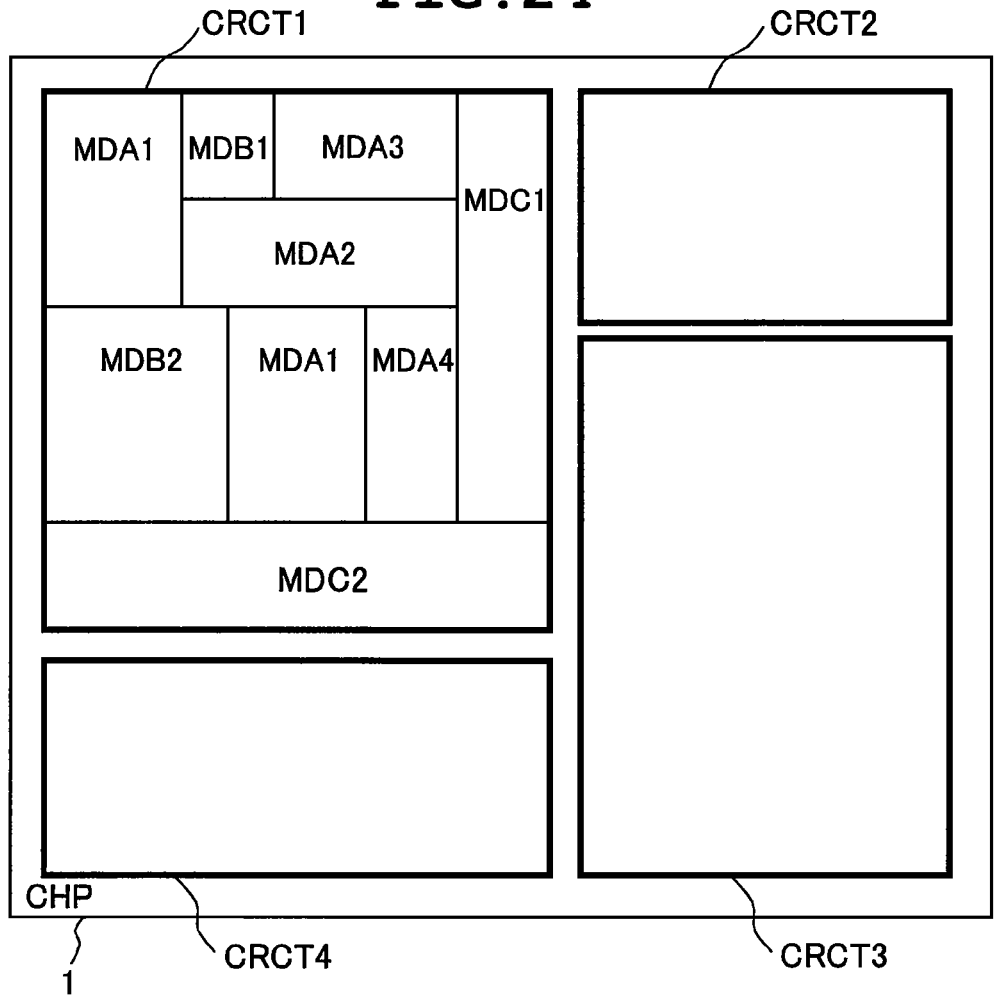
FIG. 24 is a plan view showing a layout of circuit regions corresponding to a hierarchical structure of power switches in a semiconductor integrated circuit.
Figure 25:
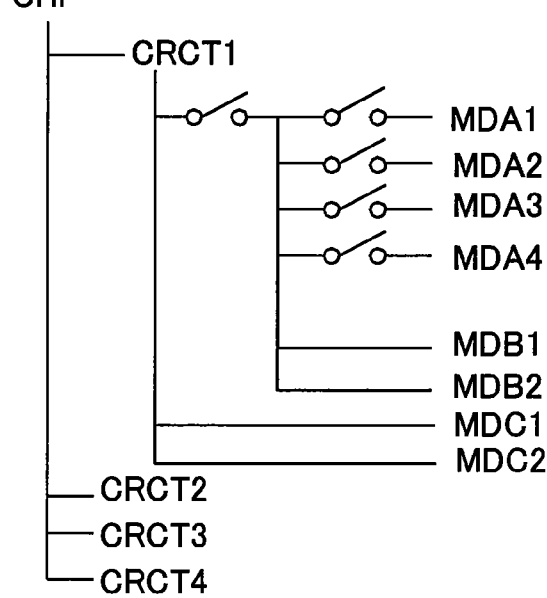
FIG. 25 is an explanatory view exemplifying a hierarchical structure of the power switches for power-source cutoff control.

The hierarchical structure of power switches in a semiconductor integrated circuit (CHP) 1 will be described further. For example, with the layout exemplified by FIG. 24, the integrated circuit is divided into four circuit regions CRCT1-CRCT4 for the sake of convenience, which will be considered. For example, one circuit region CRCT1 can be divided into functional blocks MDA1-MDA4, MDB1 and MDB2, and MDC1 and MDC2 functionally. FIG. 25 exemplifies a hierarchical structure of power switches for power-source cutoff control with respect to the functional blocks MDA1-MDA4, MDB1 and MDB2, and MDC1 and MDC2. In the circuit region CRCT1, the functional blocks MDC1 and MDC2 constitute a power-supply-uninterrupted circuit 7; and the other functional blocks MDA1-MDA4, and MDB1 and MDB2 constitute a power-supply-interruptible circuit 6. All the functional blocks MDA1-MDA4, MDB1 and MDB2 of the power-supply-interruptible circuit 6 are arranged so that a higher hierarchical power switch 10_10 can cut off the power supplies to the functional blocks collectively. Of these blocks, the functional blocks MDA1-MDA4 are arranged so that lower hierarchical power switches 10_11 to 10_14 can cut off the power supplies to the blocks MDA1-MDA4 respectively.

For example, in the case where the semiconductor integrated circuit 1 is a microcomputer, the functional blocks MDC1 and MDC2 that the power-supply-uninterrupted circuit 7 includes, are e.g. an interruption controller and a system controller for performing power source control, etc. When the functional blocks MDA1-MDA4, MDB1 and MDB2, and MDC1 and MDC2, which constitute a power-supply-interruptible circuit 6, make a central processing unit (CPU), the functional blocks MDA1-MDA4 can be assigned for registers including a general purpose register, and the functional blocks MDB1 and MDB2 can be assigned for a computing unit, an instruction decoder, etc. These assignments enables e.g. choosing to maintain information concerning the data that a certain register such as a general purpose register holds, and control information at the time when the CPU executes a standby instruction to stop the action of an internal circuit, for example.

Figure 26:
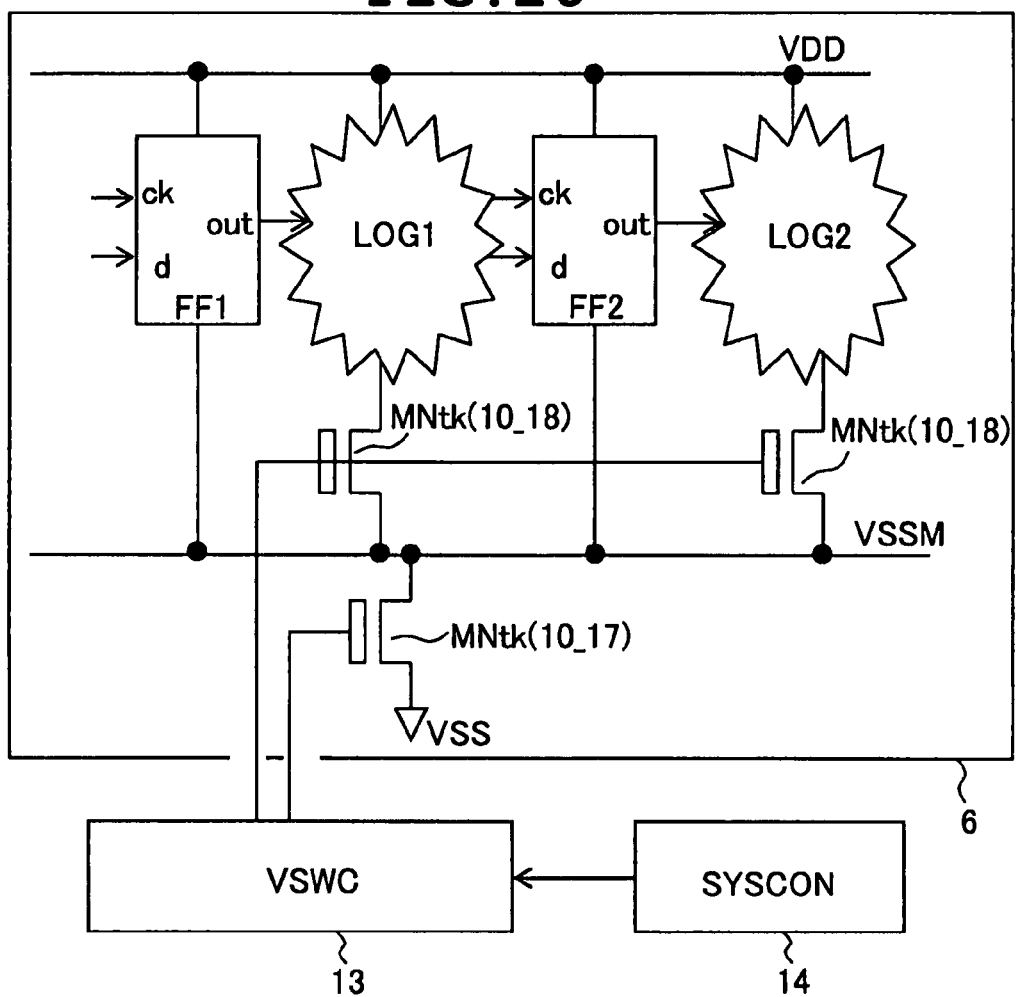
FIG. 26 is an explanatory view of a power switch control system when a hierarchical power switch structure is applied to a serial path of a set of sequential circuits and combinational circuits.

Referring to FIG. 26, there is shown another example of the hierarchical structure of power switches in the power-supply-interruptible circuit. In the drawing, the power-supply-interruptible circuit 6 includes combinational circuits LOG1 and LOG2 composed of logical gates, etc. and sequential circuits FF1 and FF2 such as a flip-flop. The output of the sequential circuit FF1 is input to the combinational circuit LOG1. The output of the combinational circuit LOG1 is input to the sequential circuit FF2. Then, the output of the sequential circuit FF2 is input to the combinational circuit LOG2. The combinational circuits LOG1 and LOG2 and the sequential circuits FF1 and FF2 accept the supply of operating power source through a source line VDD. The sequential circuits FF1 and FF2 are connected to a ground line VSS through a higher hierarchical power switch 10_17 composed of an n-channel thick-film MOS transistor MNtk. The combinational circuits LOG1 and LOG2 are connected in series to the higher hierarchical power switch 10_17 through lower hierarchical power switches 10_18, each composed of an n-channel thick-film MOS transistor. When cutting off the power sources to the combinational circuits LOG1 and LOG2 and the sequential circuits FF1 and FF2 all together, the power switch control circuit (VSWC) 13 may turns off the higher hierarchical power switch 10_17. When a functional unit for performing cutoff of power source is departmentalized, it is desirable, from the viewpoint of holding of a memory node at the time of cutoff power source, to make considerations not to cut off the power supply to the sequential circuits. In this case, the power switch control circuit 13 controls only the lower hierarchical power switches 10_18 to OFF state while leaving the higher hierarchical power switch 10_17 in ON state. Then, it becomes possible to recover a condition just before cutoff of power source from the condition where power supply is interrupted at a high speed. The way the power switch control circuit 13 executes switch control is determined by e.g. a system controller (SYSCON) 14 depending on the operation mode of the semiconductor integrated circuit. For example, the system controller 14 responds to the power on reset to turns on the higher hierarchical power switch 10_17 and lower hierarchical power switch 10_18, thereby allowing the power-supply-interruptible circuit 6 to operate. Thereafter, when in a low power consumption priority mode, the CPU executes a standby instruction, a first standby mode is specified. In response to the specification of the first standby mode, the system controller 14 brings the higher hierarchical power switch 10_17 to OFF state. After the power-supply-interruptible circuit 6 is allowed to operate, when CPU executes a standby instruction in a high-speed operation priority mode, the second standby mode is specified. In response to the specification of the second standby mode, the system controller 14 brings only the lower hierarchical power switch 10_18 to OFF state. Sequential circuits typified by FF1 and FF2 keep holding latched data before cutoff of power source as they are, and are brought to a second standby state. Thus, when cutoff of power source is canceled by interruption or the like, a condition just before the cutoff of power source can be recovered at a high speed. In the case shown in FIG. 26, it is also possible to adopt a thin-film MOS transistor as the lower hierarchical power switch.

Figure 27:
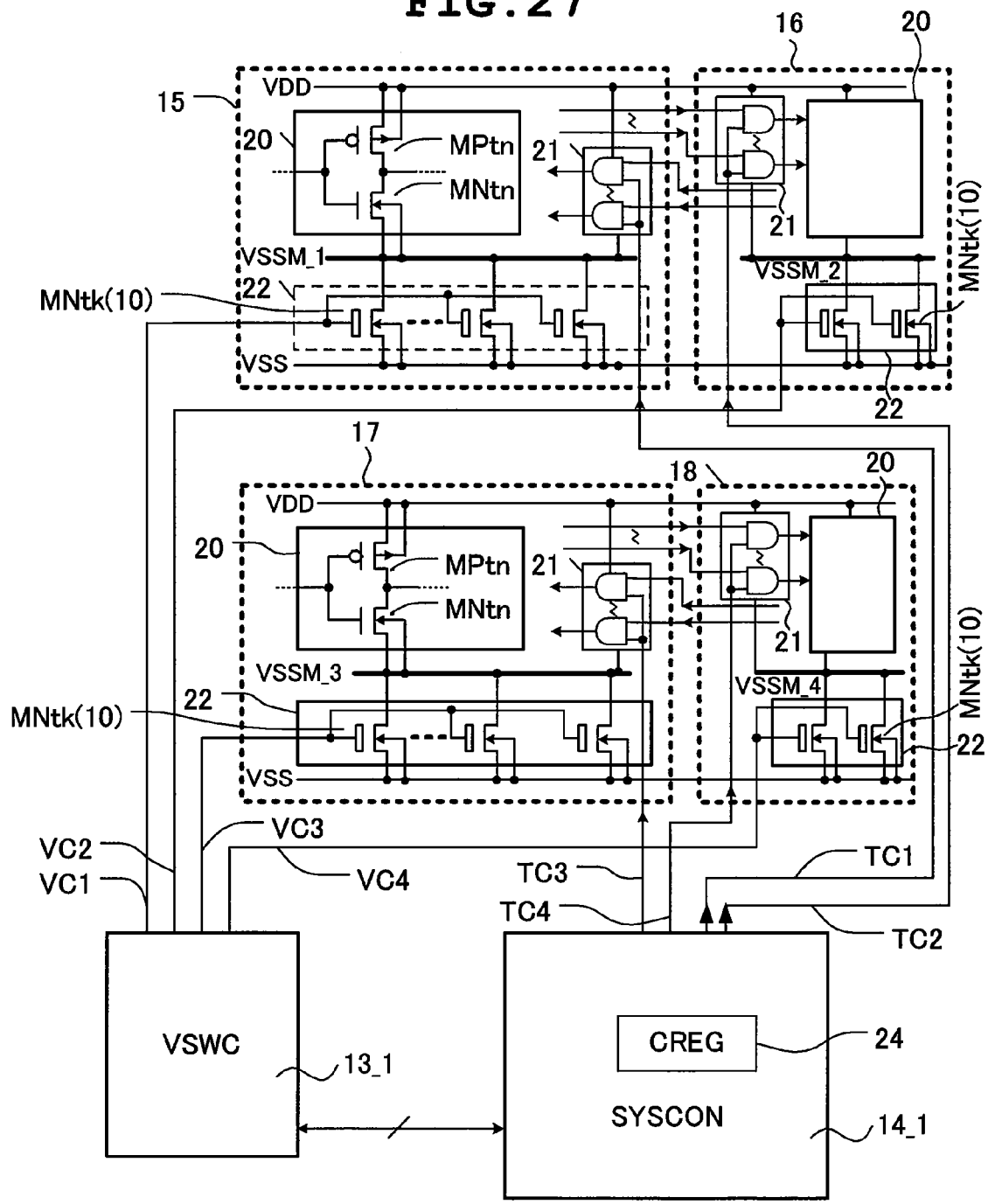
FIG. 27 is a circuit diagram exemplifying a power switch shutoff control structure, which is arranged in consideration of prevention of unstable propagation at the time of cutoff of power source in a power-supply-interruptible circuit.

A power switch cutoff control structure, which is arranged in consideration of prevention of unstable propagation at the time of cutoff of power source in a power-supply-interruptible circuit, is exemplified in FIG. 27.

In the power-supply-interruptible circuit 6, four circuit modules 15-18 are exemplified representatively. The circuit modules 15-18 each have: a logic circuit 20 including thin-film MOS transistors MPtn and MNtn; an anti-unstable propagation circuit 21; and a power switch circuit 22 including thick-film MOS transistors MPtk and MNtk. The logic circuit 20 and anti-unstable propagation circuit 21 are connected to a source line VDD and corresponding one of virtual ground lines VSSM_1 to VSSM_4. The virtual ground lines VSSM_1 to VSSM_4 are connected to a common ground line VSS through corresponding power switch circuits 22. The anti-unstable propagation circuit 21 is a circuit to forcibly adjust an unstable signal input to e.g. a default such as Low level when the output from an adjacent circuit module is made unstable owing to cutoff of power source to the adjacent module, which consists of an AND gate disposed in e.g. a signal path. While the detailed illustration is omitted in the drawing, the anti-unstable propagation circuit 21 is placed in all input interface portions which receive the output of an adjacent circuit module.

The system controller 14_1 has a control register (CREG) 24. The CPU, which is not shown in the drawing, makes the setting of power supply-control data to control whether to activate/deactivate the circuit modules 15-18 individually, with respect to the control register 24. The system controller 14_1 generates unstable propagation-control signals TC1-TC4 respectively for the circuit modules 15-18 based on the set power supply-control data, and supplies the power switch control circuit (VSWC) 13_1 with the power supply-control data. The power switch control circuit 13_1 generates power supply-control signals VC1-VC4 respectively for the circuit modules 15-18 based on the power supply-control data. The power supply-control signals VC1 to VC4 are made High level according to a direction to activate the corresponding circuit module, or Low level according to a direction to deactivate the corresponding circuit module. The unstable propagation-control signal TC1-TC4 are made Low level in response to the issue of a direction to deactivate a circuit module located on the input side of the anti-unstable propagation circuit 21, or High level in response to the issue of a direction to activate the circuit module.

For example, when the CPU responds to a reset processing and sets control data to activate the circuit modules 15 and 18 and control data to deactivate the circuit modules 16 and 17 with respect to the control register 24, the power-source control circuit 13_1 receives the control data and then brings the power switch circuits 22 of the circuit modules 15 and 18 to ON states in response to signals VC1 and VC4 of High level, and brings the power switch circuits 22 of the circuit modules 16 and 17 to OFF states in response to signals VC2 and VC3 of Low level, thereby allowing the circuit modules 15 and 18 to operate. Based on the control data set to the control register 24, the system controller 14_1 forcibly adjusts outputs of anti-unstable propagation circuits 21 in the activated circuit modules 15 and 18, which receive the outputs from the deactivated circuit modules 16 and 17, to Low levels, according to signals TC1 and TC4 of Low level, and leaves the other signals TC2 and TC3 at High level. Thus, the potential of the activated circuit module being affected in input by unstable data output from the deactivated circuit module to malfunction is eliminated.

Body Bias Control of Power Switch

Figure 29:
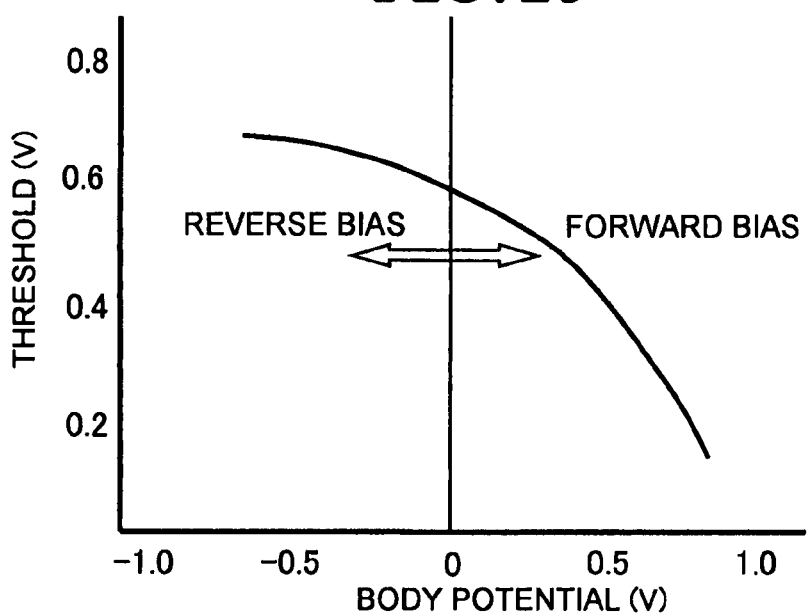
FIG. 29 is a view of a characteristic curve showing the relation of threshold voltages with respect to body bias control of the power switch.

In the above description, the body BDY of each of the power switches 10, each composed of corresponding one of thick-film MOS transistors MNtk and MPtk, is connected to its own source SOC using a partial isolation region PTI, as exemplified in FIGS. 6-8. However, the body bias control to control the body potential of each power switch 10 will be described below. For example, the power-supply-interruptible circuit shown in FIG. 28 is assumed. In this case, it is proper that ΔV should be reduced to a minimum when the power switch 10 is in ON state, which aims at preventing a high-speed operation of a logic circuit including thin-film MOS transistors MNtn and MPtn, which is connected in series with the power switch 10 from being interfered. In other words, it is suitable that the ON-state resistance of the power switch 10 should be minimized in operation. On this account, it is appropriate the threshold voltage of the power switch 10 is reduced to the extent possible. On the other hand, when the power switch 10 is in OFF state, it is desirable that the sub-threshold leak current is as small as possible. For this reason, it is advantageous that the threshold voltage of the power switch 10 is made as large as possible. To satisfy the antithetical requirements, it is proper to perform the body bias control of the power switch 10 so as to meet a characteristic curve having a tendency as shown in FIG. 29. In FIG. 29, the body potential 0V (0 volt) means that it is equal to a source potential. A positive body potential means that the potential is biased toward a drain potential, and a negative body potential means that it is biased to the reverse direction. In the case of an n-channel MOS transistor, the threshold voltage is lowered with a rise in body voltage. In the case of a p-channel MOS transistor, the threshold voltage is lowered with a decrease in body voltage. For the sake of convenience, a body bias of a direction which causes a decrease in the threshold voltage is referred to as "forward bias"; and a body bias of a direction which results in an increase in the threshold voltage is referred to as "reverse bias."

Referring to FIG. 30, there is shown a fundamental form for body bias control of a power-supply-interruptible region 6. In the condition where the power switch 10 is in OFF state, a reverse bias is applied to the body. In the condition where the power switch 10 is in ON state, a forward bias is applied to the body. Thus, the following are achieved: a decrease in leakage owing to an increase in the threshold voltage of the power switch during the time of cutoff of power source; and the enhancement of electric current feeding capability owing to a decrease in the threshold voltage of the power switch during the time of supply of power source.

Figure 31:
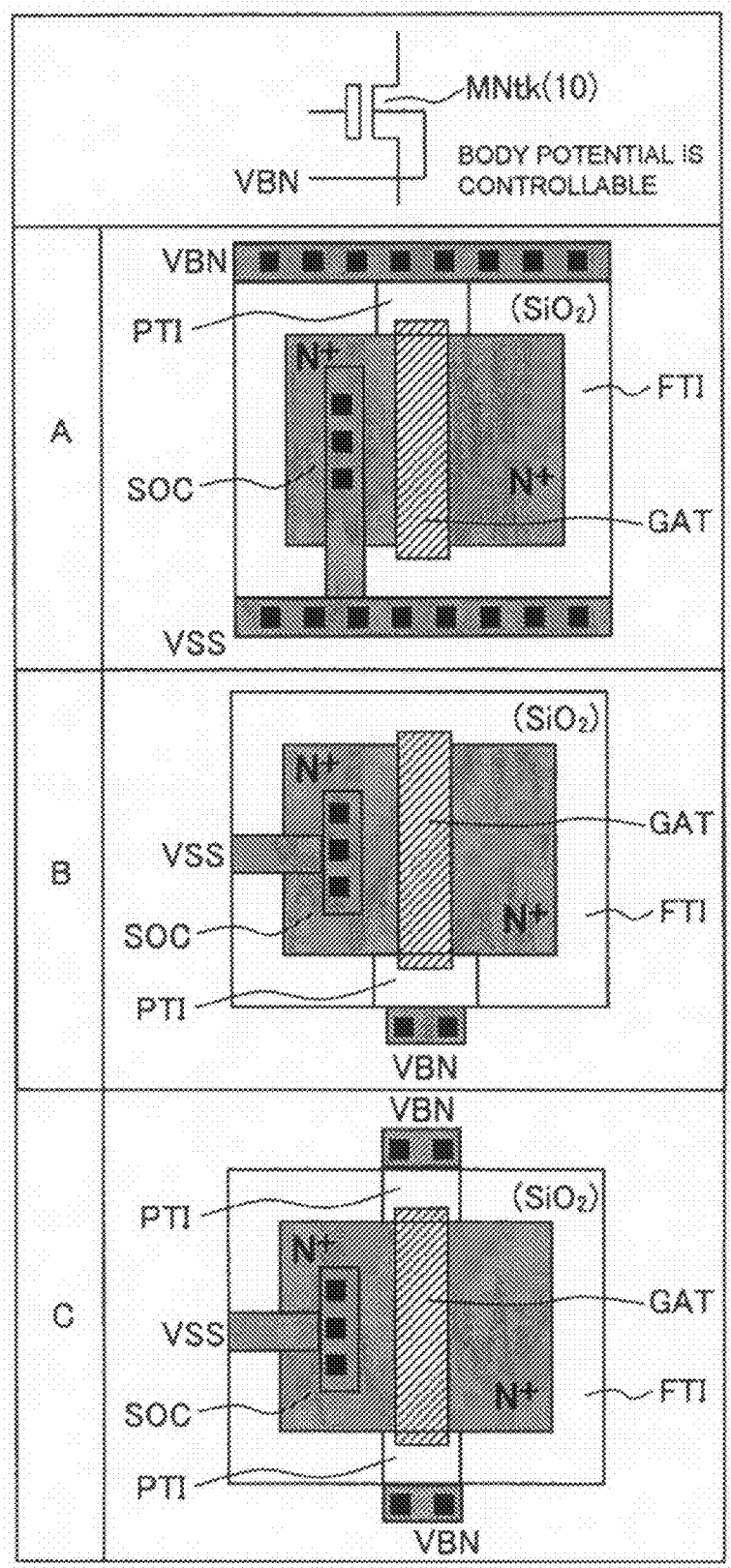
FIG. 31 is an explanatory view showing an example of a power cell, which is controllable in body bias.

Referring to FIG. 31, there is exemplified the cell of a power switch controllable in body bias, hereinafter referred to as "power switch cell." The power cell marked with "A" has a body connected to a body bias line VBN through a portion underneath a partial isolation region PTI. As a power cell of SOI structure does not require power supply to a well unlike Bulk structure, it is not necessary to lay out a ground line along edge sides of the power cell. The ground line VSS may be laid out in a central portion of the cell as a power cell marked with "B." All MOS transistors do not necessarily require the body bias line VBN, and therefore the body bias line VBN may occupy only a part of one of the edge sides as shown by the power cell marked with "B." Further, the gate width of the power switch 10 is larger than that of a MOS transistor for performing a logic operation, and therefore body lines VBN may be connected to the body on both sides of the gate in a longitudinal direction thereof. The body line VBN may be connected to a center portion of the body in a longitudinal direction thereof, which is omitted in the drawing.

Figure 32:
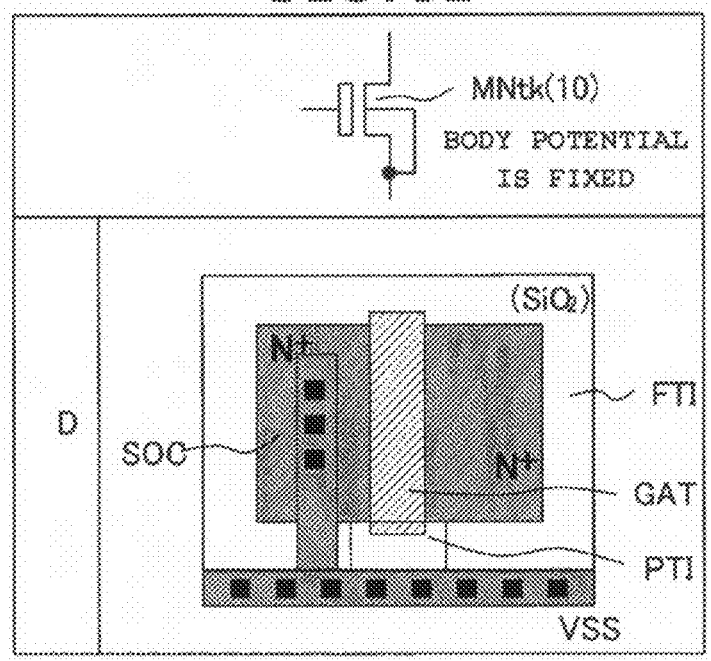
FIG. 32 is an explanatory view showing an example of a power cell with its body fixed to its own source.
Figure 33:
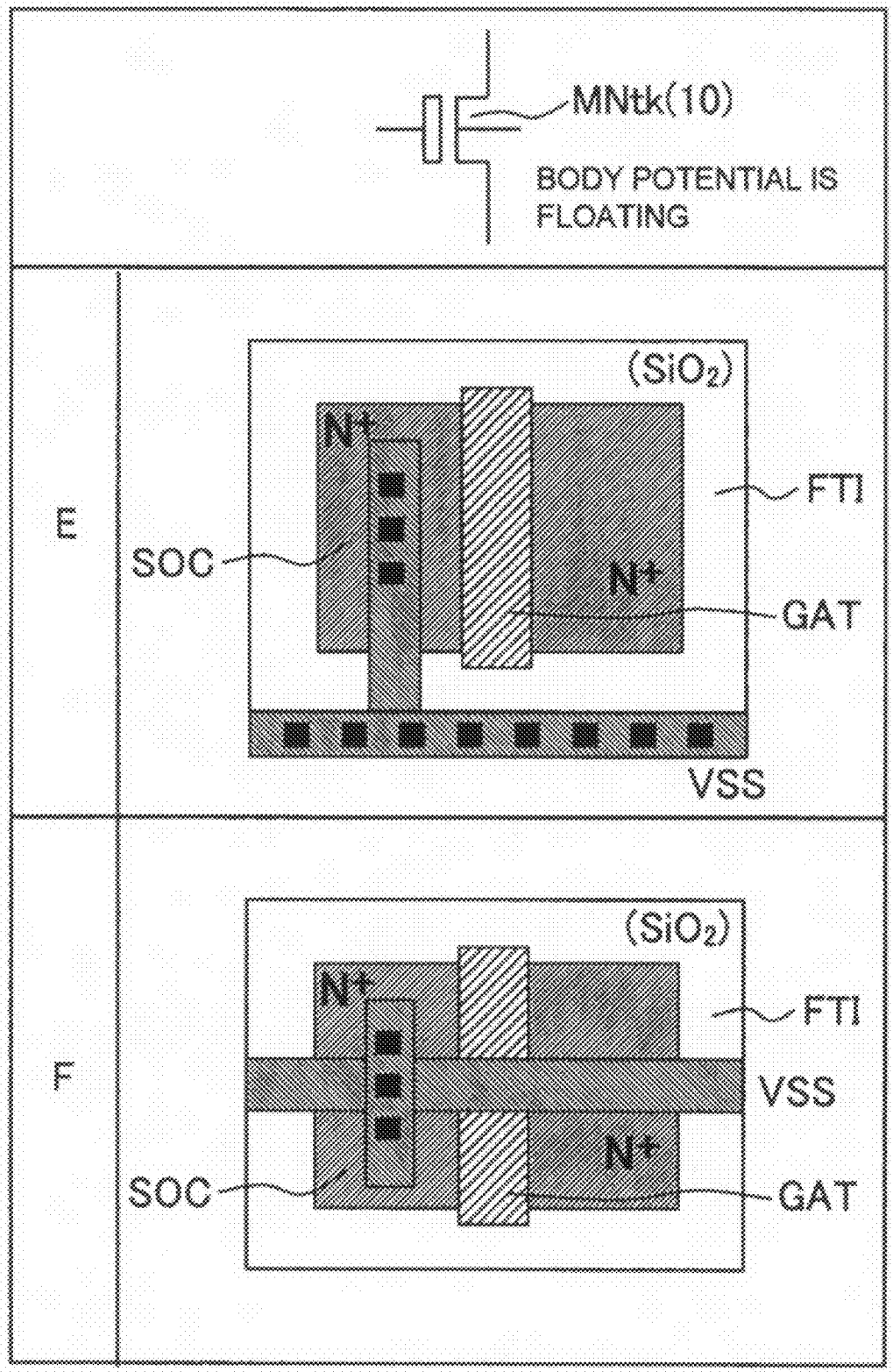
FIG. 33 is an explanatory view showing an example of a power cell with its body floating.

Referring to FIG. 32, a cell D of a power switch is exemplified for reference, which is arranged so that the body potential is fixed by connection to its own source. FIG. 33 exemplifies power switch cells E and F with their body potentials floating. As shown by the power switch cell F, a ground line VSS can be laid out in a central portion of the cell.

Body Bias Control for Suppression of Inrush Current

Figure 34:
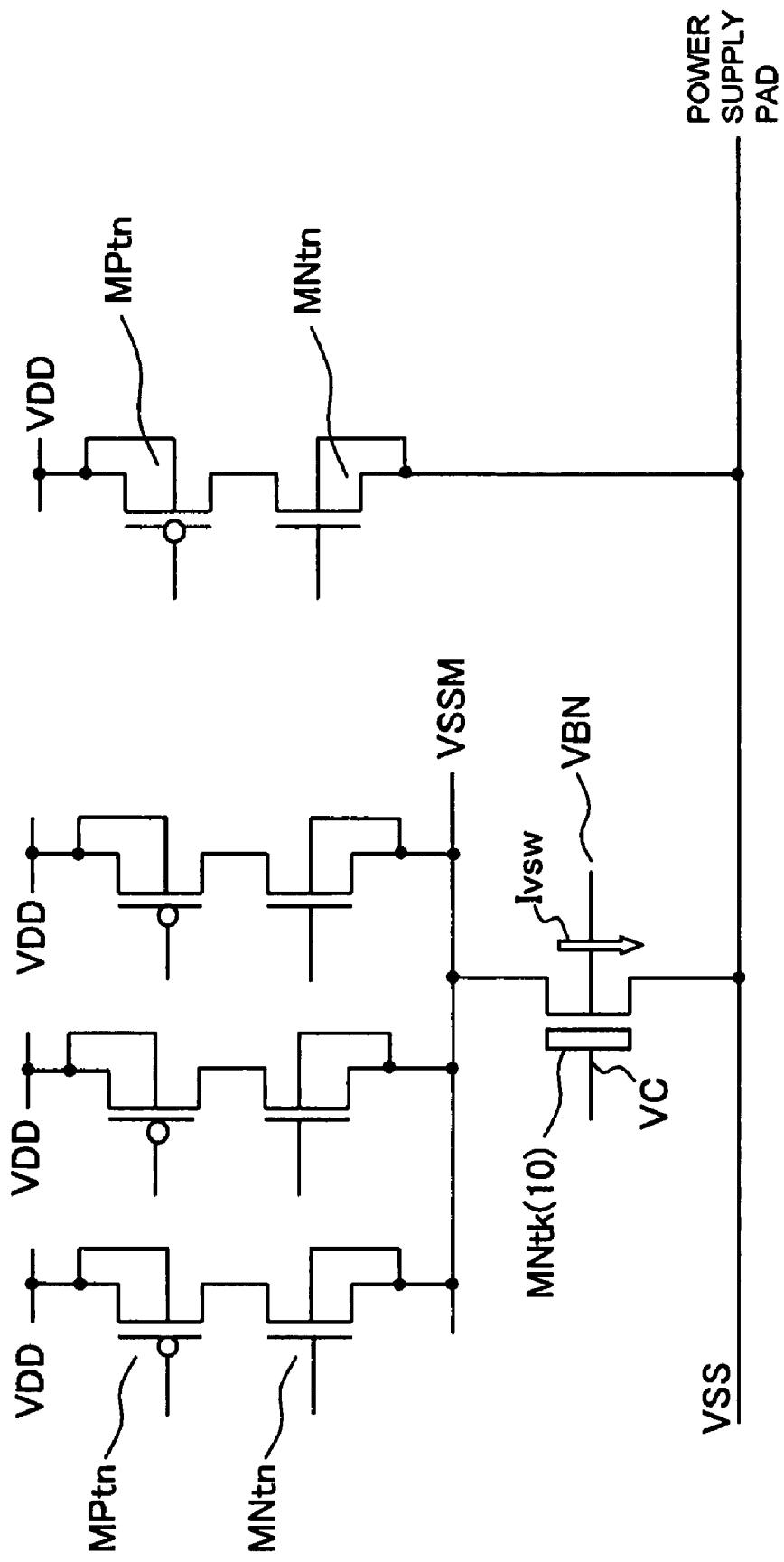

As described above, well isolation between a power-supply-interruptible circuit and a power-supply-uninterrupted circuit or the like is not required when a MOS transistor having SOI structure is adopted and as such, it becomes possible essentially to share a source line and a ground line between the circuits. In this case, when a power switch is turned on in the power-supply-interruptible circuit, which shares source and ground lines with the power-supply-uninterrupted circuit, an inrush current flows there at that moment, noise enters the source and ground lines. As exemplified in FIG. 34, in the case of a power switch 10 composed of an n-channel MOS transistor MNtk, an inrush current passing through the switch causes the voltage of the ground line VSS to rise undesirably. The rise of the ground potential VSS leads to fluctuation of the logical threshold voltage of the power-supply-uninterrupted circuit which shares the ground line, and makes smaller an operation margin with respect to an input voltage. As a result, the possibility of causing a malfunction in the power-supply-uninterrupted circuit is increased. In the case of a power switch composed of a p-channel MOS transistor MPtk, an inrush current passing through the switch causes the voltage of the source line VDD to drop undesirably, which is not shown in the drawing. As a result, as in the case of the power switch 10 composed of an n-channel MOS transistor MNtk, the possibility of causing a malfunction in the power-supply-uninterrupted circuit, which shares the source line, is increased.

Figure 35:
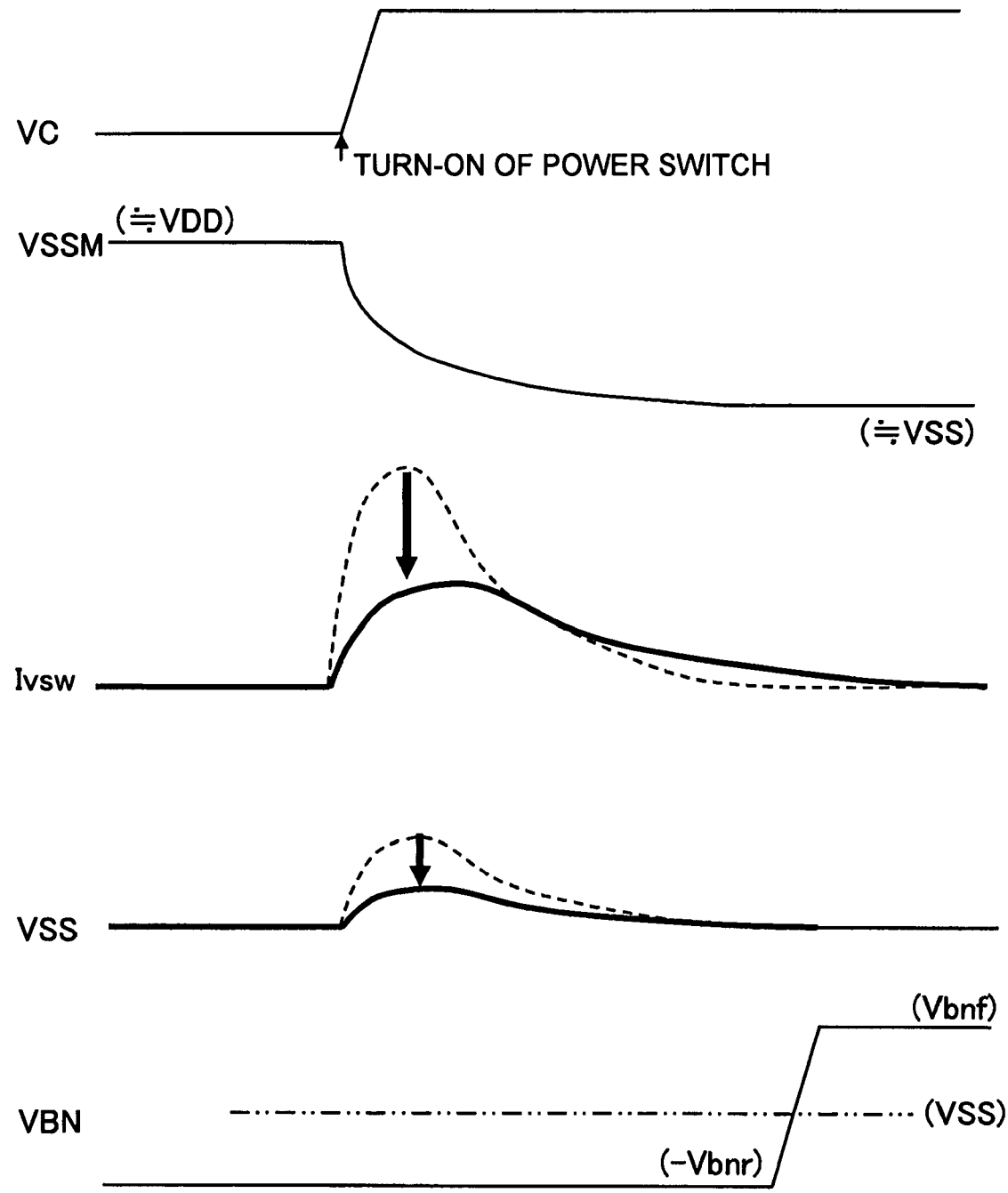
FIG. 35 is a waveform illustration exemplifying the relation between an inrush current at power-on and a reverse bias voltage to suppress the inrush current.

To suppress an inrush current at the time of resuming power supply, as exemplified in FIG. 35, it is proper that the threshold voltage is raised by applying a reverse bias voltage −Vbnr as a body bias voltage VBN when the power switch 10 is turned on (VC=C). As a result, the current Ivsw passing through the power switch 10 is made smaller because the power switch 10 has a larger ON-state resistance, and thus the rise of the ground line potential VSS can be suppressed. After that, the electric current feeding capability of the power switch 10 may be enhanced by applying a forward bias voltage Vbnf as the body bias voltage VBN. The broken lines in Ivsw and VSS of FIG. 35 represent a current wave form and a voltage wave form respectively when the body bias voltage VBN is fixed to the ground potential VSS, and each have a large peak.

Figure 36:
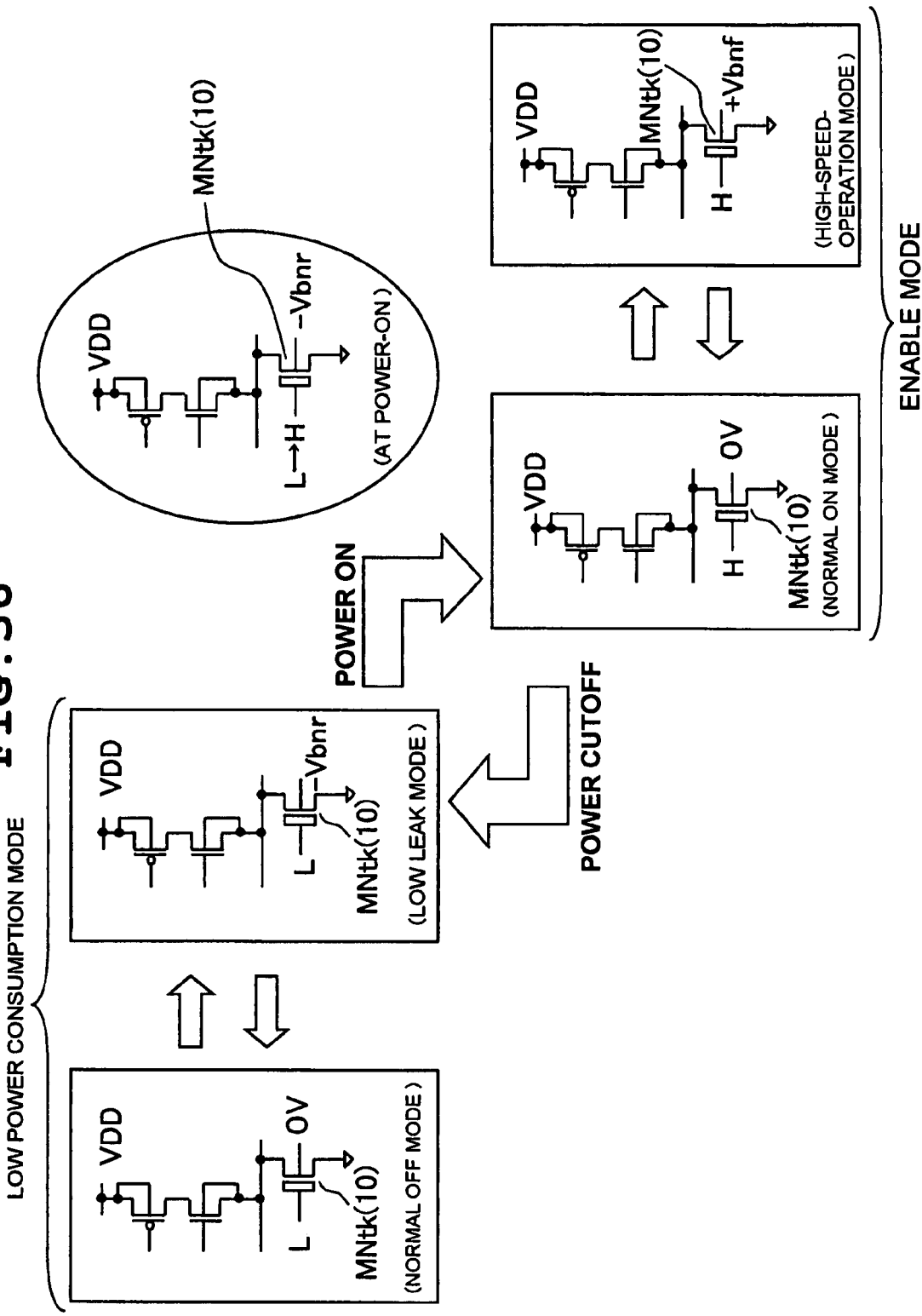
FIG. 36 is an explanatory view exemplifying a desirable form for controlling ON/OFF of a power switch and the body bias thereof.

Referring to FIG. 36, there is exemplified a desirable form for controlling ON/OFF of a power switch 10 and the body bias thereof. When a semiconductor integrated circuit 1 is in a low power consumption mode, the power switch 10 composed of an n-channel MOS transistor MNtn is turned off. Under the condition where the power switch 10 is in OFF state, in a normal OFF mode the body bias voltage VBN of the power switch 10 is a ground voltage VSS, and in a low leak mode the body bias voltage VBN of the power switch 10 is the reverse bias voltage −Vbnr.

When the power-supply-interruptible circuit is in an enable mode, the power switch 10 composed of an n-channel MOS transistor MNtk is turned on. Under the condition where the power switch 10 is in ON state, in a normal ON mode the body bias voltage VBN of the power switch 10 is the ground voltage VSS, and in a high-speed-operation mode the body bias voltage VBN of the power switch 10 is a forward bias voltage Vbnf. In the drawing, "L" means a Low level gate voltage that can bring the power switch 10 to OFF state, and "H" means a High level gate voltage that can bring the power switch 10 to ON state.

In the case where the power switch 10 is turned on in changeover of the power-supply-interruptible circuit from the low power consumption mode to the enable mode, the body bias voltage VBN of the power switch 10 is maintained at the reverse bias voltage −Vbnr. Then, after the switch has been turned on, the body bias voltage VBN is changed to the ground voltage VSS or forward bias voltage Vbnf. A power switch 10 composed of an n-channel MOS transistor MNtk does not have to have a special correlation between the turn-off timing and the body bias voltage in changeover from the enable mode to the low power consumption mode. Contrary to the case of an n-channel MOS transistor, as for a power switch 10 composed of a p-channel MOS transistor MPtk, which is not particularly shown in the drawing, a reverse bias voltage is applied to the power switch in turning the switch off, and the power switch does not have to have a special correlation between the turn-on timing and the body bias voltage when it is turned on.

Figure 37:
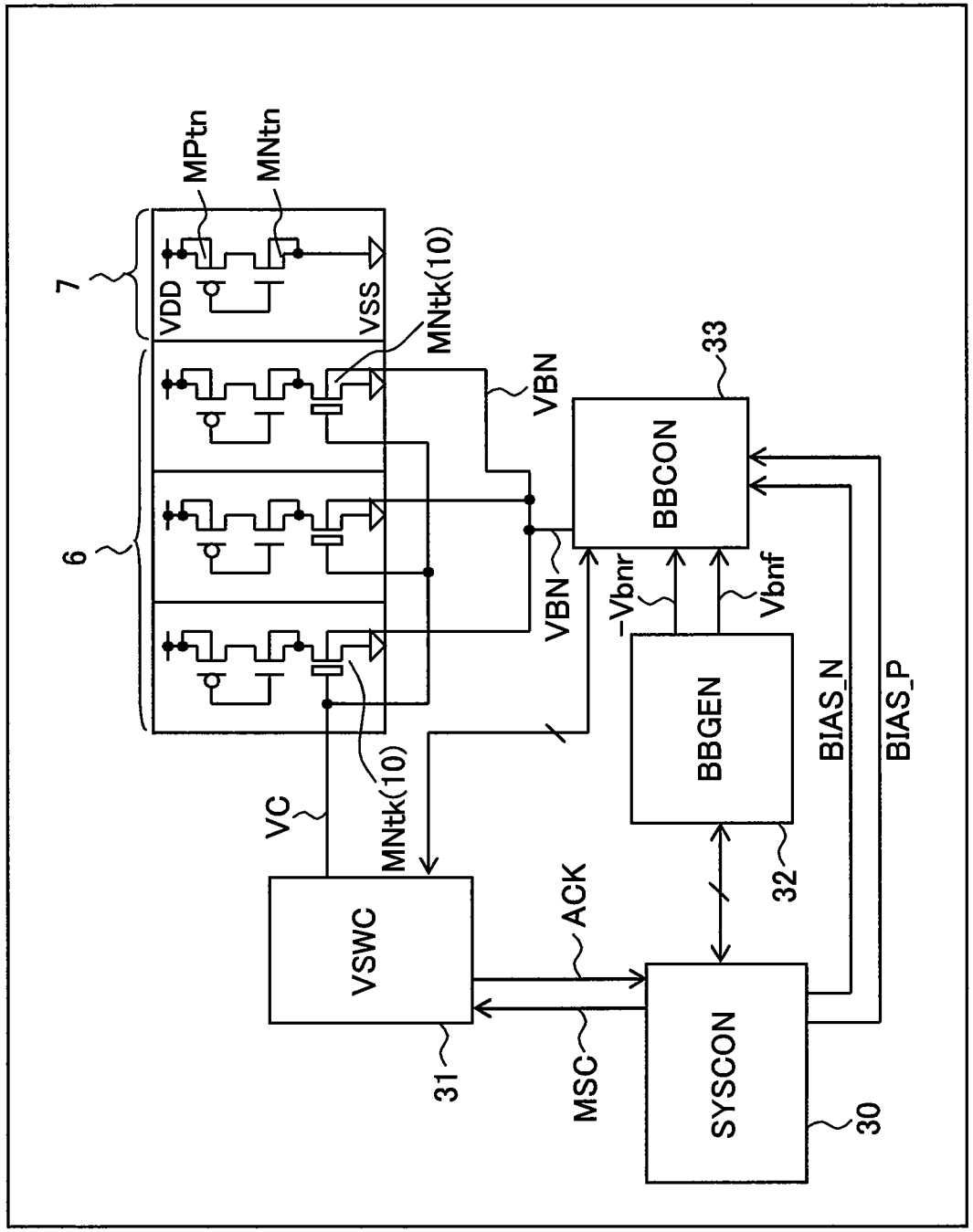
FIG. 37 is a block diagram generally showing a control circuit for power switches.
Figure 38:
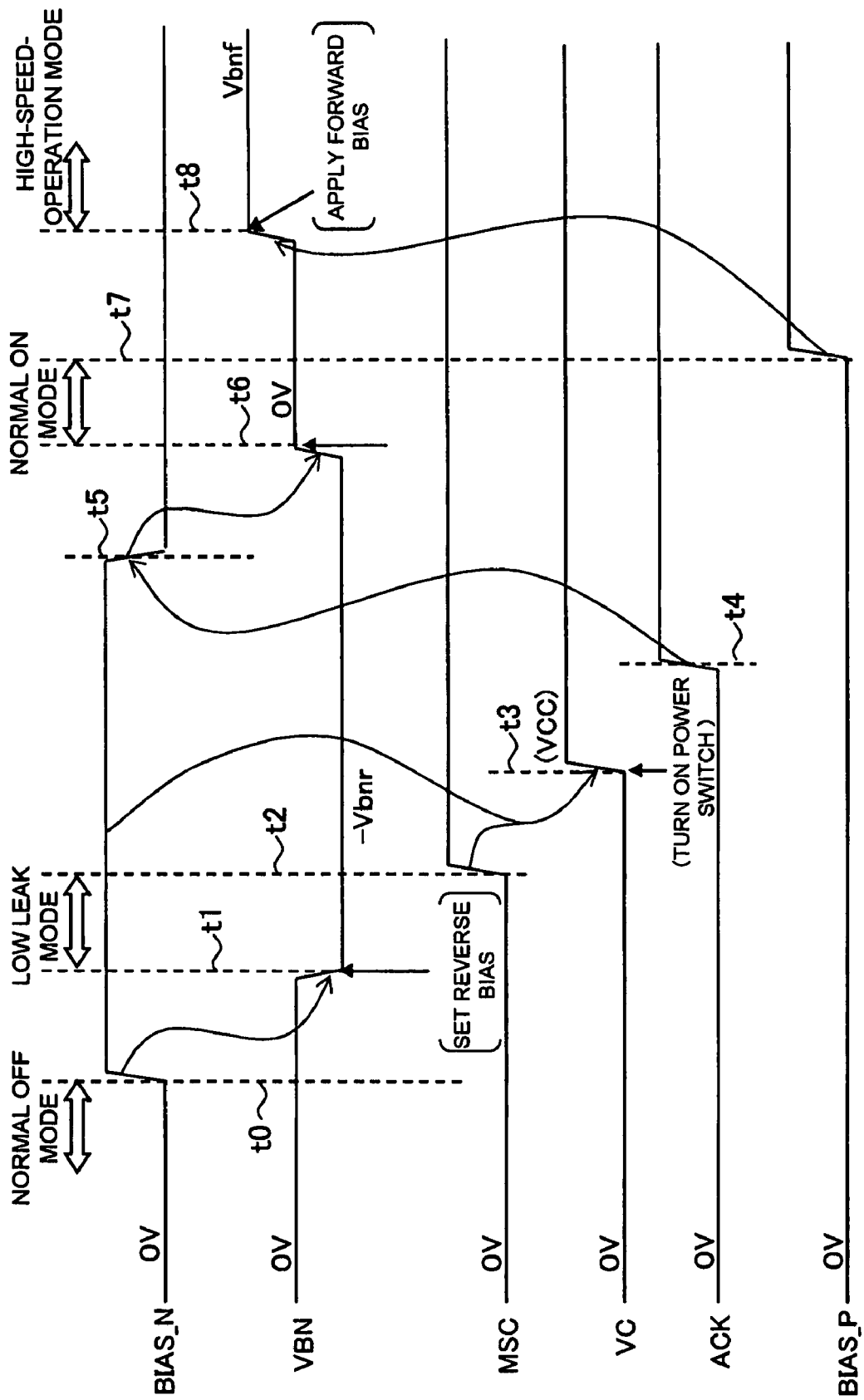
FIG. 38 is a timing chart exemplifying control sequence by the control circuit for the power switches.

A control circuit for the power switch is shown in FIG. 37 generally. FIG. 38 exemplifies a control sequence by the control circuit for the power switch. Here, the power switch 10 is composed of an n-channel MOS transistor MNtk.

The control circuit for the power switch includes: a system controller (SYSCON) 30; a power switch control circuit (VSWC) 31; a body bias generation circuit (BBGEN) 32; and a body bias control circuit (BBCON) 33. The body bias generation circuit (BBGEN) 32 generates a reverse bias voltage −Vbnr and a forward bias voltage Vbnf. The power switch control circuit (VSWC) 31 outputs a switch control signal VC for the power switch 10. The body bias control circuit 33 outputs a body bias voltage VBN. The system controller 30 outputs an operation instruction signal MSC for the power switch control circuit 31, and operation instruction signals BIAS_N and BIAS_P for the body bias control circuit 33 depending on the operation mode of the semiconductor integrated circuit. The signal MSC is used to direct an operation to turn on a power switch 10 in response to the enable mode with respect to a circuit of the power-supply-interruptible circuit 6, and used to direct an operation to turn off a power switch 10 in response to the low power consumption mode. The signal BIAS_N is used to direct body biasing by the reverse bias voltage −Vbnr in response to the low leak mode under the low power consumption mode. The signal BIAS_P is used to direct body biasing by the forward bias voltage Vbnf in response to the high-speed operation mode under the enable mode. Before the power switch 10 is turned on in transition from the low power consumption mode to the enable mode, the system controller 30 judges whether the power switch 10 is biased reversely. When the power switch 10 is not so biased, the system controller 30 uses the signal BIAS_N to have the power switch 10 biased reversely and then powers on the switch.

As in FIG. 38, in the normal OFF mode, when the signal BIAS_N is inverted into High level (at time t0), the body bias control circuit 33 responds to this event and changes the body bias voltage VBN from the ground level VSS (0V) to the reverse bias voltage −Vbnr (at Time t1), thereby bringing the power-supply-interruptible circuit 6 to the low leak mode. After that, when the system controller 30 accepts an interruption or the like thereby to recognize a direction to cancel the low power consumption mode, the system controller 30 inverts the signal MSC into High level (at Time t2), and makes the power switch control circuit 31 turn on the power switch 10 by the control signal VC (at Time t3). The voltage of the control signal VC is made an operation voltage VCC of an IO circuit, which is higher in level than the source voltage VDD of a logic circuit. At the time of resuming power supply at Time t3, since the power switch 10 is biased reversely and its threshold voltage is raised, the rise in the ground voltage by an inrush current is suppressed, whereby a malfunction in the power-supply-uninterrupted circuit is prevented. On receipt of an acknowledge signal ACK of resumption of power supply from the power switch control circuit 31 (at Time t4), the system controller 30 directs the body bias control circuit 33 to cancel the reverse biasing by the signal BIAS_N (at Time t5). Then the body bias control circuit 33 cancels the reverse biasing (at Time t6). Thus, the power-supply-interruptible circuit 6 is made operable in the normal ON mode. After that, when the system controller 30 accepts an interruption or the like thereby to recognize a direction for a high-speed operation, the system controller inverts the signal BIAS_P into High level (at Time t7), thereby forcing the body bias control circuit 33 to change the body bias signal BVN from the ground level VSS (0V) to the forward bias voltage Vbnf (at Time t8). Thus, the power-supply-interruptible circuit 6 is made operable in the high-speed operation mode. Now, between Time t5 and Time t6, the power-supply-interruptible circuit is put in a low-speed operation mode in which the operation speed is slower than in the normal ON mode. This low-speed operation mode can be positioned as a power-down mode in which the circuit is made operable so that low power consumption is given priority. Further, in the power-down mode, the switch control signal VC may be switched from a relatively higher voltage for an IO circuit to a relatively lower operating power source VDD for a core logic circuit.

While the invention by the inventor have been described specifically based on the embodiment above, it is not limited to the embodiments. It is needless to say that various changes and modifications may be made within a scope hereof without departing from the subject matter.

For example, the conductivity type of each power switch, the number of stages of a hierarchy of power switches, the number of MOS transistors and their layout in a primitive cell, etc. can be changed appropriately. The semiconductor integrated circuit can be applied extensively to not only digital processing LSIs typified by a microcomputer, but also an analog processing LSI, an analog-and-digital hybrid LSI, etc. The low power consumption mode may be e.g. a sleep mode in which transition is made when a CPU executes a sleep instruction, a standby mode in which transition is directed from the outside according to the setting of a register made by a standby signal, etc., and a module standby mode in which whether or not activation is allowed can be set for each module. The power switches may be constituted by only thick-film MOS transistors, or they may be constructed in a hierarchical form by appropriately mixing thin-film MOS transistors as lower hierarchical power switches. The lower hierarchical power switches are not limited so that they are composed of thin-film MOS transistors. As a matter of course, the lower hierarchical power switches may consist of thick-film MOS transistors.

2. Second Embodiment

Figure 39:
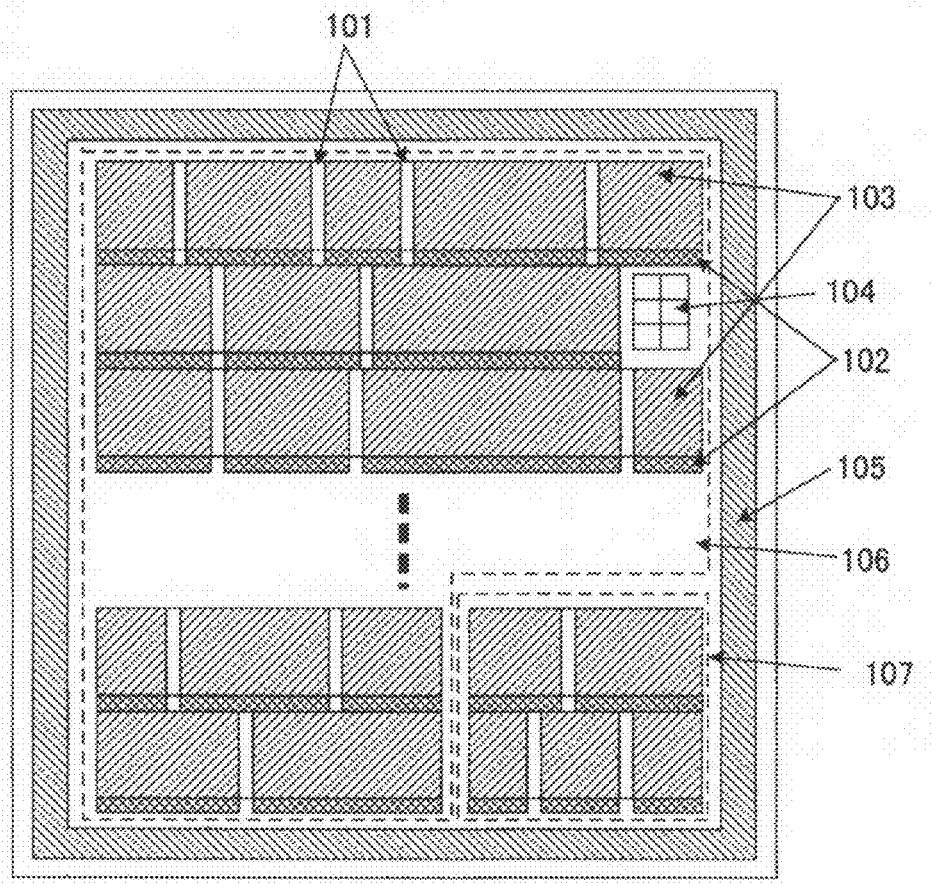
FIG. 39 is an explanatory view for a general layout of a chip in a microcomputer, which is an example of a semiconductor integrated circuit in association with the invention.

Referring to FIG. 39, there is shown a general layout of a chip in a microcomputer, which is an example of a semiconductor integrated circuit in association with the invention. While the microcomputer shown in FIG. 39 is not particularly limited, it takes an SOC (System On Chip) structure having a system constructed on a single semiconductor chip. The microcomputer includes a digital part 106 for handling a digital signal, and an analog part 107 for handling an analog signal. Further, the microcomputer has an IO (Input and Output) region 105 surrounding the digital and analog parts. In each of the digital part 106 and analog part 107, a plurality of cell regions 103 each having a plurality of core cells arranged therein are formed. Each cell region 103 is divided into power-supply-interruptible areas by a power source isolation region 101. Each power-supply-interruptible area has a power switch region 102 provided in an edge portion thereof. In the power switch region 102, a plurality of power switches that can cut off the supply of a low-potential-side power source Vss are formed for each power-supply-interruptible area. The operation of the power switches is controlled by a power source controller 104.

Now, the power switches in the power switch region 102 will be described in detail.

Figure 43:
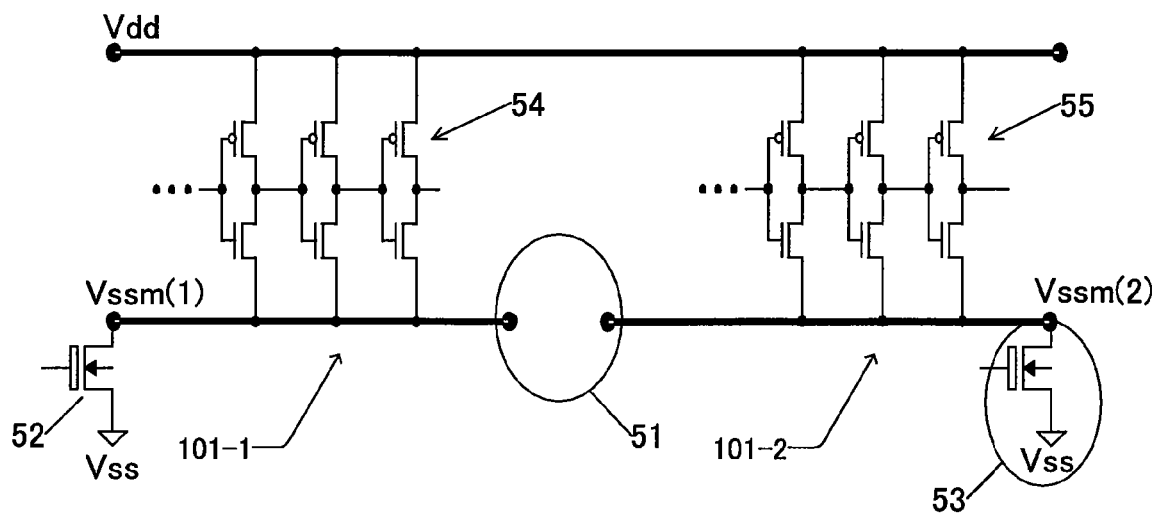
FIG. 43 is a circuit diagram showing an example of the arrangement of a principal portion in a cell region of the microcomputer.

A circuit arrangement of principal portions in each cell region 103 is shown in FIG. 43.

The low-potential-side power source line is separated into a low-potential-side power source Vssm(1) line and a low-potential-side power source Vssm(2) line at a separating portion 51, whereby a power-supply-interruptible area 81 and a power-supply-interruptible area 82 are formed. A high-potential-side power source Vdd line is shared by the power-supply-interruptible area 81 and power-supply-interruptible area 82. While the power-supply-interruptible area 81 is not particularly limited, it includes a plurality of inverters 54 coupled to the high-potential-side power source Vdd line and the low-potential-side power source Vssm(1) line. While the power-supply-interruptible area 82 is not particularly limited, it includes a plurality of inverters 55 coupled to the high-potential-side power source Vdd line and the low-potential-side power source Vssm(2) line. The low-potential-side power source Vssm(1) line is coupled to a low-potential-side power source Vss line through a power switch 52, and the low-potential-side power source Vssm(2) line is coupled to a low-potential-side power source Vss line through a power switch 53. The inverters 54 and 55 are each composed of a p-channel MOS transistor coupled to the high-potential-side power source Vdd line and an n-channel MOS transistor coupled to the low-potential-side power source Vssm(1) line or low-potential-side power source Vssm(2) line, and the p-channel and n-channel MOS transistors are connected in series with each other. The power switches 52 and 53 can be formed by n-channel MOS transistors.

In the above-described arrangement, when the power switch 52 is turned on, the low-potential-side power source Vssm(1) line is electrically connected to the low-potential-side power source Vss line, whereby the inverters 54 in the power-supply-interruptible area 81 are brought into their operable states. Likewise, when the power switch 53 is turned on, the low-potential-side power source Vssm(2) line is electrically connected to the low-potential-side power source Vss line, whereby the inverters 55 in the power-supply-interrupt-ible area 82 are brought into their operable states. In other words, the power source feeding to the power-supply-interruptible areas 81 and 82 can be cut off selectively by the power switches 52 and 53.

Figure 44:
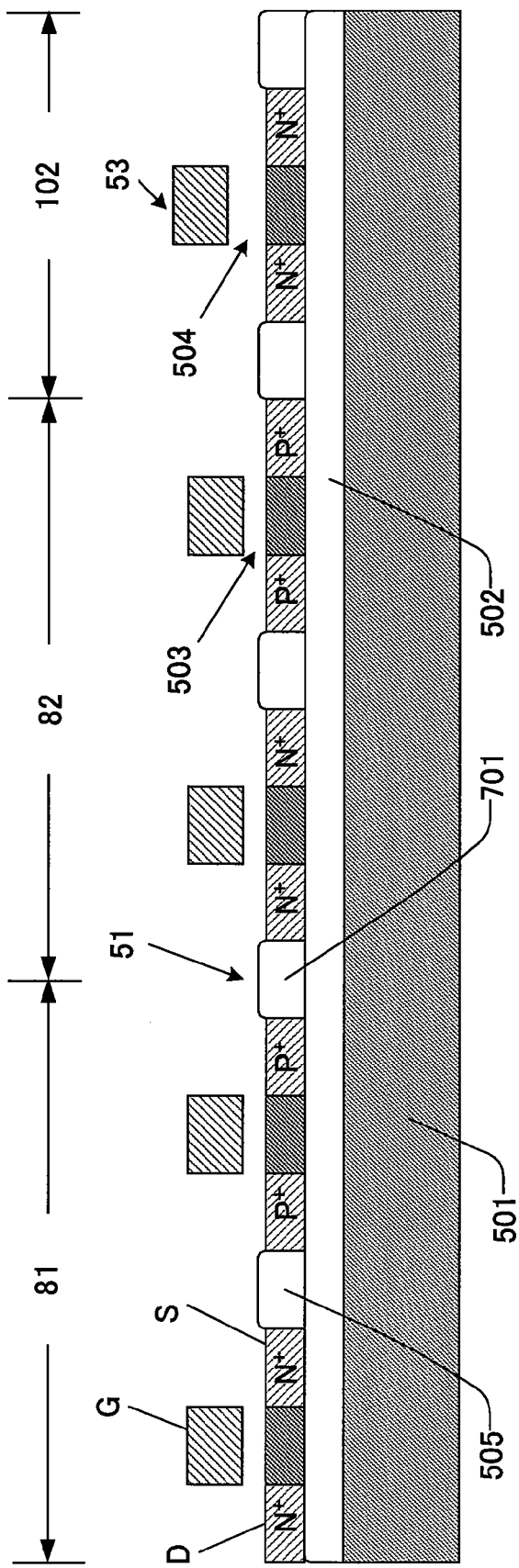
FIG. 44 is a sectional view of a principal portion in the circuit shown in FIG. 43.

The cross sectional structure of a principal portion of the circuit shown in FIG. 43 is shown in FIG. 44.

The structure shown in FIG. 44 is a so-called SOI (Silicon on Insulator) structure having an oxide layer (insulator film) 502 formed on a silicon substrate 501, an example of a semiconductor substrate. Isolation between the MOS transistors for forming the inverters 54, 55 and the MOS transistors for forming the power switches 52, 53 is made by an oxide layer 701 for power source isolation. Further, isolation between devices is made by an oxide layer 505 for device isolation. Incidentally, the power switch 52 is omitted in FIG. 44. MOS transistors for forming the inverters 54 and 55, and the power switches 52 and 53 each have: a drain electrode D and a source electrode S led out from diffusion layers(which are of $N^+$ or $P^+$ type); and a gate electrode G insulated by a gate oxide ($SiO_2$) layer 503 or 504. MOS transistors for forming the above-described power switches 52 and 53 are so-called high breakdown voltage MOS transistors, whose gate oxide layer 504 is thicker than the gate oxide layer 503 of MOS transistors forming the inverters 54 and 55.

According to such arrangement, the threshold value of MOS transistors forming the power switches 52 and 53 is relatively higher than that of a MOS transistor in the power-supply-interruptible areas 81 and 82. However, when the gate electrode of a MOS transistor constituting a power switch is supplied with a voltage relatively higher than the voltage level of the high-potential-side power source Vdd as High level voltage, the value of ON-state resistance of the power switch can be made smaller, and therefore the influence upon the Vdd operation margin is small. Now, in the case where imbalance arises in load capacitance between the low-potential-side power sources Vssm(1) and Vssm(2) depending on the size of the power-supply-interruptible areas 81 and 82, an arrangement may be made so that the rising waveforms can be uniformized by switching the driving powers of MOS transistors that form the power switches 52 and 53. Alternatively, he through rate may be controlled by applying a bias to a substrate thereby to raise or lower the threshold value Vth because of SOI structure.

Figure 45:
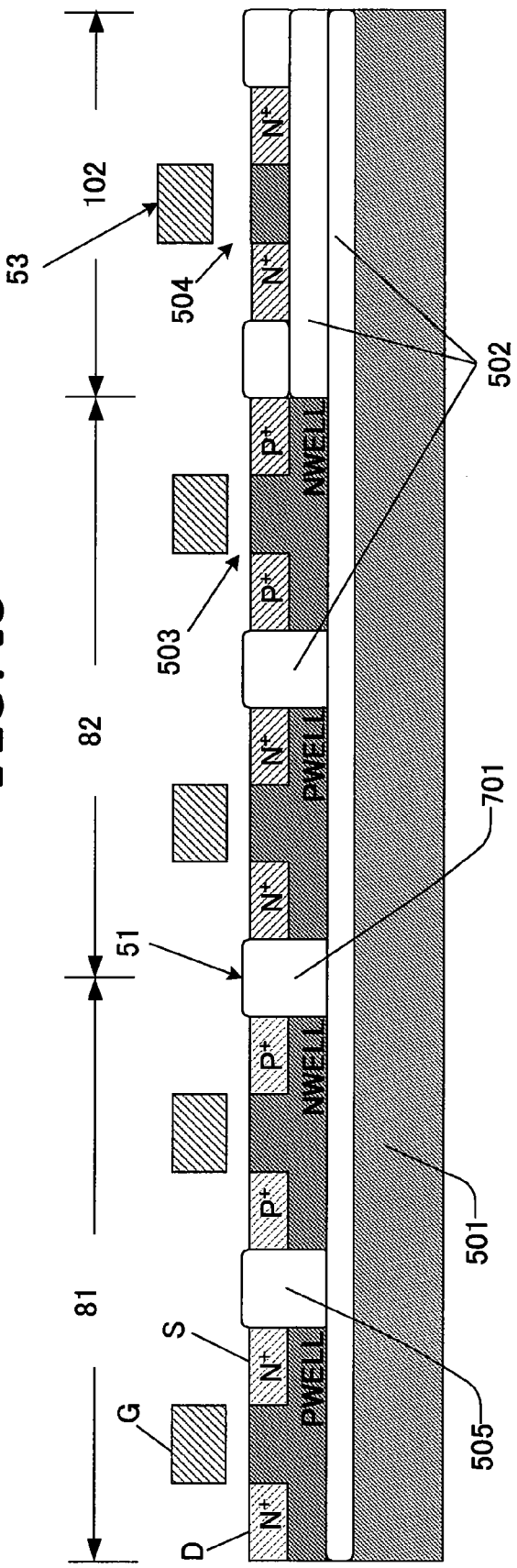
FIG. 45 is another sectional view of a principal portion in the circuit shown in FIG. 43.

Referring to FIG. 45, there is shown another cross sectional structure of a principal portion of the circuit shown in FIG. 43.

The structure shown in FIG. 45 is a mixture of SOI structure and Bulk structure. Specifically, as shown in FIG. 45, a p-type well (PWELL) and an n-type well (NWELL) are formed on an oxide layer 502 in power-supply-interruptible areas 81 and 82 in a portion of SOI structure. Then, an n-channel MOS transistor and a p-channel MOS transistor are formed in the p-type well (PWELL) and n-type well (NWELL) (in a portion of Bulk structure). The SOI structure is adopted for the power switch 53 (the power switch 52 is not shown) as shown in FIG. 44. As for the structure shown in FIG. 45, Bulk structure is adopted in addition to SOI structure. Therefore, the structure brings about the following advantages. A substrate with a lower resistance can be obtained, which enables sufficient power supply to the substrate and which reduces a parasitic device component. Further, Bulk structure eliminates the apprehension about electric charging up of the substrate owing to a large amount of current and avoids reduction in current owing to a self-heating phenomenon.

Figure 46:
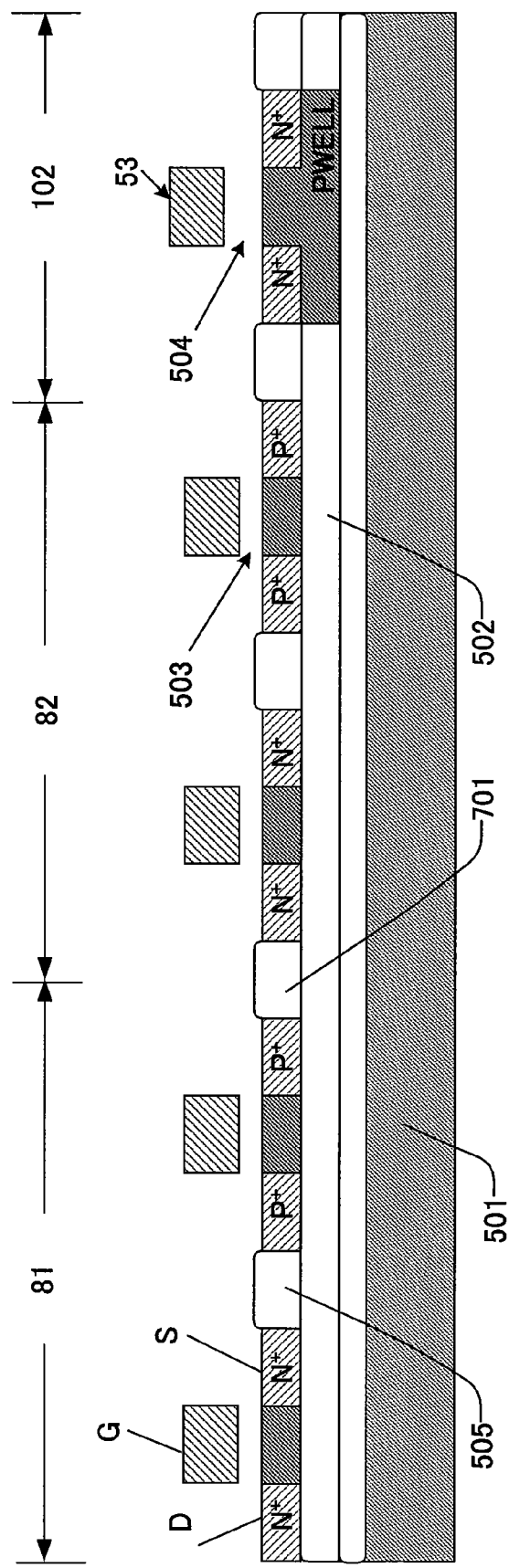
FIG. 46 is another sectional view of a principal portion in the circuit shown in FIG. 43.

Referring to FIG. 46, there is shown another cross sectional structure of a principal portion of the circuit shown in FIG. 43.

The structure shown in FIG. 46 is a mixture of SOI structure and Bulk structure. The SOI structure is adopted for power-supply-interruptible areas 81 and 82 and Bulk structure is adopted for a power switch region 102. Specifically, as for the power switch region 102, a p-type well (PWELL) is formed on an oxide layer 502 in SOI structure, and an n-channel MOS transistor is formed in the well.

Figure 47:
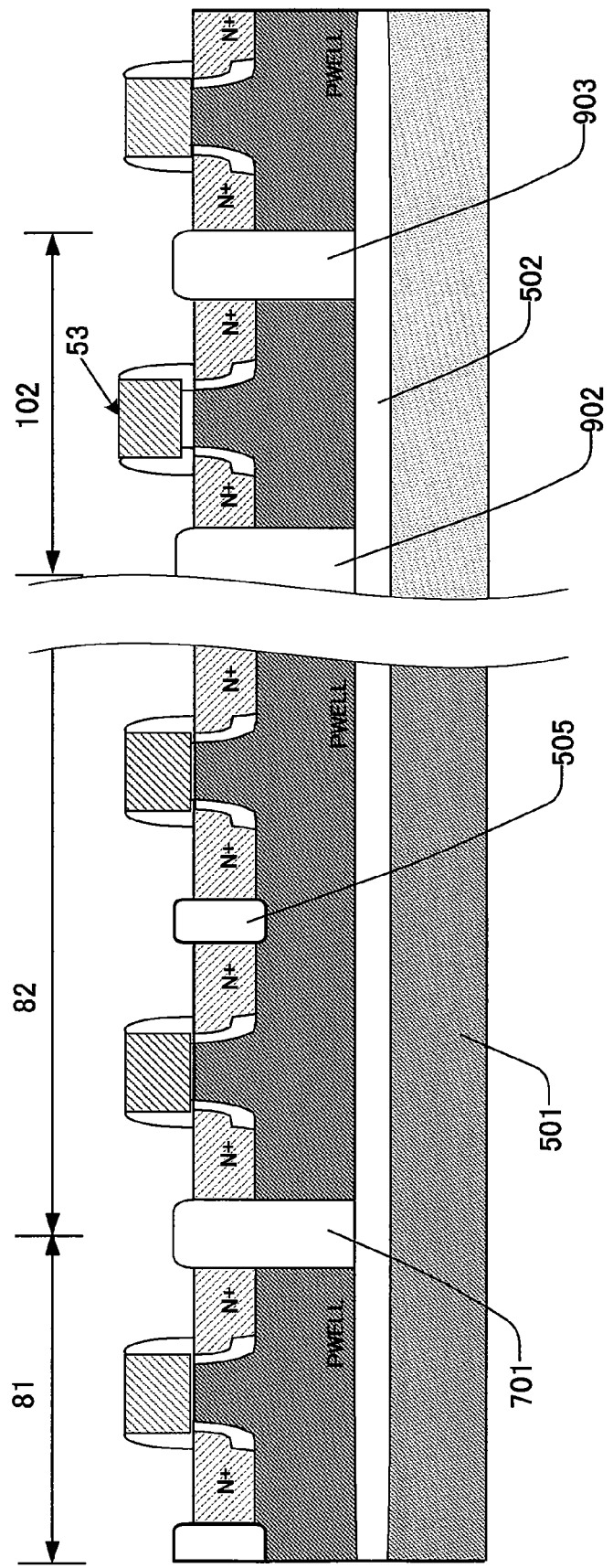
FIG. 47 is another sectional view of a principal portion in the circuit shown in FIG. 43.

Referring to FIG. 47, there is shown another cross sectional structure of a principal portion in the circuit shown in FIG. 43.

The structure shown in FIG. 47 is a mixture of SOI structure and Bulk structure. An oxide layer 502 is formed on a silicon substrate 501, on which p-type wells (PWELL) are formed. In this case, isolation between devices is performed by an oxide layer 505 for device isolation. In addition, isolation between the p-type wells is performed by an oxide layer 701 for power source isolation corresponding to the separating portion 51. Further, for a power switch region 102, the p-type well is separated by oxide layers 902, 903 for power source isolation.

Figure 48:
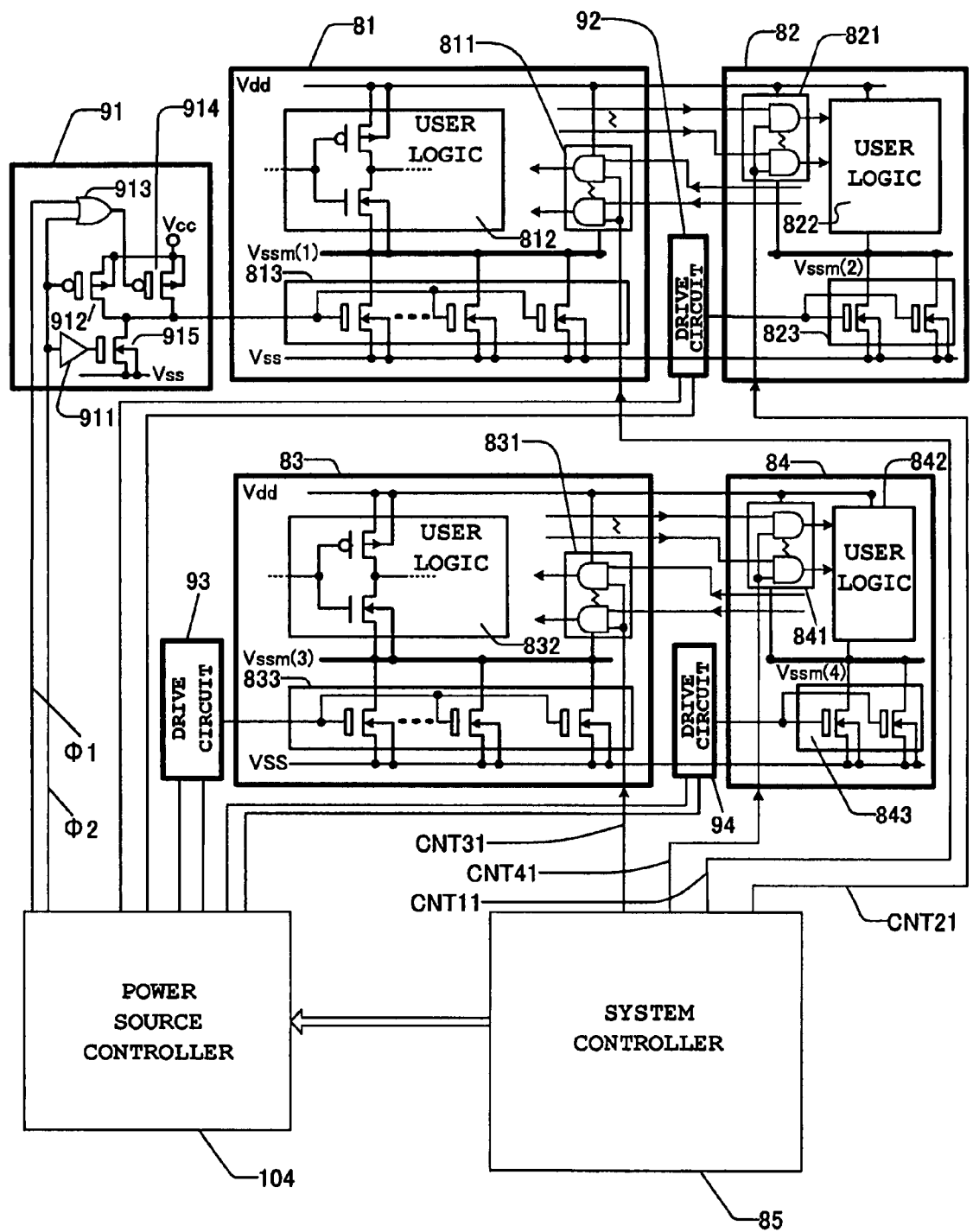
FIG. 48 is a circuit diagram showing an example of arrangement of a principal portion shown in FIG. 39.

Referring to FIG. 48, there is shown details of the arrangement of principal portions in FIG. 39.

At least one of the cell regions 103 shown in FIG. 39 includes power-supply-interruptible areas 81-84 and drive circuits 91-94. The latter drive circuits are controlled at a potential higher than the core system power source Vdd. A power source circuit for the drive circuits may be located in the vicinity of the interruptible area.

The power-supply-interruptible areas 81 and 82 are arranged so that a signal can be exchanged therebetween. Also, the power-supply-interruptible areas 83 and 84 are arranged so that a signal can be exchanged therebetween. The power-supply-interruptible area 81 includes: a user logic 812; a power switch 813 which enables feeding of power source to the user logic 812 and cutoff of the power source; and an anti-unstable propagation circuit 811 for eliminating unstable logic propagation from the power-supply-interruptible area 82. The power-supply-interruptible area 82 includes: a user logic 822; a power switch 823 which enables feeding of power source to the user logic 822 and cutoff of the power source; and an anti-unstable propagation circuit 821 for eliminating unstable logic propagation from the power-supply-interruptible area 81. The power-supply-interruptible area 83 includes: a user logic 832; a power switch 833 which enables feeding of power source to the user logic 832 and cutoff of the power source; and an anti-unstable propagation circuit 831 for eliminating unstable logic propagation from the power-supply-interruptible area 84. While the anti-unstable propagation circuits 811, 821, 831, and 841 are not particularly limited, the circuits are formed by two-input AND gates. The system controller 85 transmits control signals CNT11, CNT21, CNT31 and CNT41 to one input terminals of the two-input AND gates in the anti-unstable propagation circuits 811, 821, 831, and 841, and thus the operations of the corresponding anti-unstable propagation circuits 811, 821, 831, and 841 are controlled. When the control signals CNT11, CNT21, CNT31, and CNT41 are active, the corresponding anti-unstable propagation circuits 811, 821, 831, and 841 are activated, and a signal is transmitted between the relevant power-supply-interruptible areas. However, when the control signals CNT11, CNT21, CNT31, and CNT41 are inactive, the corresponding anti-unstable propagation circuits 811, 821, 831, and 841 are fixed in output logic. The power source controller 104 controls the operation of the drive circuits 91-94 under the control of the system controller 85. The operation control for the anti-unstable propagation circuits 811, 821, 831, and 841 is interlocked with the operation control for the power switches, whereby unstable logic propagation owing to cutoff of power source in the respective power-supply-interruptible areas 81-84 is eliminated. The power source controller 104 supplies the drive circuits 91-94 with two-bit digital control signals respectively. Thus, it becomes possible to control the operation of each power switch. As for the power-supply-interruptible areas 81-84, a steep change in current owing to the turn-on of the power switches 813, 823, 833, and 843 is undesirable because it can produce noises. Hence, the drive circuits 91-94 converts a two-bit digital control signal from the power source controller 104 into an quasi-analog signal, and changes the conducting state of the corresponding power switches 813, 823, 833, and 843 stepwise to control the through rate, thereby avoiding the steep change in current. The drive circuits 91-94 are identical with each other in their configuration essentially. Therefore, detailed description on only the drive circuit 91 will be presented here.

The drive circuit 91 includes: a buffer 911; an n-channel MOS transistor 915; p-channel MOS transistors 912 and 914; and two-input OR gate 913. The driving power of the n-channel MOS transistor 912 is relatively smaller, and the driving power of the n-channel MOS transistor 914 is set so as to be larger than that of the n-channel MOS transistor 912. The p-channel MOS transistors 912 and 914 are connected in parallel with each other, and the combination of the MOS transistors 912 and 914 thus connected is connected in series with the n-channel MOS transistor 915. The operation of the power switch 813 in the power-supply-interruptible area 81 is controlled by an output signal from the node of this series connection. The source electrode of the p-channel MOS transistor 914 is coupled to a high-potential-side power source Vcc, whereas the source electrode of the n-channel MOS transistor 915 is coupled to a low-potential-side power source Vss. Here, the voltage level of the high-potential-side power source Vcc is set so as to be higher than that of the high-potential-side power source Vdd. The operation of the p-channel MOS transistor 912 is controlled by a switch-driving signal φ2 from the power-source control circuit 104. The OR gate 913 offers a NOR logic of switch-driving signals φ1 and φ2 from the power-source control circuit 104, and its logic output is used to control the operation of the p-channel MOS transistor 914 having a driving power larger than that of the MOS transistor 912.

According to the above-described arrangement, in the condition where the power source controller 104 keeps switch-driving signals φ1 and φ2 at High level, the p-channel MOS transistors 912 and 914 are in OFF states, and the n-channel MOS transistor 915 is in ON state. Thus, the power switch 813 is in a non-conducting state.

In the condition where the power source controller 104 keeps a switch-driving signal φ1 at High level and a switch-driving signal φ2 at Low level, the p-channel MOS transistor 912 is in ON state, whereas the p-channel MOS transistor 914 and n-channel MOS transistor 911 are in OFF state. As the driving power of the n-channel MOS transistor 912 is relatively smaller, the n-channel MOS transistor 912 cannot bring the power switch 813 to full conduction, and therefore the transistor 912 makes the power switch move to such state slowly.

Next, when the power source controller 104 changes both the switch-driving signals φ1 and φ2 to Low level, the p-channel MOS transistor 914 is turned on in addition to the p-channel MOS transistor 912. As the p-channel MOS transistor 914 has a sufficient driving power, it can bring the power switch 813 to full conduction. After the MOS transistor 914 has been turned on, the normal operation of the core 81 is allowed.

When the p-channel MOS transistors 912 and 914 are turned on in sequence in this way, the conducting state of the power switch 813 is changed stepwise and as such, a steep change in current can be avoided. Thus, it becomes possible to suppress generation of noises owing to the steep change in current.

While a digital signal is transmitted between the power-source control circuit 104 and the drive circuits 91-94, a quasi-analog signal for changing the conducting state of the power switch 813 stepwise is transmitted between the drive circuits 91-94 and the corresponding power switches 813, 823, 833, and 843. When a noise component is superposed on the quasi-analog signal, the noise component affects the operation of the power-supply-interruptible area 81. As a measure to avoid such superposition of a noise component, it is possible to shield a signal line. However, in this example is taken a measure to lay out the drive circuits 91-94 in the vicinities of the corresponding power switches 813, 823, 833, and 843 thereby to make the lengths of analog signal transmission paths between the drive circuits 91-94 and the corresponding power switches 813, 823, 833, and 843 as short as possible. Thus, superposition of noise on the quasi-analog signal is avoided.

Figure 49:
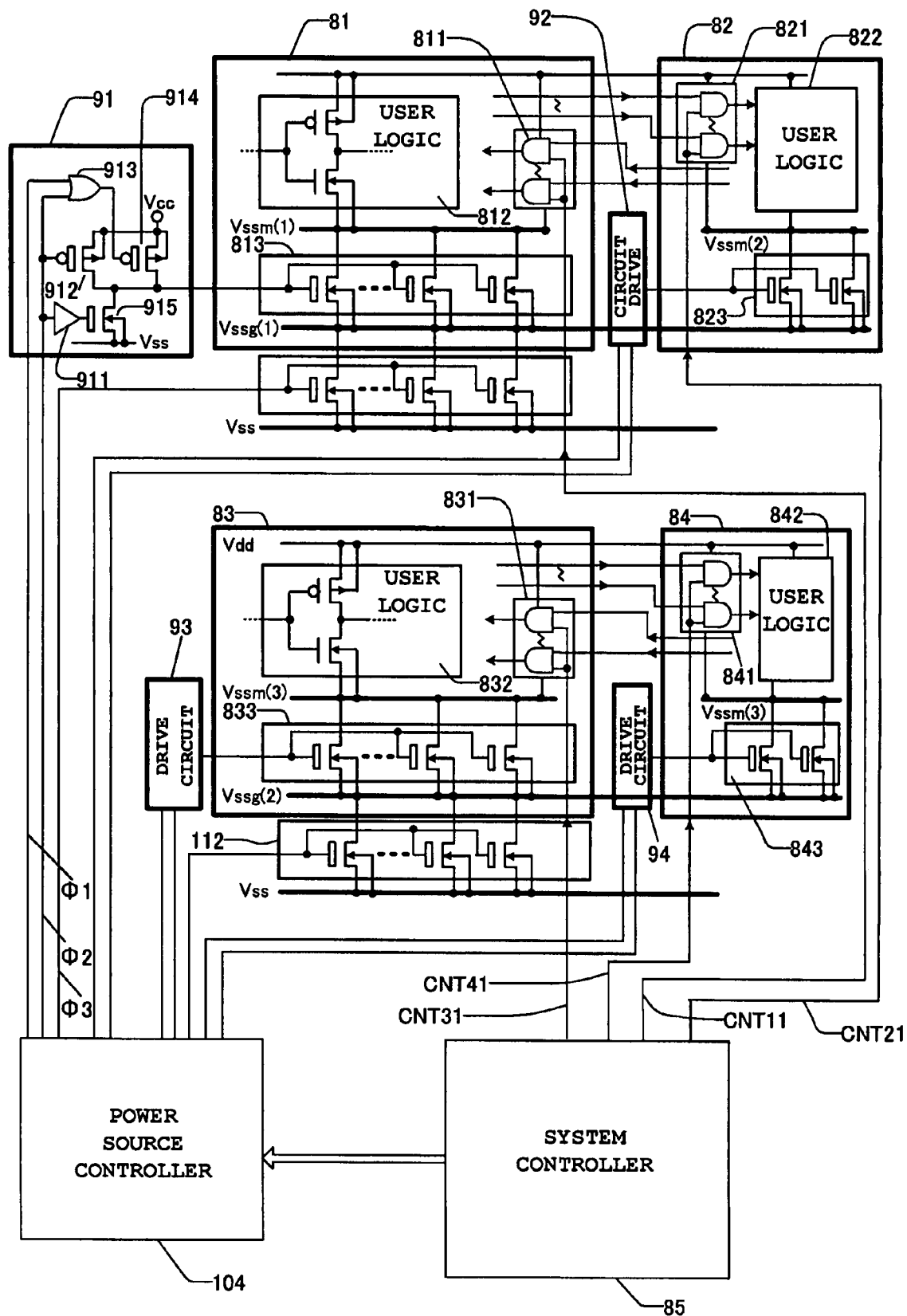
FIG. 49 is a circuit diagram showing another example of arrangement of a principal portion shown in FIG. 39.

Referring to FIG. 49, there is shown another arrangement of the principal portion shown in FIG. 39.

The arrangement shown in FIG. 49 widely differs from the arrangement shown in FIG. 48 in that power switches 111 and 112 are provided. Power switches 813 and 823 are connected to a low-potential-side power source Vssg(1) line in common. The low-potential-side power source Vssg(1) line is coupled to the low-potential-side power source Vss line through the power switch 111. The operation of the power switch 111 is controlled by a switch-driving signal φ3 from the power switch controller 104. The power switch 111 is located in a higher stage of the power switch hierarchy in comparison to the power switches 813 and 823. When the power switch 112 is turned off, power source feeding to the power-supply-interruptible areas 83 and 84 can be cut off at a time. In this case, thick-film MOS transistors small in leak current are used for the power switches 813, 823, 833, and 843, and 111 and 112. Also, it is adequate to use thin-film MOS transistors for the power switches 813, 823, 833, and 843, and thick-film MOS transistors for the power switches 111 and 112. The latter case offers the following advantages. That is, while the thick-film MOS transistors are utilized for cutoff of power source when regions are brought to deep standby collectively, the power switches composed of thin-film MOS transistors can be built in the respective core regions without selecting locations unlike thick-film transistors, and their gate voltages can be controlled by a core power source Vdd because of their low threshold values Vth.

The power switches 833 and 843 are connected to a low-potential-side power source Vssg(2) line in common. The low-potential-side power source Vssg(2) line is coupled to the low-potential-side power source Vss line through the power switch 112. The power switch 112 is located in a higher stage of the power switch hierarchy in comparison to the power switches 833 and 843. When the power switch 112 is turned off, power source feeding to the power-supply-interruptible areas 83 and 84 can be cut off at a time.

Power switches based on SOI technique, such as the power switches 52 and 53 shown in FIGS. 43-46, can be used for the power switches 813, 823, 833, 843, 111, and 112 shown in FIGS. 48 and 49.

The above examples can achieve the following effects and advantages.

(1) The power-supply-interruptible areas 81-84, and power switches 52 and 53 are insulated by an oxide layer from the silicon substrate 501, which leads to enhancement of the flexibility of selecting the places where the power source isolation region 101 and power switches 52, 53, 813, 823, 833, and 843 are formed and therefore makes possible to form the power source isolation region 101 and power switches 52, 53, 813, 823, 833, and 843 in arbitrary places. As a result, the changes of the size of the power-supply-interruptible areas 81-84 and a logical area targeted for cutoff of power source can be made easily.

(2) The effect and advantage stated in (1) allow a power-supply-interruptible area to be set appropriately.

(3) As Bulk structure is adopted in addition to SOI structure in the case of the structure shown in FIG. 7, the resistance of a substrate can be lowered sufficiently and enough electric power feeding can be performed and thus a parasitic device component is small. In addition, Bulk structure offers the following advantages: the apprehension about electric charging up of the substrate owing to a large amount of current is eliminated; and the reduction in current owing to a self-heating phenomenon is avoided.

(4) The drive circuits 91-94 convert a two-bit digital control signal from the power source controller 104 into a quasi-analog signal and changes the conducting states of the corresponding power switches 813, 823, 833, and 843 stepwise, thereby to avoid the steep change in current. In this case, the drive circuits 91-94 are laid out in the vicinities of the corresponding power switches 813, 823, 833, and 843, thereby making the length of analog signal transmission paths between the drive circuits 91-94 and power switches 813, 823, 833, and 843 as short as possible. Thus, it becomes possible to avoid superposition of noise on the quasi-analog signal.

Figure 40:
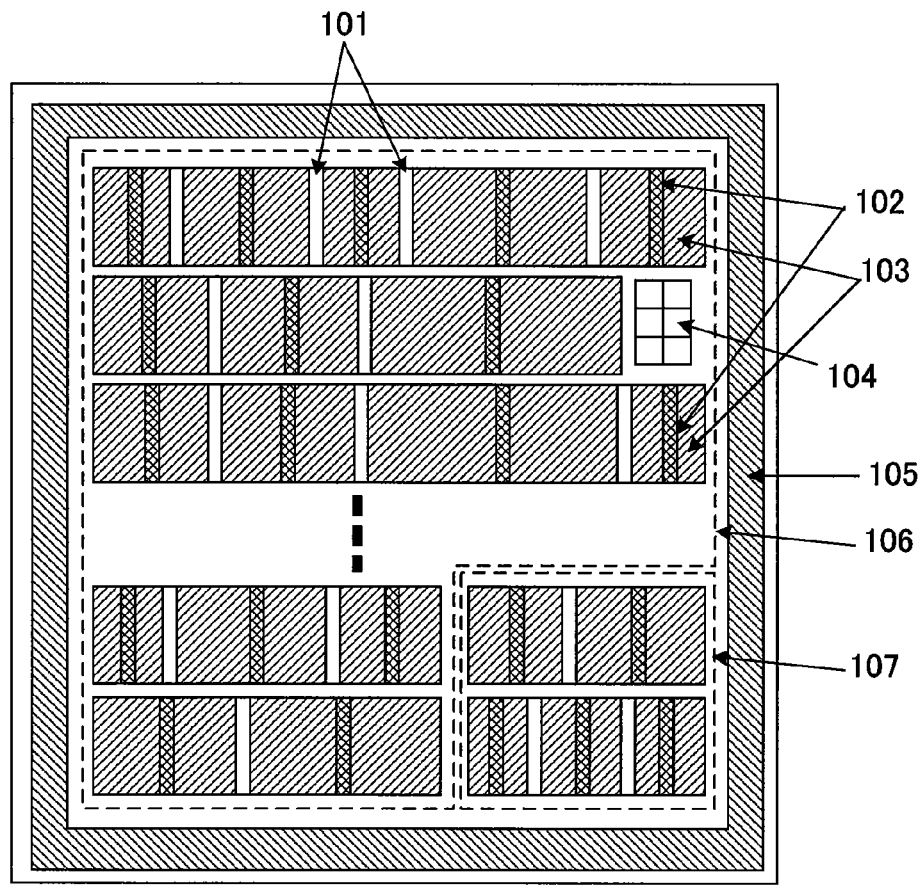
FIG. 40 is an explanatory view for another layout of a chip in the microcomputer.

Referring to FIG. 40, there is shown another layout of a chip in a microcomputer, which is an example of a semiconductor integrated circuit in association with the invention.

The microcomputer shown in FIG. 40 widely differs from that shown in FIG. 39 in that a power switch region 102 is provided in a center portion of each cell region 103. Also, in the case where a power switch region 102 is formed in a center portion of each cell region 103 like this, the same effects and advantages as those achieved in the case shown in FIG. 39 can be obtained.

In the power switch region 102, a plurality of power switches can be placed hierarchically.

Figure 41:
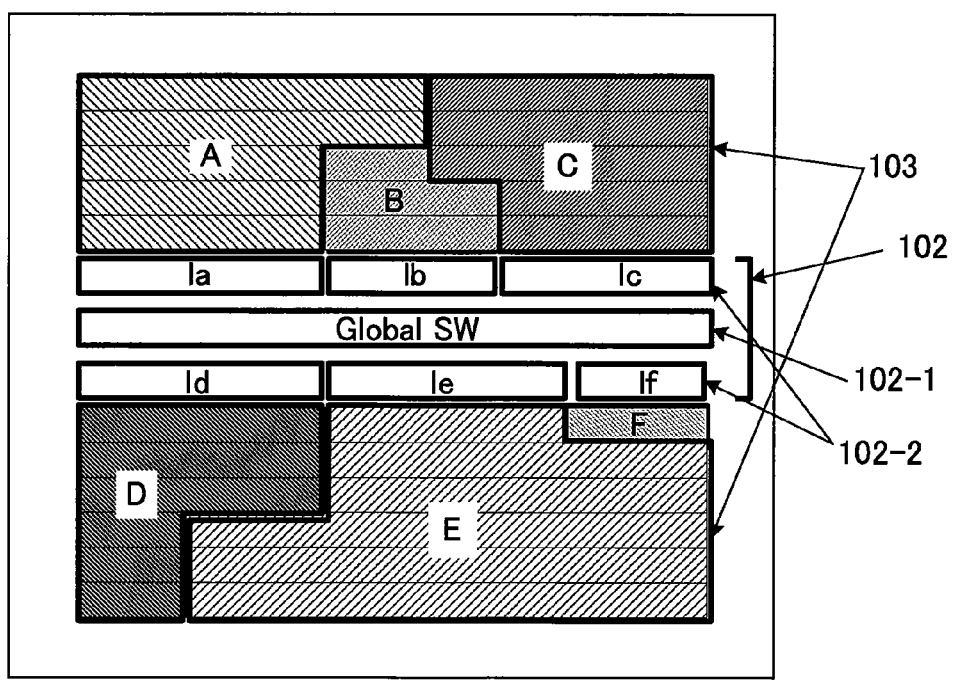
FIG. 41 is an explanatory view of hierarchical layout of power switches that the microcomputer includes.
Figure 42:
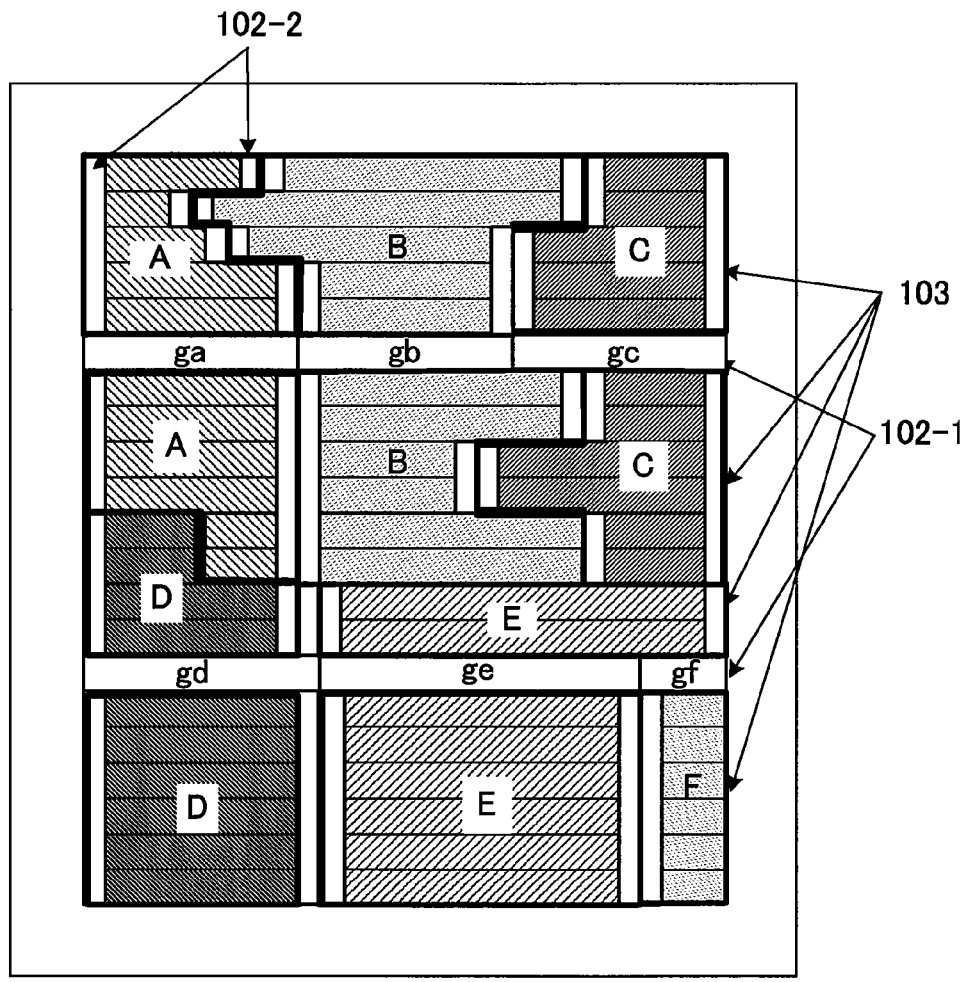
FIG. 42 is an explanatory view of hierarchical layout of power switches that the microcomputer includes.

Examples where the power switches are placed hierarchically are shown in FIGS. 41 and 42.

For example, here is considered the case where a cell region 103 is divided into power-supply-interruptible areas A-F, as shown in FIG. 41. The power source feeding to the power-supply-interruptible areas A-F can be cut off by the respective power switches. In a center portion of the cell region 103 is formed a power switch region 102. The power switch region 102 includes a global region 102-1 and local regions 102-2. The local regions 102-2 are formed so that the global region 102-1 is sandwiched therebetween. In the global region 102-1, a power switch (Global SW) in a hierarchically higher stage in comparison to the local regions 102-2 is formed. In the local regions 102-2, power switches 1*a*-1*f* in a hierarchically lower stage in comparison to the power switch (Global SW) in the global region 102-1 are formed. The power switch (Global SW) in the global region 102-1 can stop the feeding of low-potential-side power source Vss to the power switches 1*a*-1*f* in the local regions 102-2.

Alternatively, it is possible to distribute global regions 102-1 and local regions 102-2 within a cell region 103 as shown in FIG. 42. Specifically, when the cell region 103 is divided into a plurality of power-supply-interruptible areas A-F, global regions 102-1 and local regions 102-2 are formed in edge portions of the power-supply-interruptible areas A-F. In the global regions 102-1 are formed power switches ga-gf in a hierarchically higher stage in comparison to switches in local regions 102. In the local regions 102-2, power switches in hierarchically lower stage in comparison to the power switches in the global regions 102-1.

As for the arrangements shown in FIGS. 41 and 42, the power switches can be laid out in a lower layer in comparison to the layer for a signal line. Therefore, the influence of the area that the power switches occupy on the chip size is small.

Figure 50:
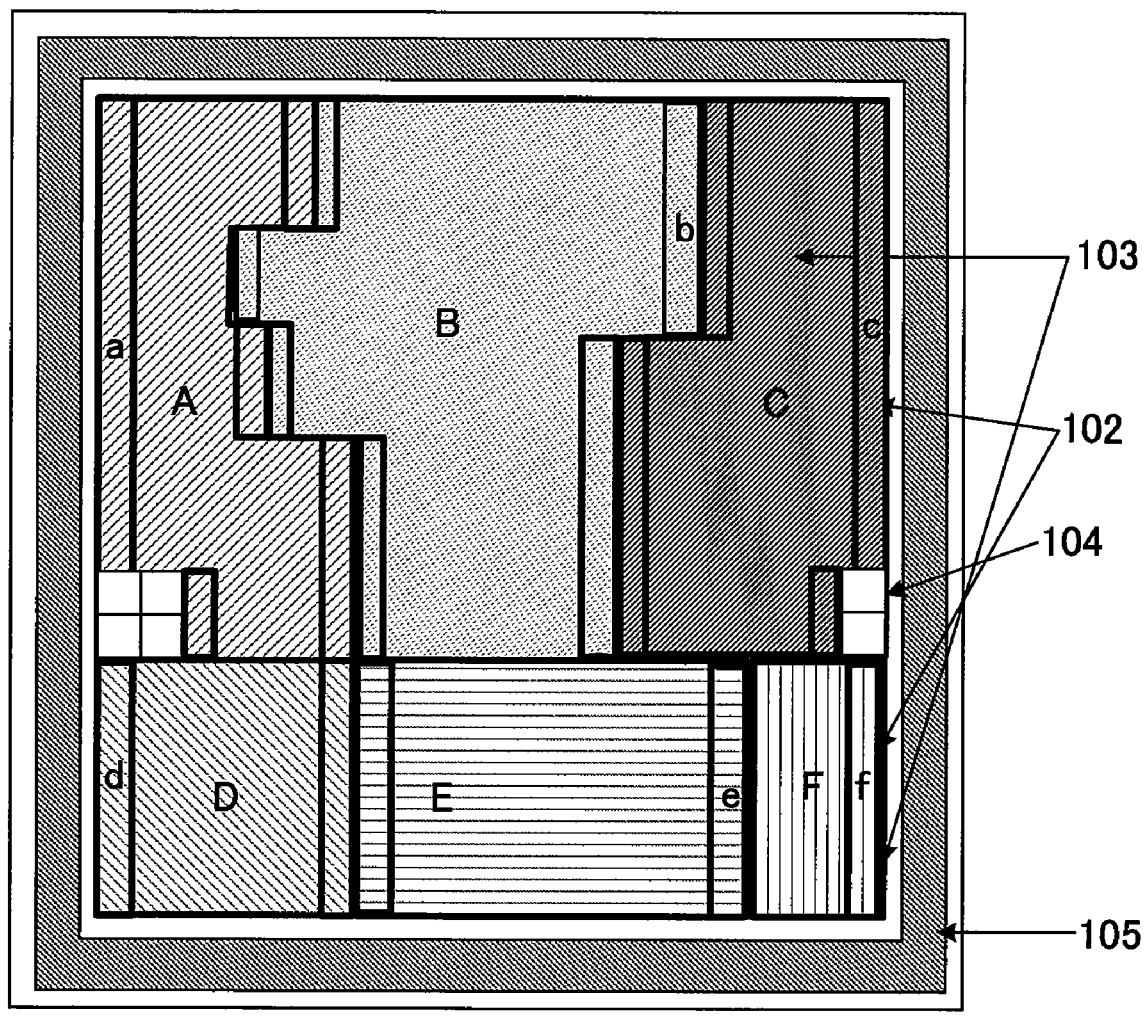
FIG. 50 is an explanatory view for another layout of a chip in the microcomputer.

Now, in the case where the width of the power-supply-interruptible areas is relatively wider as shown by A-E in FIG. 50, power switch regions 102 (a-e) may be formed on two sides of an area in question for the purpose of preventing a voltage drop in the area. Now, in regard to a power-supply-interruptible area with a narrow width, a power switch region 102 (f) may be formed only on one side of an area in question, as shown by F in FIG. 50. This is because in such case, the wiring resistance of virtual ground lines (second low-potential-side power source lines) such as Vssm(1)-Vssm(4) is small. Take into account noises, it is desired that the drive circuit be located near a region targeted for cutoff of power source. However, it is needless to say that the drive circuit may be laid out in a distant place as long as the drive circuit undergoes neither shielding nor coupling as described above. In the case of laying out the drive circuit in a distant place, there is the advantage that the increase in parasitic wiring resistance and parasitic wiring capacitance reduces the through rate.

It is needless to say that the invention typified by the second embodiment is not limited the descriptions presented above, and various changes and modifications may be made without departing the subject matter of the invention. For instance, the arrangement of drive circuits and hierarchical power switches is not limited to SOI structure.

In the above descriptions, the invention has been explained primarily focusing on the case where the invention is applied to a microcomputer formed on a semiconductor chip according to SOC, which is an applicable field of the invention, i.e. a background hereof. However, the invention is not limited to the descriptions, and it can be applied to various kinds of semiconductor integrated circuits widely.

What is claimed is:

1. A semiconductor integrated circuit, comprising:
a substrate with an insulating thin film thereon;
first MOS transistors each having a source, a drain, and a body on the insulating thin film of the substrate, a gate isolation film on the body, and a gate on the gate isolation film; and
second MOS transistors each having a source, a drain, and a body on the insulating thin film of the substrate, a gate isolation film on the body, and a gate on the gate isolation film, the first MOS transistors having gate isolation films thicker than those of the second MOS transistors; and
a power-supply-interruptible circuit and a power-supply-uninterrupted circuit, which are constituted by the first and second MOS transistors and mixed and laid out in a region for circuit formation of the integrated circuit,
wherein the power-supply-interruptible circuit has the first MOS transistors each constituting a power switch, and the second MOS transistors each connected in series with the power switch between source and ground lines,
the power-supply-uninterrupted circuit has a plurality of the second MOS transistors in series between the source and ground lines, and
a gate control signal for the first MOS transistors each constituting a power switch is made larger in amplitude than a gate control signal for the second MOS transistors.

2. The semiconductor integrated circuit of claim 1, further comprising a control circuit composed of a power-supply-uninterrupted circuit in a circuit region of the integrated circuit,
wherein the control circuit controls a part or all of the first MOS transistors each constituting a power switch to an OFF state in a predetermined low power consumption mode, and
the control circuit controls the first MOS transistor constituting a power switch, which has been turned off in the predetermined low power consumption mode, to an ON state in response to cancel of the low power consumption mode.

3. The semiconductor integrated circuit of claim 2, wherein the control circuit controls a body of the first MOS transistor constituting a power switch turned off in the predetermined low power consumption mode to a first voltage that makes a threshold voltage of the power switch larger than a threshold voltage achieved when the body is equal in voltage to a source thereof.

4. The semiconductor integrated circuit of claim 3, wherein the control circuit controls the body of a part or all of the first MOS transistors each constituting a power switch to a second voltage that makes a threshold voltage of the power switch smaller than a threshold voltage achieved when the body is equal in voltage to a source thereof, or to a floating state under a condition where the predetermined low power consumption mode has been canceled.

5. The semiconductor integrated circuit of claim 4, wherein when the predetermined low power consumption mode is canceled, the control circuit controls the first MOS transistor constituting a relevant power switch to the ON state while maintaining the body of a part or all of the first MOS transistors each constituting the power switch at the first voltage, and then controls the body of the first MOS transistor, which has been turned on, to the second voltage or floating state.

6. The semiconductor integrated circuit of claim 1, wherein the power-supply-interruptible circuit has:
sequential circuits each constituted by the second MOS transistors;
combinational circuits each constituted by the second MOS transistors;
a lower hierarchical power switch constituted by one of the first and second MOS transistors and connected in series with the combinational circuits; and
a higher hierarchical power switch constituted by the first MOS transistor and connected in series with the MOS transistor constituting the lower hierarchical power switch and the sequential circuits.

7. The semiconductor integrated circuit of claim 6, further comprising a control circuit composed of a power-supply-uninterrupted circuit in a circuit region of the integrated circuit,
wherein the control circuit controls the first MOS transistor constituting the higher hierarchical power switch to an OFF state in a first low power consumption mode, and
the control circuit controls the MOS transistor constituting the lower hierarchical power switch to an OFF state while maintaining the first MOS transistor constituting the higher hierarchical power switch in an ON state, in a second low power consumption mode.

8. A semiconductor integrated circuit, comprising:
a substrate with an insulating thin film thereon;
first MOS transistors each having a source, a drain, and a body on the insulating thin film of the substrate, a gate isolation film on the body, and a gate on the gate isolation film; and
second MOS transistors each having a source, a drain, and a body on the insulating thin film of the substrate, a gate isolation film on the body, and a gate on the gate isolation film, the first MOS transistors having gate isolation films thicker than those of the second MOS transistors; and
a plurality of circuits constituted by the first and second transistors,
wherein one of the plurality of circuits is a first circuit including the first MOS transistors each constituting a power switch and the second MOS transistors each connected in series with the first MOS transistor,
another one of the plurality of circuits is a second circuit that outputs a gate control signal for the first MOS transistors each constituting a power switch, and
the gate control signal for the first MOS transistors each constituting a power switch is made larger in amplitude than the gate control signal for the second MOS transistors.

9. The semiconductor integrated circuit of claim 8, wherein the second circuit controls a part or all of the first MOS transistors each constituting a power switch to an OFF state in a low power consumption mode.

10. The semiconductor integrated circuit of claim 9, further comprising a third circuit composed of a series circuit of the first MOS transistors and performing external input and output operations, as another one of the plurality of circuits.

11. The semiconductor integrated circuit of claim 8, further comprising, another one of the plurality of circuits, a fourth circuit including
sequential circuits each constituted by the second MOS transistors;
combinational circuits each constituted by the second MOS transistors;
a lower hierarchical power switch constituted by one of the first and second MOS transistors, and connected in series with the combinational circuits; and
a higher hierarchical power switch constituted by the first MOS transistor and connected in series with the MOS transistor constituting the lower hierarchical power switch and the sequential circuits.

12. The semiconductor integrated circuit of claim 11, wherein the second circuit controls the first MOS transistor constituting the higher hierarchical power switch to an OFF state in a first low power consumption mode, and
the second circuit controls the MOS transistor constituting the lower hierarchical power switch to the OFF state while maintaining the first MOS transistor constituting the higher hierarchical power switch in an ON state in a second low power consumption mode.

13. The semiconductor integrated circuit of claim 8, wherein the first MOS transistors each constituting a power switch are p-channel MOS transistors connected to a source line.

14. The semiconductor integrated circuit of claim 8, wherein the first MOS transistors each constituting a power switch are n-channel MOS transistors connected to a ground line.

15. The semiconductor integrated circuit of claim 8, wherein the first MOS transistors each constituting a power switch are a p-channel MOS transistor connected to a source line and an n-channel MOS transistor connected to a ground line, and
the second circuit turns off one of the p-channel MOS transistor and the n-channel MOS transistor, as the first MOS transistor constituting a power switch, in a low power consumption mode.

16. The semiconductor integrated circuit of claim 8, wherein the first MOS transistors each constituting a power switch are a higher hierarchical p-channel MOS transistor connected to a source line, and a plurality of lower hierarchical p-channel MOS transistors in parallel form individually connected in series with the higher hierarchical p-channel MOS transistor, and
the second circuit controls the higher hierarchical p-channel MOS transistor and the lower hierarchical p-channel MOS transistors separately.

17. The semiconductor integrated circuit of claim 8, wherein the first MOS transistors each constituting a power switch are a higher hierarchical n-channel MOS transistor connected to a ground line and a plurality of lower hierarchical n-channel MOS transistors in parallel form individually connected in series with the higher hierarchical n-channel MOS transistor, and
the second circuit controls the higher hierarchical n-channel MOS transistor and the lower hierarchical n-channel MOS transistors separately.

18. The semiconductor integrated circuit of claim 8, wherein the first MOS transistors each constituting a power switch are a higher hierarchical p-channel MOS transistor connected to a source line, a plurality of lower hierarchical p-channel MOS transistors in parallel form individually connected in series with the higher hierarchical p-channel MOS transistor, a higher hierarchical n-channel MOS transistor connected to a ground line, and a plurality of lower hierarchical n-channel MOS transistors in parallel form individually connected in series with the higher hierarchical n-channel MOS transistor, and
the second circuit controls the higher hierarchical p-channel MOS transistor, the lower hierarchical p-channel MOS transistors, the higher hierarchical n-channel MOS transistor, and the lower hierarchical n-channel MOS transistors, separately.

19. The semiconductor integrated circuit of claim 8, wherein the first MOS transistors each constituting a power switch are one of p-channel MOS transistors connected to a source line, and n-channel MOS transistors connected to a ground line, making a higher hierarchical power switch, and
a part or all of circuits connected in series with the higher hierarchical power switch further has a lower hierarchical power switch constituted by one of the first and second MOS transistors.

20. The semiconductor integrated circuit of claim 19, wherein the second circuit controls the first MOS transistor constituting the higher hierarchical power switch to an OFF state in a first low power consumption mode, and
the second circuit controls the MOS transistor constituting the lower hierarchical power switch to an OFF state while maintaining the first MOS transistor constituting the higher hierarchical power switch in an ON state in a second low power consumption mode.

* * * * *